United States Patent [19]
Saitoh et al.

[11] Patent Number: 5,741,615
[45] Date of Patent: Apr. 21, 1998

[54] LIGHT RECEIVING MEMBER WITH NON-SINGLE-CRYSTAL SILICON LAYER CONTAINING CR, FE, NA, NI AND MG

[75] Inventors: Keishi Saitoh; Kozo Arao; Tatsuyuki Aoike, all of Nagahama, Japan

[73] Assignee: Canon Kabushiki Kaisha, Tokyo, Japan

[21] Appl. No.: 170,247

[22] PCT Filed: Apr. 23, 1993

[86] PCT No.: PCT/JP93/00525

§ 371 Date: Jun. 2, 1994

§ 102(e) Date: Jun. 2, 1994

[30] Foreign Application Priority Data

| Apr. 24, 1992 | [JP] | Japan | 4-106529 |
| Jun. 19, 1992 | [JP] | Japan | 4-184774 |
| Jun. 19, 1992 | [JP] | Japan | 4-184775 |
| Jun. 19, 1992 | [JP] | Japan | 4-184776 |

[51] Int. Cl.$^6$ .......................... G03G 15/02; G03G 15/08
[52] U.S. Cl. .......................... 430/57; 430/95
[58] Field of Search .......................... 430/57, 66, 60, 430/95

[56] References Cited

U.S. PATENT DOCUMENTS

| 4,906,543 | 3/1990 | Aoike et al. | 430/57 |
| 5,043,772 | 8/1991 | Yamazaki | 357/2 |
| 5,236,798 | 8/1993 | Aoike et al. | 430/57 |

Primary Examiner—George F. Lesmes
Assistant Examiner—Laura Weiner
Attorney, Agent, or Firm—Fitzpatrick, Cella, Harper & Scinto

[57] ABSTRACT

A light receiving member comprising a substrate and a light receiving layer disposed on said substrate, said light receiving layer being composed of a non-Si (H,X) material containing silicon atoms (Si) as a matrix and at least one kind of atoms selected from the group consisting of hydrogen atoms (H) and halogen atoms (X), characterized in that said light receiving layer further contains at least chromium atoms (Cr), iron atoms (Fe), nickel atoms (Ni), sodium atoms (Na), and magnesium atoms (Mg) respectively in an amount of 0.9 atomic ppm or less.

The light receiving member is suitable for use as electronic devices such as electrophotographic light receiving members, solar cells, and the like, wherein it stably and continuously exhibits desirable characteristics without being deteriorated even upon repeated use over a long period of time.

22 Claims, 9 Drawing Sheets

LIGHT RECEIVING MEMBER WITH NON-SINGLE-CRYSTAL SILICON LAYER CONTAINING CR, FE, NA, NI AND MG

BACKGROUND OF THE INVENTION

1. Field of the Invention

The present invention relates to an improved light receiving member comprising a non-single crystal material containing silicon atoms as a matrix and having sensitivity to electromagnetic waves such as light (which herein means in a broad sense those lights such as ultraviolet rays, visible rays, infrared rays, X-rays, and γ-rays) which is usable as electrophotographic image-forming members, image pickup devices, photoelectric conversion devices, solar cells, and the like.

2. Related Background Art

In recent years, various studies and proposals have been made of electronic devices such as electrophotographic image-forming members, solar cells, and thin film transistors in which non-single crystal materials containing silicon atoms as a matrix (hereinafter referred to as "non-Si material") including amorphous hydrogenated or/and halogenated silicon materials (hereinafter referred to as "a-Si (H,X) material") are used.

Conventional non-Si materials such as a-Si (H,X) materials and the like exhibit good characteristics when used in electronic devices such as electrophotographic image-forming members, solar cells, and the like. But these non-Si materials are still problematic in terms of occurrence of defects due to tail states or/and dangling bonds present in their forbidden band. Particularly, for instance, in the case where dangling bonds are present in an a-Si (H,X) film to be used in such electronic devices, such dangling bonds function as a recombination center for photo-excited carriers or injected carriers, wherein the number of carriers to be practically utilized is decreased, resulting in a reduction in photocurrent. Specifically, in the case of an electrophotographic image-forming member comprising such a-Si (H,X) material, this situation entails a problem in that the electrophotographic image-forming member does not exhibit a satisfactory sensitivity, and similarly, in the case of a solar cell comprising such a-Si (H,X) material, this situation entails a problem in that the solar cell does not provide a satisfactory photocurrent. In addition, since these dangling bonds are usually present in the vicinity of the Fermi level situated at the center of a forbidden band, in the case where the number of such dangling bonds is relatively large, the influence due to a hopping conduction among the dangling bonds is increased to make the a-Si (H,X) film to exhibit a reduced dark resistance. In the case of the electrophotographic image-forming member comprising such a-Si (H,X) film, it is liable to be insufficient in terms of the charge retentivity.

In the case of an electrophotographic image-forming member produced by using an a-Si (H,X) film accompanied by dangling bonds and tail states, when such a member is subjected to corona charging in the electrophotographic image-forming process, there is a tendency that corona ions are deposited on the electrophotographic image-forming member, when charges from the corona ions are injected into the members interior through such dangling bond and tail states, there is a reduction in the charge retentivity.

The tail state is closely related to light-induced fatigue for the a-Si (H,X) film. Accordingly, in order to obtain, using an a-Si (H,X) film, an electrophotographic image-forming member or a solar cell which can be continuously used over a long period of time without being fatigued with light irradiation, it is desired for the a-Si (H,X) film to be free of tail states. Other than this, the tail state influences the mobility of a charge. The more the tail states, the smaller the charge mobility, wherein charges are likely to be trapped in the tail state.

In the case of an electrophotographic image-forming member produced by using an a-Si (H,X) film accompanied by tail states, there is a tendency of causing problems relating to residual potential, ghost appearance, dependency of the charge retentivity upon the previous exposure, and deterioration of the photosensitivity. In addition, the quantity of charges to be trapped in the tail states is increased while they are being accumulated as the charging is repeated, to thereby cause a dielectric breakdown in the electrophotographic image-forming member, resulting in defects in the reproduced images. Further in addition, those charges trapped in the tail states are liable to be released therefrom during the process from image exposure to development with toner. The charges which are released move crosswise and cause smudging in a reproduced image.

In order to eliminate the problems relating to defect and interfacial states which are found in the conventional a-Si (H,X) film, U.S. Pat. No. 4,217,374 or U.S. Pat. No. 4,668,599 proposes a solution by incorporating a given metal into a semiconductor comprising an a-Si (H,X) material. Other than this, U.S. Pat. No. 4,217,374 proposes a technique of diminishing the occurrence of a localized state by using an alkali metal, transition metal or rare earth metal. This publication describes that the use of zinc, gold, copper, silver or manganese provides a sensitization effect. In addition, U.S. Pat. No. 4,668,599 proposes a technique of improving the a-Si (H,X) series electrophotographic photosensitive device so that it does not cause a smudging for an image reproduced, by way of adding atoms of a given metal to the surface neighborhood region thereof to increase the content of impurities therein or the trapped state therein thereby preventing the occurrence of band bending.

According to these proposals, the foregoing problems in the conventional a-Si (H,X) film can be solved to a certain extent, but it is still difficult to eliminate the problems as desired. For instance, in an electronic device having a light receiving layer comprising a non-Si film with a relatively large magnitude of defects due to tail states, dangling bonds, and the like, when the light receiving layer is doped with a valence electron controlling agent (specifically, an element belonging to group III or V of the periodic table) as the conductivity controlling agent, there is a problem such that the efficiency of the valence electron controlling agent to be effectively used within the film is low because of those defects in the film. In order to sufficiently control valence electrons, it is required to use the valence electron controlling agent in an increased amount. However, in this case, a reverse problem occurs in that the presence of excessive valence electron controlling agent causes other negative effects within the film, making the film further deteriorate. In addition, in the case where the light receiving layer has a stacked structure comprising an a-Si (H,X) film doped with an element belonging to group III or V of the periodic table for conduction type control and a non-doped a-Si (H,X) film, there is a problem in that the foregoing defects are liable to unavoidably occur at the layer interface, resulting in a deterioration of the characteristics of the light receiving layer.

Further, in the case where the light receiving layer has a stacked structure comprising an a-Si (H,X) film incorporated with tin atoms (Sn) or/and germanium atoms (Ge) such as an a-SiSn (H,X) film or an a-SiGe (H,X), and a non-doped a-Si (H,X) film, defects similar to those above described are liable to occur at the layer interface to impair the characteristics of the light receiving layer.

SUMMARY OF THE INVENTION

The present invention makes it an object to solve the foregoing problems in the prior art and to provide a light receiving member having a light receiving layer formed of a high quality non-Si semiconductor accompanied by very few tail states or/and dangling bonds.

Another object of the present invention is to provide a light receiving member having a light receiving layer formed of a non-Si semiconductor which is hardly deteriorated even upon repeated irradiation of light over a long period of time.

A further object of the present invention is to provide a light receiving member having a light receiving layer formed of a non-Si semiconductor which is hardly deteriorated even under severe environments of high temperature or/and high humidity.

A further object of the present invention is to provide a light receiving member having a light receiving layer formed of a high quality non-Si semiconductor, which is suitable for use as an electrophotographic photosensitive member or a solar cell.

A further object of the present invention is to provide a light receiving member having a light receiving layer formed of a high quality non-Si semiconductor with a semiconductor junction of p-n, p-i-n, p-i or i-n in which the conductivity controlling agent contained is effected in a highly active state.

A further object of the present invention is to provide a light receiving member having a multi-layered light receiving layer comprising a plurality of high quality non-Si films, which is free of the foregoing defects in the prior art.

DESCRIPTION OF THE PREFERRED EMBODIMENTS OF THE INVENTION

The present invention has been accomplished as a result of extensive studies by the present inventors in order to attain the above objects while referring to the foregoing reverse effects by the addition of metals.

That is, the present inventors made studies of the kinds of metals capable of being incorporated into non-Si semiconductors such as a-Si (H,X) materials, and their amount and combination, in order to attain the objects of the present invention. As a result, the present inventors found that the use of specific metals in combination and in specific amounts is markedly effective in improving the characteristics of a given non-Si semiconductor. The present invention is based on this finding.

Specifically, the present inventors made extensive studies through experiments. As a result, it was found that even if the light receiving member is one which comprises a substrate and a multi-layered light receiving layer disposed on said substrate wherein the multi-layered light receiving layer comprises a plurality of constituent layers each comprising a non-single crystal material containing silicon atoms as a matrix and at least one kind of atoms selected from the group consisting of hydrogen atoms and halogen atoms (that is, a non-Si (H,X) material), when the multi-layered light receiving layer is incorporated with chromium atoms, iron atoms, nickel atoms, sodium atoms, and magnesium atoms respectively in a specific amount of 0.9 atomic ppm or less, the foregoing problems in the prior art are effectively solved, and the objects of the present invention can be attained as desired. In more detail, it was found that when, upon forming a non-Si (H,X) film by way of plasma discharge by means of the plasma CVD technique, elemental Na belonging to the alkali metal group, elemental Mg belonging to the alkaline earth metal group elemental Cr, elemental Fe and elemental Ni each belonging to the transition metal group are added to the plasma discharge such that these elements are incorporated into the non-Si (H,X) deposited film respectively in a trace amount, the resulting non-Si (H,X) film becomes one that excels in electric and optical characteristics.

The reason why such a non-Si (H,X) film excelling in electric and optical characteristics can be obtained by adding the above five elements upon the formation thereof is not clear at the present time, but it is prostulated that the alkali metal Na in a state of +1 in terms of oxidation number and the alkaline earth metal Mg in a state of +2 in terms of oxidation number are poor in bonding power with silicon atoms. However, when these two kinds of metal atoms are ionized in the plasma which causes film deposition to occur on the surface of a substrate on which a film is being grown, these metal atoms bond with dangling bonds of the silicon atoms, wherein the dangling bonds of the silicon atoms are compensated by these Na and Mg atoms to provide the silicon atoms with increased freedom, whereby a structural relaxation is attained for the film obtained. On the other hand, hydrogen atoms have a property of easily diffusing in the structure of the non-Si film, and because of this, they diffuse from the surface through the inside of a film being deposited on the substrate, wherein as the bonding energy between the Si atoms and the H atoms is greater than that between the Si atoms and the Na and Mg atoms, the Na and Mg atoms are substituted by the H atoms. The residual Na and Mg atoms in the film concentrate in the medium range defects such as microvoids to thereby decrease strains, because the Na and Mg atoms have a smaller atomic radius than the H atoms. As for the three transition metals Cr, Fe and Ni, the Cr may take an oxidation state of +2, +3 or +6, the Fe an oxidation state of +2 or +3, and the Ni an oxidation state of +2 or +3. Any of these three kinds of metal atoms is relatively greater in terms of atomic weight, and because of this, these metal atoms are substantially not mobile when they are present in the film. However, as above described, any of these metal atoms may take a plurality of oxidation states and, the relaxation of the Si atoms in the structure of the non-Si film is facilitated by properly changing the oxidation state of these metal atoms.

As above described, it is considered that the Na and Mg atoms facilitate not only the structural relaxation at the film-growing surface but also the structural relaxation of the medium range defects such as microvoids, and the Cr, Fe and Ni atoms also facilitate the structural relaxation at the film-growing surface. Because the Cr, Fe and Ni atoms are hardly diffused in the non-Si film, these three kinds of metal atoms are uniformly dispersed therein whereby the film is entirely structurally relaxed.

Thus, in the case where the Na, Mg, Cr, Fe, and Ni atoms are contained together in the non-Si film, it is considered that desirable structural relaxation is attained for the microvoids in the film by virtue of the Na and Mg atoms and along with this, desirable structural relaxation is attained for the entire film structure by virtue of the Cr, Fe and Ni atoms, whereby the non-Si film is entirely relaxed and as a result, the non-Si film becomes one that excels in electric and optical characteristics.

In addition, the Cr, Fe, Ni, Na, and Mg atoms which are contained in the non-Si (H,X) film serve to compensate the recombination centers in the film, wherein the lifetime of a charge is prolonged and as a result, a prominent improvement is provided in the electric characteristics of the non-Si (H,X) film.

In the present invention, the amount of the atoms of each of the above five metals contained in the non-Si (H,X) film is desired to be 0.9 atomic ppm or less. If these five metal atoms are contained in a non-Si (H,X) film respectively in an amount exceeding 0.9 atomic ppm, numerous defects are caused therein and as a result, the non-Si (H,X) film becomes poor in electric characteristics.

In the present invention, in the case of conducting the valence electron control for a non-Si (H,X) film incorporated with the above five kinds of metal atoms to be formed, the proportion of a valence electron controlling agent to be taken into the film upon film formation is increased because of the effects by the five kinds of metal atoms, wherein the efficiency for the valence electron controlling agent to effectively function in the film is markedly improved. Thus, the valence electron control for the non-Si (H,X) film can be efficiently carried out in a desirable state without causing defects in the film.

It is generally known that in the case of a stacked structure comprising a valence electron-controlled non-Si (H,X) film and other non-Si (H,X) film being stacked, a charge conduction is occurred by way of the interfacial state.

However, the stacked structure according to the present invention is free of such problem. That is, in the case where a non-Si (H,X) film incorporated with the foregoing five kinds of metal atoms and other non-Si (H,X) film are stacked to obtain a stacked structure, the stacked structure is accompanied with little interfacial state because the former non-Si (H,X) film has few recombination centers due to the effects of the five kinds metal atoms of facilitating the structural relaxation and directly compensating the recombination centers. Because of this, the non-Si (H,X) multi-layered structure excels in electric characteristics. In this stacked structure, if the non-Si (H,X) film incorporated with the foregoing five kinds of metal atoms should also contain Ge atoms or/and Sn atoms, satisfactory effects are provided as well as in the above case.

In the following, description will be made of the light receiving member comprising the above Si (H,X) film according to the present invention, while referring to the drawings.

FIG. 1 is a schematic view illustrating a typical example of the layer constitution of a light receiving member comprising the non-Si (H,X) film according to the present invention. In FIG. 1, reference numeral 100 indicates a light receiving member comprising a substrate 101 for light receiving member and a light receiving layer 102 having a free surface 103 which is disposed on the substrate. The light receiving layer 102 is constituted by a non-Si (H,X) film containing silicon atoms (Si) as a matrix, at least one kind of atoms selected from the group consisting of hydrogen atoms (H) and halogen atoms (X), and chromium atoms (Cr), iron atoms (Fe), nickel atoms (Ni), sodium atoms (Na), and magnesium atoms (Mg) respectively in an amount of 0.9 ppm or less.

Description will be made of each constituent of the light receiving member according to the present invention.

Substrate

The substrate 101 for use in the present invention may be either electroconductive or electrically insulative.

The electroconductive substrate can include, for example, metals and alloys such as NiCr, stainless steels, Al, Cr, Mo, Au, Nb, Ta, V, Ti, Pt, Pb, and the like.

The electrically insulative substrate can include, for example, films and sheets of synthetic resins such as polyester, polyethylene, polycarbonate, cellulose acetate, polypropylene, polyvinyl chloride, polyvinylidene chloride, polystyrene, and polyamide, and other than these, glass, ceramic, and paper. It is preferred that the electrically insulative substrate is applied with electroconductive treatment to at least one of the surfaces thereof and disposed with a light receiving layer on the thus treated surface.

In the case of glass, for instance, electroconductivity is applied to the surface thereof by disposing, on the surface thereof, a thin film made of NiCr, Al, Cr, Mo, Au, Ir, Nb, Ta, V, Ti, Pt, Pd, $InO_3$, ITO ($In_2O_3$+Sn), or the like. In the case of the synthetic resin film such as polyester film, electroconductivity is applied to the surface thereof by disposing, on the surface thereof, a thin film of a metal such as NiCr, Al, Ag, Pb, Zn, Ni, Au, Cr, Mo, Ir, Nb, Ta, V, Tl, Pt, or the like by means of the vacuum deposition, electron beam vapor deposition, or sputtering technique, or applying lamination with the metal to the surface thereof.

The substrate may be of any configuration such as cylindrical, belt-like or plate-like shape having a smooth or uneven surface.

The thickness of the substrate should be properly determined so that, in the case where the light receiving member 100 is for use in electrophotography, a desirable electrophotographic light receiving member can be formed. In the event that flexibility is required for the light receiving member, it can be made as thin as possible within a range capable of sufficiently providing the function as the substrate. However, the thickness is usually made to be greater than 10 μm in view of ease of fabrication and handling and also in view of mechanical strength of the substrate 101.

In the case where the light receiving member is for use in image formation using coherent monochromatic light such as laser beams, the electroconductive surface of the substrate 101 may be provided with irregularities in order to prevent occurrence of defective images caused by the so-called interference fringe pattern. The formation of such irregularities at the surface of the substrate may be conducted in accordance with the conventional manner described, for example, in Japanese Unexamined Patent Publication No. 168156/1985, 178457/1985, or 225854/1985. Other than this, in order to prevent the occurrence of defective images caused by the interference fringe pattern, the electroconductive surface of the substrate 101 may be treated so as to have an uneven surface shape provided with irregularities composed of a plurality of spherical dimples each having minute irregularities of a size which is smaller than the resolution required for the light receiving member 100. The formation of such spherical dimples each having minute irregularities at the surface of the substrate 101 may be conducted in accordance with the conventional manner described, for example, in Japanese Unexamined Patent Publication No. 231561/1986.

Light Receiving Layer

In the present invention, the light receiving layer comprising the foregoing non-Si (H,X) film can be properly formed by the conventional glow discharge decomposition method such as RF glow discharge decomposition method or microwave glow discharge decomposition method.

The raw material gas capable of supplying Si which is used for the formation of the light receiving layer can include, for example, gaseous or gasifiable silicon hydrides (silanes) such as $SiH_4$, $Si_2H_6$, $Si_3H_8$, $Si_4H10$, and the like, among these, $SiH_4$ and $Si_2H_6$ being particularly preferred in view of ease of layer formation and good Si supply efficiency. These Si-supplying raw material gases may be diluted with appropriate gas such as $H_2$ gas, He gas, Ar gas or Ne gas if necessary.

As the halogen-supplying raw material gas, there can be mentioned, for example, gaseous or gasifiable halogen compounds such as halogen gases, halogen compounds, interhalogen compounds, and halogen-substituted silane derivatives. Other than these, gaseous or gasifiable silicon halides each comprising silicon atom (Si) and halogen atom (X) as the constituent atoms are also effective in the present invention.

Specific examples of such effectively usable halogen compounds are halogen gases such as fluorine gas, chlorine gas, bromine gas, and iodine gas; and interhalogen compounds such as BrF, ClF, $ClF_3$, $BrF_5$, $BrF_3$, $IF_3$, $IF_7$, ICl, and IBr.

Specific examples of the halogen (X)-substituted silane derivative are silicon halides such as $SiF_4$, $Si_2F_6$, $SiCl_4$, $SiBr_4$, and the like.

The use of such a halogen atom (X)-containing silicon compound in the formation of a light receiving layer comprising the non-Si (H,X) film according to the present invention by the glow discharge decomposition method is advantageous since a layer comprising a halogen atom (X)-containing non-Si material can be formed on a given lower layer without additionally using the raw material gas for supplying Si. Basically, when the halogen (X)-containing light receiving layer is formed by the glow discharge decomposition method, the layer can be formed on the substrate by using only the above-mentioned silicon halide capable of supplying also Si. In order to facilitate the introduction of hydrogen atoms (H) thereinto in this case, it is possible to use hydrogen gas or a hydrogen atom (H)-containing silicon compound in a desired mixing ratio together with the above compound. These raw material gases are not always necessary to be separately used. It is possible to use these raw material gases by mixing them in a desired mixing ratio.

In the present invention, the foregoing halogen compounds and halogen atom (X)-containing silicon compounds are effectively usable as the halogen atom-supplying raw material gas. Other than these, other gaseous or gasifiable hydrogen halides such as HF, HCl, HBr, and HI, and gaseous or gasifiable halogen-substituted silicon hydrides such as $SiH_3F$, $SiH_2F_2$, $SiHF_3$, $SiH_2I_2$, $SiH_2Cl_2$, $SiHCl_3$, $SiH_2Br_2$, and $SiHBr_3$ are also effective for the formation of the light receiving layer according to the present invention. The use of these hydrogen atom (H)-containing halogen compounds is advantageous since the hydrogen atoms, which are extremely effective for controlling electric or photoconductive properties of a layer formed, are also introduced together with the introduction of the halogen atoms (X) upon forming the light receiving layer. In order to structurally introduce hydrogen atoms (H) into a light receiving layer formed, it is effective to cause glow discharge in the presence of $H_2$ gas or silicon hydride such as $SiH_4$, $Si_2H_6$, $Si_3H_8$ or $Si_4H_{10}$ and the above Si-supplying raw material gas in the deposition chamber.

The amount of the hydrogen atoms (H) or/and halogen atoms (X) to be contained in a light receiving layer formed may be adjusted as desired by controlling related conditions, i.e., the substrate temperature, the flow rate of the raw material gas capable of supplying hydrogen atom (H) or/and halogen atom (X) to be introduced into the deposition chamber, the electric discharging power, and the like.

The amount of the hydrogen atom (H) contained in the light receiving layer is preferably in the range of 1 to 40 atomic %, more preferably in the range of 5 to 30 atomic %, and most preferably in the range of 5 to 20 atomic %.

As for the amount of the halogen atoms (X) contained in the light receiving layer, it is preferably in the range of 0.01 to 40 atomic %, more preferably in the range of 0.01 to 30 atomic % and, most preferably in the range of 0.01 to 10 atomic %.

The content of the hydrogen atoms and that of the halogen atoms respectively contained in the light receiving layer are organically related to each other. In the case where the content of the hydrogen atoms is made to be relatively large, the content of the halogen atoms is desired to be relatively small.

Incorporating Fe atoms into the light receiving layer may be properly conducted by introducing a given gaseous raw material capable of supplying Fe into the deposition chamber together with other gaseous film-forming raw materials upon film formation. The Fe-supplying raw material can include materials capable of supplying Fe which are in the gaseous state under conditions of room temperature and normal pressure or can be easily gasified at least under the layer-forming conditions. As such Fe-supplying raw material, there can be mentioned organic metal compounds containing Fe atoms as the constituent atoms. Specific examples are iron bromide ($FeBr_4$), bis(cyclopentadienyl) iron ($Fe(C_5H_5)_2$), and the like which are advantageous in view of ease of handling upon the layer formation and also in view of Fe-supply efficiency. These Fe-supplying raw materials in the gaseous state may be diluted with appropriate gas such as $H_2$ gas, He gas, Ar gas or Ne gas upon their introduction into the deposition chamber.

Incorporating Cr atoms into the light receiving layer may be properly conducted by introducing a given gaseous raw material capable of supplying Cr into the deposition chamber together with other gaseous film-forming raw materials upon film formation. The Cr-supplying raw material can include materials capable of supplying Cr which are in the gaseous state under conditions of room temperature and normal pressure or can be easily gasified at least under the layer-forming conditions. As such Cr-supplying raw material, there can be mentioned organic metal compounds containing Cr atoms as the constituent atoms. Specific examples are chromium bromide ($CrBr_3$), hexacarbonyl chromium ($Cr(CO)_6$), bis(cyclopentadienyl)chromium ($Cr(C_5H_5)_2$), bis(benzene)chromium ($Cr(C_6H_6)_2$), and the like which are advantageous in view of ease of handling upon the layer formation and also in view of Cr-supply efficiency. These Cr-supplying raw materials in the gaseous state may be diluted with appropriate gas such as $H_2$ gas, He gas, Ar gas or Ne gas upon their introduction into the deposition chamber.

Incorporating Ni atoms into the light receiving layer may be properly conducted by introducing a given gaseous raw material capable of supplying Ni into the deposition chamber together with other gaseous film-forming raw materials upon film formation. The Ni-supplying raw material can include materials capable of supplying Ni which are in the gaseous state under conditions of room temperature and normal pressure or can be easily gasified at least under the layer-forming conditions. As such Ni-supplying raw material, there can be mentioned organic metal compounds containing Ni atoms as the constituent atoms. Specific examples are tetracarbonyl nickel ($Ni(CO)_4$), bis (cyclopentadienyl)nickel ($Ni(C_5H_5)_2$), and the like which are advantageous in view of ease of handling upon the layer formation and also in view of Ni-supply efficiency. These Ni-supplying raw materials in the gaseous state may be diluted with appropriate gas such as $H_2$ gas, He gas, Ar gas or Ne gas upon their introduction into the deposition chamber.

Incorporating Na atoms into the light receiving layer may be properly conducted by introducing a given gaseous raw material capable of supplying Na into the deposition chamber together with other gaseous film-forming raw materials upon film formation. The Na-supplying raw material can include materials capable of supplying Na which are in the gaseous state under conditions of room temperature and normal pressure or can be easily gasified at least under the layer-forming conditions. As such Na-supplying raw material, there can be mentioned organic metal compounds containing Na atoms as the constituent atoms. Specific examples are sodium amide ($NaNH_2$), and the like which are advantageous in view of ease of handling upon the layer formation and also in view of Na-supply efficiency. These Na-supplying raw materials in the gaseous state may be diluted with appropriate gas such as $H_2$ gas, He gas, Ar gas or Ne gas upon their introduction into the deposition chamber.

Incorporating Mg atoms into the light receiving layer may be properly conducted by introducing a given gaseous raw material capable of supplying Mg into the deposition chamber together with other gaseous film-forming raw materials upon film formation. The Mg-supplying raw material can include materials capable of supplying Mg which are in the gaseous state under conditions of room temperature and normal pressure or can be easily gasified at least under the layer-forming conditions. As such Mg-supplying raw material, there can be mentioned organic metal compounds containing Mg atoms as the constituent atoms. Specific examples are bis(cyclopentadienyl)magnesium (II), and the like which are advantageous in view of ease of handling upon the layer formation and also in view of Mg-supply efficiency. These Mg-supplying raw materials in the gaseous state may be diluted with appropriate gas such as $H_2$ gas, He gas, Ar gas or Ne gas upon their introduction into the deposition chamber.

Other than the above, any of these metal atoms may be incorporated into the light receiving layer by evaporating a given metal or alloy with the action of heat in the deposition chamber upon the layer formation by the plasma CVD method.

In the present invention, the light receiving layer 102 may contain conductivity controlling atoms (M). The atoms (M) may be contained in the light receiving layer such that they are uniformly or unevenly distributed therein in the thickness direction. The conductivity controlling atoms (M) may be atoms of a given element belonging to group III, V or VI of the periodic table. Incorporating the conductivity controlling atoms (M) into the light receiving layer may be properly conducted by introducing a given gaseous raw material capable of supplying the group III, V or VI atoms into the deposition chamber together with other gaseous film-forming raw materials upon film formation. The group III atom-supplying raw material or the group V atom-supplying raw material can include raw materials which are in the gaseous state under conditions of room temperature and normal pressure or can be easily gasified at least under the layer-forming conditions.

Specific examples of the group III atom-supplying raw material are boron hydrides such as $B_2H_6$, $B_4H_{10}$, $B_5H_8$, $B_5H_{11}$, $B_6H10$, $B_6H_{12}$, and $B_6H_{14}$, and boron halides such as $BF_3$, $BCl_3$, and $BBr_3$. Other than these, $AlCl_3$, $GaCl_3$, $Ga(CH_3)_3$, $InCl_3$, $TlCl_3$, and the like are also usable.

Specific examples of the group V atom-supplying raw material are phosphorous hydrides such as $PH_3$, and $P_2H_4$, phosphorous halides such as $PH_4I$, $PF_3$, $PF_5$, $PCl_3$, $PCl_5$, $PBr_3$, $PBr_5$, and $PI_3$. Other than these, $AsH_3$, $AsF_3$, $AsCl_3$, $AsBr_3$, $SbH_3$, $SbF_3$, $SbF_5$, $SbCl_3$, $SbCl_3$, $SbCl_5$, $BiH_3$, $BiCl_3$, and $BiBr_3$.

These raw materials capable of supplying the image quality controlling atoms (Mc) or conductivity controlling atoms (M) may be diluted with appropriate gas such as $H_2$ gas, He gas, Ar gas or Ne gas upon their introduction into the deposition chamber.

The amount of the conductivity controlling atoms contained in the light receiving layer is desired to be preferably in the range of $1 \times 10^{-3}$ to $1 \times 10^3$ atomic ppm, more preferably in the range of $5 \times 10^{-3}$ to $1 \times 10^2$ atomic ppm, and most preferably in the range of $1 \times 10^{-2}$ to 50 atomic ppm.

The light receiving layer of the light receiving member according to the present invention may of such a stacked layer constitution as shown in FIG. 9. In FIG. 9, reference numeral 100 indicates an electrophotographic light receiving member which comprises a substrate 101 and a light receiving layer 102 disposed on said substrate, the light receiving layer having a stacked structure comprising a first light receiving layer 102-1 and a second light receiving layer 102-2 being stacked in this order from the side of the substrate 101, wherein the latter light receiving layer has a free surface. In this embodiment, at least one of the first light receiving layer 102-1 and the second light receiving layer 102-2 is incorporated with the foregoing five kinds of metal atoms. It is a matter of course that both the first light receiving layer 102-1 and the second light receiving layer 102-2 may be incorporated with the foregoing five kinds of metal atoms.

In a preferred embodiment, the first light receiving layer 102-1 and the second light receiving layer 102-2 are designed such that they are different from each other in terms of function. For instance, in order that long wavelength light is effectively absorbed or/and in order to prevent occurrence of problems relating to interference fringe which will be caused in the case where incident light arrived at the substrate is reflected at the substrate, the first light receiving layer 102-1 situated on the side of the substrate 101 is desired to be designed such that it contains germanium atoms or/and tin atoms. In this case, it is desired for the germanium or/and tin atoms to be contained therein such that their concentration distribution is enhanced in a given layer region thereof adjacent to the substrate 101. In order to prevent a charge from injecting from the substrate 101 into the light receiving layer 102, the first light receiving layer 102-1 situated on the side of the substrate 101 is desired to contain the foregoing conductivity controlling atoms (M). In this case, the amount of the conductivity controlling atoms (M) contained in the first light receiving layer is desired to be preferably in the range of $1 \times 10^{-3}$ to $5 \times 10^4$ atomic ppm, more preferably in the range of $1 \times 10^{-2}$ to $1 \times 10^4$ atomic ppm, most preferably in the range of $1 \times 10^{-1}$ to $5 \times 10^3$ atomic ppm.

The light receiving layer may further comprise a surface layer on the free surface side for the purpose of improving the environment resistance and wear resistance. The surface layer in this case is desired to be composed of a non-single crystal silicon material containing at least one kind of atoms selected from the group consisting of oxygen atoms, nitrogen atoms and carbon atoms, and if necessary, at least one kind of atoms selected from the group consisting of hydrogen atoms and halogen atoms. Specific examples of such non-single crystal silicon material are non-single crystal silicon oxide material (non-SiO), non-single crystal silicon nitride material (non-SiN), non-single crystal silicon carbide material (non-SiC), and mixtures of two or more of these materials.

As for the thickness of the light receiving layer, in order to make the light receiving layer to be provided with desirable electrophotographic characteristics while considering economical effects therefor, it is desired to be preferably in the range of 1 to 130 μm, more preferably in the range of 3 to 100 μm, most preferably in the range of 5 to 60 μm.

In order to make the light receiving layer to be provided with desirable solar cell characteristics while considering economical effects therefor, the thickness thereof is desired to be preferably in the range of 0.1 to 5 μm, more preferably in the range of 0.2 to 3 μm, and most preferably in the range of 0.4 to 1.2 μm.

In order to form the light receiving layer comprising a specific non-Si material which attains the objects of the present invention, it is necessary that the gas pressure in the deposition chamber and the substrate temperature upon the formation thereof be properly determined as desired. Particularly, as for the gas pressure in the deposition chamber upon the layer formation, it should be properly determined depending upon the kind of a light receiving layer to be formed. However, in general, it is desired to be preferably in the range of $1\times10^{-5}$ to 10 Torr, more preferably in the range of $1\times10^{-4}$ to 3 Torr, most preferably in the range of $1\times10^{-4}$ to 1 Torr.

As for the substrate temperature (Ts) upon the layer formation, it should be properly determine kind of a upon the kind of a light receiving layer to be formed. For instance, in the case where the light receiving layer is formed of a given a-Si (H,X) material as the non-Si material, it is desired to be preferably in the range of 50° to 400° C., more preferably in the range of 100° to 300° C.

In the case where the light receiving layer is formed of a given poly-Si (H,X) material as the non-Si material, the formation thereof can be conducted by any of the following methods. One method is that the substrate is maintained at a high temperature of 400° to 600° C., and a desired film is formed on the surface of the substrate by means of the plasma CVD technique. Another method is that a desired amorphous film is formed on the surface of the substrate maintained at a temperature of about 250° C. by means of the plasma CVD technique, and the amorphous film thus formed is subjected to annealing treatment to convert the amorphous film into a polycrystalline film. The annealing treatment in this case can be conducted by heating the amorphous film on the substrate at a temperature of 400° to 600° C. for about 5 to 30 minutes, or by irradiating laser beams to the amorphous film on the substrate for about 5 to 30 minutes.

In the case of forming the light receiving layer comprising a given non-Si material by the glow discharge decomposition method in the present invention, a desired discharging electric power is supplied in the deposition chamber depending upon the related conditions. Specifically, the discharging electric power is desired to be preferably in the range of $5\times10^{-5}$ to 10 W/cm², more preferably in the range of $5\times10^{-4}$ to 5 W/cm², most preferably in the range of $1\times10^{-3}$ to $2\times10^{-1}$ W/cm².

In the present invention, the gas pressure in the deposition chamber, the substrate temperature, the discharging electric power supplied in the deposition chamber upon the layer formation are properly determined respectively in the above-described corresponding range. However, these layer-forming parameters cannot usually be determined with ease independent of each other. Accordingly, the parameters optimal to the layer formation are desired to be determined based on relative and organic relationships for forming a desired light receiving layer having properties as desired.

In the following, description will be made of an example of the process of producing a light receiving member according to the present invention with reference to the drawings.

FIGS. 2 to 4 are schematic diagrams respectively illustrating the constitution of a fabrication apparatus suitable for the production of a light receiving member for use in electrophotography according to the present invention.

FIG. 2 shows the fabrication apparatus by the high frequency glow discharge decomposition process (hereinafter referred to as RF glow discharge decomposition process) which is suitable for the production of a light receiving member for use in electrophotography according to the present invention, wherein the apparatus comprises the raw material gas supply unit 1020 and the film deposition unit 1000.

Description will be made of a typical manner of producing an electrophotographic light receiving member using this fabrication apparatus.

In the figure, there are shown gas reservoirs 1071 and 1072. They contain raw material gases to form layers for the light receiving member according to the present invention. The gas reservoir 1071 contains SiH₄ gas (purity: 99.99%) and the gas reservoir 1072 contains H₂ gas (purity: 99.9999%). Reference numeral 1051 indicates a valve for the gas reservoir 1071 and reference numeral 1052 a valve for the gas reservoir 1072. Reference numerals 1031 and 1032 indicate respectively an inlet valve.

In the figure, reference numerals 1091 and 1091' indicate respectively a raw material alloy composed of silicon (Si), chromium (Cr), iron (Fe), magnesium (Mg), sodium (Na), and nickel (Ni). The raw material alloy is housed in a containment vessel 1094, and it can be moved from the containment vessel into a deposition chamber 1001 or from the latter into the former through a gate valve 1007 by means of a driving means 1092. In this apparatus, there is installed a heating means such as an electric heater (not shown) for heating the raw material alloy 1091 (1091').

Reference numeral 1005 indicates a cylindrical aluminum substrate. Reference numeral 1041 indicates an electric heater for heating the cylindrical substrate to a desired temperature.

In the film formation in this fabrication apparatus, prior to the entrance of the raw material gases into the deposition chamber, it is confirmed that the valves 1051 and 1052 for the gas reservoirs 1071 and 1072, a leak valve 1015 for the deposition chamber 1001, and an exhaust valve 1093 for the containment vessel 1094 are closed and that the inlet valves 1031 and 1032, exit valves 1041 and 1042, a sub-valve 1081, and the gate valve 1007 are opened. Then, a main valve 1016 is at first opened to evacuate the inside of the deposition chamber 1001, the inside of the containment vessel 1094 and the insides of the gas pipe ways by means of a vacuum pump (not shown). Upon observing that the reading on a vacuum gage 1017 became about $1\times10^{-3}$ Torr, the sub-valve 1018, the inlet valves 1031 and 1032, and the exit valves 1041 and 1042 are closed. Thereafter, SiH$_4$ gas from the gas reservoir 1071 and H$_2$ gas from the gas reservoir 1072 are caused to flow by opening the valves 1051 and 1052, wherein the gas pressures of the raw material gases are respectively controlled to 2 Kg/cm$^2$ by means of pressure controllers 1061 and 1062. Then, the inlet valves 1031 and 1032 are gradually opened to allow the two raw material gases to enter into mass flow controllers 1021 and 1022.

Successively, the raw material alloy 1091 maintained at a desired temperature is moved to the position indicated by the reference numeral 1091' by the driving means 1092. Then, the exit valves 1041 and 1042 and the sub-valve 1018 are gradually opened to enter the SiH$_4$ gas and H$_2$ gas into the deposition chamber 1001 through gas feed pipes 1008 each being provided with a plurality of gas liberation holes 1009. In this case, the flow rate of the SiH$_4$ gas and that of the H$_2$ gas are adjusted to predetermined respective values by means of the mass flow controllers 1021 and 1022.

The inner pressure of the deposition chamber is maintained at a predetermined value by regulating the opening of the main valve 1016 while observing the reading on the vacuum gage 1017. Thereafter, a RF power source (not shown) is switched on to apply a predetermined RF power into the deposition chamber 1001 through a matching box 1012 to cause RF glow discharge whereby producing plasma, wherein the raw material alloy is sputtered by the plasma. By this, a film to be a light receiving layer is formed on the cylindrical aluminum substrate. When the film is formed at a predetermined thickness, the RF glow discharge is terminated, and the exit valves 1041 and 1042 and the sub-valve 1018 are closed to terminate the feed of the raw material gases into the deposition chamber 1001. Thus, the formation of the light receiving layer is completed.

In the above, in order to incorporate the foregoing five kinds of metal atoms into the light receiving layer, instead of using the above raw material alloy, it is possible to introduce appropriate raw material gases each capable of supplying given metal atoms into the deposition chamber 1001 by using a relevant gas supply unit containing gas reservoirs for those raw material gases which is similar to the gas supply unit 1020 for the SiH$_4$ gas and H$_2$ gas.

In the above, in order to attain a desirable uniformity for the film formed on the cylindrical aluminum substrate 1005, it is possible to rotate the cylindrical substrate at a desired speed during film formation by means of a driving means (not shown).

FIG. 4 shows the fabrication apparatus by the microwave glow discharge decomposition process (the microwave will be hereinafter referred to as μW) which is suitable for the production of a light receiving member for use in electrophotography according to the present invention. This fabrication apparatus comprises a modification of the fabrication apparatus shown in FIG. 2 in which the film deposition unit 1000 in FIG. 2 is replaced by a film deposition unit 1100 by the μW glow discharge decomposition process shown in FIG. 3, wherein the uW discharge decomposition film deposition unit is connected to the 9as supply unit 1020.

Description will be made of a typical manner of producing an electrophotographic light receiving member using this fabrication apparatus.

In FIG. 3, reference numeral 1191 indicates an aluminum cylinder having a raw material alloy member disposed on the surface thereof which is dedicated for the formation of a light receiving layer for the electrophotographic light receiving member. The raw material alloy member comprises an ally member composed of silicon (Si), chromium (Cr), iron (Fe), magnesium (Mg), sodium (Na) and nickel (Ni) disposed to cover a given surface area of the aluminum cylinder 1191 which is corresponding to a ¼ of the entire surface area of the aluminum cylinder in the longitudinal direction. The remaining ¾ surface area of the aluminum cylinder 1191 is covered by a silicon material. The aluminum cylinder having the raw material alloy member thereon is installed such that a desired surface thereof can be faced toward a plasma generation zone 1109 upon film formation by means of a rolling mechanism (not shown).

Reference numeral 1107 indicates a cylindrical aluminium substrate on which a film is to be deposited which can be heated to a desired temperature by means of a heater (not shown). The aluminum cylinder 1191 having the raw material alloy member thereon can be heated to a desired temperature by means of a heater (not shown).

In the film formation in this fabrication apparatus, as well as in the case of the film formation by the abovedescribed RF glow discharge decomposition process, prior to commencing film formation, the inside of a deposition chamber 1101 and the insides of the gas pipe ways are evacuated so as to bring the inside of the deposition chamber 1101 to a vacuum of about 5×10$^{-6}$ Torr, and thereafter, the respective raw material gases are caused to enter into the mass flow controllers 1021 and 1022. Herein, the H$_2$ gas reservoir used in the above case is replaced by a gas reservoir containing SiF$_4$ gas (purity: 99,999%).

Then, the cylinder 1191 having the raw material alloy member composed of silicon (Si), chromium (Cr), iron (Fe), magnesium (Mg), sodium (Na) and nickel (Ni) disposed thereon is rotated such that the raw material alloy member faces toward the plasma discharge zone 1109. Successively, the exit valves 1041 and 1042 and the sub-valve 1018 are gradually opened to enter SiH$_4$ gas and SiF$_4$ gas into the deposition chamber 1101 through a plurality of gas feed pipes 1110 each being provided with gas liberation holes (not shown). In this case, the flow rate of the SiH$_4$ gas and that of the SiF$_4$ gas are adjusted to predetermined respective values by means of the mass flow controllers 1021 and 1022.

The inner pressure of the deposition chamber 1101 is maintained at a predetermined value by regulating the opening of the main valve while observing the reading on a vacuum gage (not shown). Thereafter, a μW power source (not shown) is switched on to apply a predetermined microwave power into the plasma generation zone 1109 through a waveguide 1103 and a dielectric window 1102 to cause μW glow discharge whereby producing plasma, wherein the raw material alloy member is sputtered by the plasma. By this, a film to be a light receiving layer is formed on each of the cylindrical aluminum substrates 1107. When the film is formed on each substrate at a predetermined thickness, the μW glow discharge is terminated, and the exit valves 1041 and 1042 and the sub-valve 1018 are closed to terminate the feed of the raw material gases into the deposition chamber 1101. Thus, the formation of the light receiving layer is completed.

In the above, in order to incorporate the foregoing five kinds of metal atoms into the light receiving layer, instead of using the above raw material alloy member, it is possible to introduce appropriate raw material gases each capable of supplying given metal atoms into the deposition chamber 1101 by using a relevant gas supply unit containing gas reservoirs for those raw material gases which is similar to the gas supply unit 1020.

In the above, in order to attain a desirable uniformity for the film formed on each cylindrical aluminum substrate 1107, it is possible to rotate the cylindrical substrates at a desired speed during film formation by means of a driving means (not shown).

In the following, description will be made of a typical manner of producing a solar cell using a continuous film-forming apparatus. FIG. 5 is a schematic diagram illustrating the constitution of an example of the continuous film-forming apparatus suitable for the production of a solar cell. The apparatus shown in FIG. 5 is a so-called inline type film-forming apparatus. This inline type apparatus is suitable for the production of a solar cell having a stacked structure comprising a plurality of semiconductor layer being stacked. The apparatus comprises a plurality of independent vacuum vessels including a plurality of film-forming vacuum vessels each capable of forming a given semiconductor film wherein the respective vacuum vessels are connected with each other through respective gate valves.

Particularly, the apparatus shown in FIG. 5 comprises a load lock chamber 5100 (chamber LLI) for taking a substrate into the system, a preheating chamber 5200 (chamber PH) for preheating the substrate prior to film formation, an n-type film-forming chamber 5300 (chamber N), an i-type film 1-forming chamber 5400 (chamber $I_1$), an i-type film 2-forming chamber 5500 (chamber $I_2$), an i-type film 3-forming chamber 5600 (chamber $I_3$), a p-type film-forming chamber 5700 (chamber P), a cooling chamber 5800 (chamber CL) for cooling the substrate, and a load lock chamber 5900 (LLO) for taking out the substrate, wherein these chambers are isolated one from the other by means of a corresponding gate valve 5X50 (X=0 to 9) having an opening capable of allowing the substrate and a substrate holder to pass through the opening. Each of the chambers other than the load lock chambers is provided with a heater 5X01 (X=2 to 8) such that the substrate can be heated to and maintained at a desired temperature by the heater.

Each chamber is provided with an exhaust system comprising an exhaust pipe 5X02 (X=1 to 9) connected to a vacuuming means (not shown), comprising a rotary pump, mechanical booster pump, diffusion pump, turbo-molecular pump, cryopump, ion pump, or a combination of two or more of these pumps. The inside of each chamber can be evacuated to a desired vacuum by operating the vacuuming means. Each exhaust system is provided with an exhaust valve such that it is separated from the other exhaust system. In a preferred embodiment, each exhaust system further comprises a throttle valve which serves to adjust the inner pressure of the chamber.

Each chamber is provided with a pair of gas feed pipes 5X03 (X=1 to 9) each extending from a gas reservoir (not shown) such that the adjustment of the inner pressure of the chamber, the supply of raw material gas, gas flushing, and the like can be conducted.

In each of the chambers other than the load lock chambers, there is installed a discharge electrode 5X04 (X=2 to 8) for causing RF glow discharge which is electrically connected to a RF power source (not shown) which can be properly controlled with respect to a RF power outputted. Each the chambers other than the load lock chambers is designed such that not only film formation but also sputter-etching treatment and plasma treatment can be conducted therein.

In each chamber, there is installed a transportation rail 5X05 (X=1 to 9) provided with a transportation driving mechanism such that it transports the substrate to the adjacent chamber in sychronism with the gate valve 5X50 (X=0 to 9).

Each film-forming chamber is provided with a metal source containment vessel 5X06 (X=3 to 7) containing a metal source 5X08 (X=3 to 7) and a metal source containment vessel 5X07 (X=3 to 7) containing a metal source 5X09 (X=3 to 7), wherein the metal source containment vessel 5X06 is connected through a gate valve 5X10 (X=3 to 7) to the film-forming chamber and the metal source containment vessel 5X07 is connected through a gate valve 5X11 (X=3 to 7) to the film-forming chamber. Each metal containment vessel is designed so that the metal source 5X08 or the metal source 5X09 can be moved into the film-forming chamber. Each of the metal source 5X08 (X=3 to 7) and the metal source 5X09 (X=3 to 7) comprises a raw material alloy which serves to form a solar cell according to the present invention. The raw material alloy is composed of silicon (Si), chromium (Cr), iron (Fe), magnesium (Mg), sodium (Na) and nickel (Ni). The metal source containment vessels 5X06 (X=3 to 7) and 5X07 (X=3 to 7) are desired to be designed such that each of them has an independent gas or air supply system and a load lock structure, in order to conduct maintenance, replacement and check for the metal sources 5X08 (X=3 to 7) and 5X09 (X=3 to 7). This situation is not described in the figure. Each metal source containment vessel is provided with a heating means (not shown) for heating the metal source 5X08 (X=3 to 7) or 5X09 (X=3 to 7) to a desired temperature.

In the case where the apparatus is in an idle state, for the purpose of prevent contamination, it is desired that all the gate valves are closed. Further, it is desired that all the heaters are always controlled to a desired temperature and that all the exhaust systems are always maintained under operating condition. In the case where the vacuuming means comprises a rotary pump or/and a diffusion pump, if there is a fear that oil back may be caused, it is desired to always flow argon gas or nitrogen gas (or occasionally, hydrogen gas) in the system.

An typical manner of producing a Shottky type solar cell according to the present invention using the apparatus shown in FIG. 5 will be described.

A well-cleaned metal substrate is introduced into the load lock chamber LLI 5100, followed by evacuating the inside thereof to a vacuum of less than 0.01 Torr by means of a turbo-molecular pump (not show). Argon gas is flown into the load lock chamber through the gas feed pipe 5103 to thereby subject the substrate to flushing treatment for about 20 minutes. Thereafter, the flow rate of the argon gas is adjusted by closing an exhaust valve (not shown), whereby the inner pressure of the load lock chamber is maintained at a vacuum of 0.1 Torr. In this case, the inside of the chamber PH 5200 is also maintained at a vacuum of 0.1 Torr by using argon gas. When these two chambers are maintained at the same inner pressure without conducting gas feed and gas exhaustion, the gate valve 5150 is opened and the substrate is transported from the load lock chamber into the chamber PH 5200 by operating the transportation driving rails 5105 and 5205. After the transportation having been accomplished, the gate valve 5150 is closed, when the inside of the load lock chamber LLI 5100 is still being exhausted by the turbo-molecular pump. In the chamber PH 5200, the substrate is heated at 300° C. for 30 minutes by means of the heater 5201 while introducing argon gas at a flow rate of 10 sccm through the gas feed pipe 5203, wherein the inside of the chamber is under condition of being exhausted through the exhaust pipe by operating a diffusion pump (not shown). Thereafter, a RF power of 13.5 MHz and 150 W and a DC power of 400 V are applied through the RF discharge electrode 5204 to conduct sputter-etching treatment for the substrate for 5 minutes. After this, the substrate is maintained in an argon flow atmosphere for 10 minutes, and the substrate is transported from the chamber PH 5200 into the chamber N 5300, then from the chamber N 5300 into the chamber I₁ 5400, respectively in the same manner as in the case of transporting the substrate from the chamber LLI 5100 into the chamber PH 5200.

In the chamber I₁, the heater 5401 is so adjusted that the surface temperature of the substrate can be maintained at a temperature in the range of 150° to 400° C., wherein the substrate is maintained under this condition for 15 minutes. In this case, hydrogen gas (purity: 99.9999%) is flown thereinto through the gas feed pipe 5403 at a flow rate of 10 sccm while exhausting the inside through the exhaust pipe 5402 by operating a vacuuming means comprising a mechanical booster pump and a rotary pump (not shown).

Then, a raw material gas or a gaseous mixture containing said raw material gas is introduced into the film-forming chamber through the gas feed pie 5403. The gate valve 5410 is opened to enter a metal source A 5408 housed in the metal source A containment vessel (the MA vessel) 5406 into the chamber I₁, and the metal source is positioned in close proximity to the substrate. The inner pressure is adjusted to a vacuum in the range of 0.01 to 10 Torr. Then, a RF power of 0.5 to 400 W is applied through the RF discharge electrode 5405 to cause RF discharge whereby producing plasma, wherein the metal source is sputtered by the plasma. This discharging is continued for 3 to 70 minutes, to thereby form an a-Si layer of about 0.04 to 4 micron meters in thickness on the substrate. After the film formation, the discharging is terminated, the metal source A 5408 is returned into the MA vessel, and the substrate is maintained in a hydrogen gas flow atmosphere for 10 minutes.

Thereafter, the substrate is transported into the chamber CL 5800 in the same transportation manner as in the above case. In the chamber CL 5800, the heater 5801 is under condition of OFF, and the substrate temperature can be monitored. Hydrogen gas is flown thereinto to cool the substrate to a temperature of less than 50° C. while exhausting the inside by operating the exhaust system (not shown). When the substrate is cooled to a temperature of less than 50° C., the substrate is transported into the load lock chamber LLO 5900 in the same transportation manner as in the above case. The exhaust valve (not shown) of the exhaust pipe 5902 is closed, and argon gas is introduced into the load lock chamber through the gas feed pipe 5903 to thereby make the inner pressure to be atmospheric pressure, wherein the gate valve 5950 is opened and the substrate is taken out from the system. After this, the gate valve is closed, the inside of the chamber LLO 5900 is again subjected to argon gas flushing treatment by opening the exhaust valve. Thus, a desirable a-Si film according to the present invention is formed on the metal substrate. After the film formation having been completed, the film-forming apparatus of FIG. 5 is returned into an idle state.

The substrate having the a-Si film formed thereon is introduced into a conventional resistance heating evaporation apparatus provided with a heat source comprising a tungsten wire, wherein a 70 Å thick Au film as a light incident side semitransparent electrode is deposited on the a-Si film. Thus, there is obtained a Shottky type solar cell.

In the above, in order to incorporate the foregoing five kinds of metal atoms into the a-Si film, instead of using the above raw material alloy member, it is possible to use appropriate raw material gases each capable of supplying given metal atoms. The introduction of those raw material gases may be properly conducted by using an appropriate raw material supply system similar to the gas supply system comprising the feed pipes 5X03 (X=1 to 9).

In the following, description will be made of apparatus suitable for production of an electrophotographic light receiving member or a solar cell each having the foregoing light receiving layer containing a conductivity controlling element and a manner of producing these devices with reference to FIGS. 6 to 8 and FIG. 5.

FIG. 6 shows the fabrication apparatus by the high frequency glow discharge decomposition process. (hereinafter referred to as RF glow discharge decomposition process) which is suitable for the production of a light receiving member for use in electrophotography according to the present invention, wherein the apparatus comprises the raw material gas supply unit 1020 and the film deposition unit 1000.

Description will be made of a typical manner of producing an electrophotographic light receiving member using this fabrication apparatus.

In FIG. 6, there are shown gas reservoirs 1071 through 1074. They contain raw material gases to form layers for the light receiving member according to the present invention. The gas reservoir 1071 contains SiH₄ gas (purity: 99.99%), the gas reservoir 1072 contains H₂ gas (purity: 99.9999%), the gas reservoir 1073 contains B₂H₆ gas diluted with H₂ gas (purity: 99.999%) (this will be hereinafter referred to as "B₂H₆/H₂ gas"), and the gas reservoir 1074 contains PH₃ gas diluted with H₂ gas (purity: 99.999%) (this will be hereinafter referred to as "PH₃/H₂ gas"). Reference numeral 1051 indicates a valve for the gas reservoir 1071, reference numeral 1052 a valve for the gas reservoir 1072, reference numeral 1053 a valve for the gas reservoir 1073, and reference numeral 1054 a valve for the gas reservoir 1074. When these gas reservoirs are attached to the gas supply unit 1020, the pipe ways between the valves 1051 to 1054 and inlet valves 1031 to 1034 are respectively charged with the corresponding gas.

In FIG. 6, reference numerals 1091 and 1091' indicate respectively a raw material alloy composed of silicon (Si), chromium (Cr), iron (Fe), magnesium (Mg), sodium (Na), and nickel (Ni). The raw material alloy is housed in a containment vessel 1094, and it can be moved from the containment vessel into a deposition chamber 1001 or from the latter into the former through a gate valve 1007 by means of a driving means 1092. In this apparatus, there is installed a heating means such as an electric heater (not shown) for heating the raw material alloy as well as in the case of the apparatus shown in FIG. 2.

Reference numeral 1005 indicates a cylindrical aluminum substrate. Reference numeral 1041 indicates an electric heater for heating the cylindrical substrate to a desired temperature.

In the film formation in this fabrication apparatus, prior to the entrance of the raw material gases into the deposition chamber, it is confirmed that the valves 1051 through 1054 for the gas reservoirs 1071 through 1074, a leak valve 1015 for the deposition chamber 1001, and an exhaust valve 1093 for the containment vessel 1094 are closed and that the inlet valves 1031 through 1034, exit valves 1041 through 1044, a sub-valve 1081, and the gate valve 1007 are opened. Then, a main valve 1016 is at first opened to evacuate the inside of the deposition chamber 1001, the inside of the containment vessel 1094 and the insides of the gas pipe ways by means of a vacuum pump (not shown). Upon observing that the reading on a vacuum gage 1017 became about 1×10⁻³ Torr, the sub-valve 1018, the inlet valves 1031 through 1034, and the exit valves 1041 through 1044 are closed. Thereafter, $SiH_4$ gas from the gas reservoir 1071, $H_2$ gas from the gas reservoir 1072, $B_2H_6/H_2$ gas from the gas reservoir 1073, and $PH_3/H_2$ gas from the reservoir 1074 are caused to flow by opening the valves 1051 through 1054, wherein the gas pressures of the raw material gases are respectively controlled to 2 $Kg/cm^2$ by means of pressure controllers 1061 through 1064. Then, the inlet valves 1031 through 1034 are gradually opened to allow the above raw material gases to enter into mass flow controllers 1021 through 1024.

Successively, the raw material alloy 1091 maintained at a desired temperature is moved to the position indicated by the reference numeral 1091' by the driving means 1092. Then, the exit valves 1041 through 1043 and the sub-valve 1018 are gradually opened to enter the $SiH_4$ gas, $H_2$ gas and $B_2H_6/H_2$ gas into the deposition chamber 1001 through gas feed pipes 1008 each being provided with a plurality of gas liberation holes 1009. In this case, the flow rate of the $SiH_4$ gas, that of the $H_2$ gas, and that of the $B_2H_6/H_2$ gas are adjusted to predetermined respective values by means of the mass flow controllers 1021 through 1023.

The inner pressure of the deposition chamber 1001 is maintained at a predetermined value by regulating the opening of the main valve 1016 while observing the reading on the vacuum gage 1017. Thereafter, a RF power source (not shown) is switched on to apply a predetermined RF power into the deposition chamber 1001 through a matching box 1012 to cause RF glow discharge whereby producing plasma, wherein the raw material alloy is sputtered by the plasma. By this, a film to be a light receiving layer for electrophotographic light receiving member is formed on the cylindrical aluminum substrate 1005. When the film is formed at a predetermined thickness, the RF glow discharge is terminated, and the exit valves 1041 through 1043 and the sub-valve are closed to terminate the feed of the raw material gases into the deposition chamber 1001. Thus, the formation of the light receiving layer is completed.

In the above, in order to incorporate the foregoing five kinds of metal atoms into the light receiving layer, instead of using the above raw material alloy, it is possible to introduce appropriate raw material gases each capable of supplying given metal atoms into the deposition chamber 1001 by using a relevant gas supply unit containing gas reservoirs for those raw material gases.

If necessary, it is possible to form a second light receiving layer on the light receiving layer formed in the above, wherein the previously formed layer is made to be a first light receiving layer. In this case, the formation of the second light receiving layer may be conducted in the following manner.

That is, in the case where the raw material alloy 1091' is not used for the formation of the second layer, the raw material alloy 1091' is returned to the original position 1091 by means of the driving means 1092, and the gate valve 1007 is closed. Then, the sub-valve 1018 is once closed. Thereafter, the exit valves 1041 and 1042 and the sub-valve 1018 are gradually opened to enter $SiH_4$ gas and $H_2$ gas into the deposition chamber 1001 through the gas liberation holes 1009 of the gas feed pipes 1008. In this case, the flow rate of the $SiH_4$ gas and that of the $H_2$ gas are adjusted to predetermined respective values by means of the mass flow controllers 1021 and 1022.

The inner pressure of the deposition chamber 1001 is maintained at a predetermined value by regulating the opening of the main valve 1016 while observing the reading on the vacuum gage 1017. Thereafter, the RF power source (not shown) is switched on to apply a predetermined RF power into the deposition chamber 1001 through the matching box 1012 to cause RF glow discharge whereby producing plasma. By this, a film to be the second light receiving layer is formed on the previously formed first light receiving layer. When the film is formed at a predetermined thickness, the RF glow discharge is terminated, and the exit valves 1041 and 1042 and the sub-valve 1018 are closed to terminate the feed of the raw material gases into the deposition chamber 1001. Thus, the formation of the second light receiving layer is completed.

Further if necessary, it is possible to form a third light receiving layer on the second light receiving layer. In this case, the formation of the third light receiving layer may be conducted in the following manner.

That is, in the case where the raw material alloy has not been used for the formation of the second layer, the inside of the containment vessel 1094 is evacuated by opening the exhaust valve 1093, and thereafter the exhaust valve 1093 is closed. Then, the gate valve 1007 is opened and the raw material alloy 1091 is moved to the position 1091' by means of the driving means 1092. Thereafter, the exit valves 1041, 1042 and 1044 and the sub-valve 1018 are gradually opened to enter $SiH_4$ gas, $H_2$ gas and $PH_3/H_2$ gas into the deposition chamber 1001 through the gas liberation holes 1009 of the gas feed pipes 1008. In this case, the flow rate of the $SiH_4$ gas, that of the $H_2$ gas and that of the $PH_3/H_2$ gas are adjusted to predetermined respective values by means of the mass flow controllers 1021, 1022 and 1024.

The inner pressure of the deposition chamber 1001 is maintained at a predetermined value by regulating the opening of the main valve 1016 while observing the reading on the vacuum gage 1017. Thereafter, the RF power source (not shown) is switched on to apply a predetermined RF power into the deposition chamber 1001 through the matching box 1012 to cause RF glow discharge whereby producing plasma, wherein the raw material alloy is sputtered by the plasma. By this, a film to be the third light receiving layer is formed on the previously formed second light receiving layer. When the film is formed at a predetermined thickness, the RF glow discharge is terminated, and the exit valves 1041, 1042 and 1044 and the sub-valve 1018 are closed to terminate the feed of the raw material gases into the deposition chamber 1001. Thus, the formation of the third light receiving layer is completed.

Of the exit valves 1041 to 1044, all of the exit valves other than those required for upon forming the respective layers are of course closed. Further, upon forming the respective layers, the inside of the system is once evacuated to a high vacuum degree as required by closing the exit valves 1041 through 1044 while opening the sub-valve 1018, the gate valve 1007 and the exhaust valve 1093 and fully opening main valve 1016 for avoiding that the gases having been used for forming the previous film are left in the deposition chamber 1001, in the pipe ways from the exit valves 1041 trough 1044 to the inside of the deposition chamber 1001, and in the containment vessel 1094.

In the case of using the raw material alloy 1091 for forming the respective layers, the procedures of evacuating the inside of the containment vessel 1094 by opening the exhaust valve 1093, closing the exhaust valve 1093, opening the gate valve 1007, and moving the raw material alloy 1091 to the position 1091' by means of the driving means 1092 are conducted. In the case of not using the raw material alloy 1091, the procedures of returning the raw material alloy 1091' to the original position 1091 and closing the gate valve 1007 are conducted. As previously described, instead of the raw material alloy, it is possible to use appropriate raw material gases capable of supplying the foregoing metal atoms upon forming a given light receiving layer.

Further, during the film-forming operation, it is possible to rotate the cylindrical aluminum substrate 1005 at a desired rotational speed by means of a rotating means (not shown) in order to attain a desirable uniformity for a film obtained.

FIG. 8 shows the fabrication apparatus by the microwave glow discharge decomposition process (the microwave will be hereinafter referred to as μW) which is suitable for the production of a light receiving member for use in electrophotography according to the present invention. This fabrication apparatus comprises a modification of the fabrication apparatus shown in FIG. 6 in which the film deposition unit 1000 in FIG. 6 is replaced by a film deposition unit 1100 by the μW glow discharge decomposition process shown in FIG. 7, wherein the μW discharge decomposition film deposition unit is connected to the gas supply unit 1020.

Description will be made of a typical manner of producing an electrophotographic light receiving member using this fabrication apparatus.

In the figures, reference numeral 1191 indicates an aluminum cylinder having a raw material alloy member disposed on the surface thereof which is dedicated for the formation of a light receiving layer for the electrophotographic light receiving member as well as in the case of FIG. 3. The raw material alloy member comprises an ally member composed of silicon (Si), chromium (Cr), iron (Fe), magnesium (Mg), sodium (Na) and nickel (Ni) disposed to cover a given surface area of the aluminum cylinder which is corresponding to a ¼ of the entire surface area of the aluminum cylinder in the longitudinal direction. The remaining ¾ surface area of the aluminum cylinder is covered by a silicon material. The aluminum cylinder having the raw material alloy member thereon is installed such that a desired surface thereof can be faced toward a plasma generation zone 1109 upon film formation by means of a rolling mechanism (not shown).

Reference numeral 1107 indicates a cylindrical aluminium substrate on which a film is to be deposited which can be heated to a desired temperature by means of a heater (not shown). The aluminum cylinder 1191 having the raw material alloy member thereon can be heated to a desired temperature by means of a heater (not shown).

In the film formation in this fabrication apparatus, as well as in the case of the film formation by the above-described RF glow discharge decomposition process, prior to commencing film formation, the inside of the deposition chamber 1101 and the insides of the gas pipe ways are evacuated so as to bring the inside of the deposition chamber 1101 to a vacuum of about $5 \times 10^{-6}$ Torr, and thereafter, the respective raw material gases are caused to enter into the mass flow controllers 1021 to 1025. Herein, the H₂ gas reservoir used in the above case is replaced by a gas reservoir containing SiF₄ gas purity: 99.999%).

Then, the cylinder 1191 having the raw material alloy member composed of silicon (Si), chromium (Cr), iron (Fe), magnesium (Mg), sodium (Na) and nickel (Ni) disposed thereon is rotated such that the raw material alloy member faces toward the plasma discharge zone 1109. Successively, the exit valves 1041 through 1043 and the sub-valve 1018 are gradually opened to enter SiH₄ gas, SiF₄ gas and B₂H₆/H₂ gas into the deposition chamber 1101 through the gas liberation holes (not shown) of the gas feed pipes 1110. In this case, the flow rate of the SiH₄ gas, that of the SiF₄ gas and that of the B₂H₆/H₂ gas are adjusted to predetermined respective values by means of the mass flow controllers 1021 through 1023.

The inner pressure of the deposition chamber 1101 is maintained at a predetermined value by regulating the opening of the main valve while observing the reading on the vacuum gage (not shown). Thereafter, the μW power source (not shown) is switched on to apply a predetermined microwave power into the plasma generation zone 1109 through the waveguide 1103 and the dielectric window 1102 to cause μW glow discharge whereby producing plasma, wherein the raw material alloy member is sputtered by the plasma. By this, a film to be a light receiving layer for electrophotographic light receiving member is formed on each of the cylindrical aluminum substrates 1107. When the film is formed on each substrate at a predetermined thickness, the μW glow discharge is terminated, and the exit valves 1041 through 1043 and the sub-valve are closed to terminate the feed of the raw material gases into the deposition chamber 1101. Thus, the formation of the light receiving layer is completed.

If necessary, it is possible to form a second light receiving layer on the light receiving layer formed in the above, wherein the previously formed layer is made to be a first light receiving layer. In this case, the formation of the second light receiving layer may be conducted in the following manner.

That is, in the case where the raw material alloy member is not used for the formation of the second light receiving layer, the cylinder 1191 is rotated such that the surface thereof having the silicon material thereon faces toward the plasma discharge zone 1109. Successively, the sub-valve 1018 is once closed. Then, the exit valves 1041 and 1042 and the sub-valve 1018 are gradually opened to enter SiH₄ gas and SiF₄ gas into the deposition chamber 1101 through the gas liberation holes (not shown) of the gas feed pipes 1110. In this case, the flow rate of the SiH₄ gas and that of the SiF₄ gas are adjusted to predetermined respective values by means of the mass flow controllers 1021 and 1022.

The inner pressure of the deposition chamber 1101 is maintained at a predetermined value by regulating the opening of the main valve while observing the reading on the vacuum gage (not shown). Thereafter, the μW power source (not shown) is switched on to apply a predetermined microwave power into the plasma generation zone 1109 through the waveguide 1103 and the dielectric window 1102 to cause uW glow discharge whereby producing plasma. By this, a film to be the second light receiving layer is formed on the first light receiving layer previously formed each of the cylindrical aluminum substrates. When the film is formed on each substrate at a predetermined thickness, the μW glow discharge is terminated, and the exit valves 1041 and 1042 and the sub-valve 1018 are closed to terminate the feed of the raw material gases into the deposition chamber 1101. Thus, the formation of the second light receiving layer is completed.

Further if necessary, it is possible to form a third light receiving layer on the second light receiving layer. In this case, the formation of the third light receiving layer may be conducted in the following manner.

That is, the cylinder 1191 is rotated such that the surface thereof having the raw material alloy member composed of silicon (Si), chromium (Cr), iron (Fe), magnesium (Mg), sodium (Na) and nickel (Ni) thereon faces toward the plasma discharge zone 1109. Successively, the exit valves 1041, 1042 and 1044 and the sub-valve 1018 are gradually opened to enter $SiH_4$ gas, $SiF_4$ gas and $PH_3/H_2$ gas into the deposition chamber 1101 through the gas liberation holes (not shown) of the gas feed pipes 1110. In this case, the flow rate of the $SiH_4$ gas, that of the $SiF_4$ gas and that of the $PH_3/H_2$ gas are adjusted to predetermined respective values by means of the mass flow controllers 1021, 1022 and 1024.

The inner pressure of the deposition chamber 1101 is maintained at a predetermined value by regulating the opening of the main valve while observing the reading on the vacuum gage (not shown). Thereafter, the μW power source (not shown) is switched on to apply a predetermined microwave power into the plasma generation zone 1109 through the waveguide 1103 and the dielectric window 1102 to cause μW glow discharge whereby producing plasma, wherein the raw material alloy member is sputtered by the plasma. By this, a film to be the third light receiving layer is formed on the second light receiving layer previously formed on each of the cylindrical aluminum substrates. When the film is formed on each substrate at a predetermined thickness, the μW glow discharge is terminated, and the exit valves 1041, 1042 and 1044 and the sub-valve are closed to terminate the feed of the raw material gases into the deposition chamber 1101. Thus, the formation of the third light receiving layer is completed.

Of the exit valves 1041 to 1044, all of the exit valves other than those required for upon forming the respective layers are of course closed. Further, upon forming the respective layers, the inside of the system is once evacuated to a high vacuum degree as required by closing the exit valves 1041 through 1044 while opening the sub-valve 1018 and fully opening main valve 1016 for avoiding that the gases having been used for forming the previous film are left in the deposition chamber 1001 and in the pipe ways from the exit valves 1041 trough 1044 to the inside of the deposition chamber 1001.

As apparent from the above description, upon forming the respective layers, the procedure of facing the face comprised of the silicon material of the foregoing cylinder toward the plasma generation zone 1109 by means of the rolling mechanism (not shown) or the procedure of facing the face comprised of the raw material alloy member composed of silicon (Si), chromium (Cr), iron (Fe), magnesium (Mg), sodium (Na) and nickel (Ni) toward the plasma discharge zone 1109 by means of the rolling mechanism is conducted when required.

Further, during the film-forming operation, it is possible to rotate each of the cylindrical aluminum substrates 1107 at a desired rotational speed by means the rotating means (not shown) in order to attain a desirable uniformity for a film formed on each cylindrical aluminum substrate. Further in addition, instead of the raw material alloy member, it is possible to use appropriate raw material gases capable of supplying the foregoing metal atoms upon forming a given light receiving layer.

In the following, description will be made of a typical manner of producing other solar cell using the apparatus shown in FIG. 5. The fundamental film-forming manner using the apparatus shown in FIG. 5 is as has described in the above.

In the following, a typical manner of producing a pin junction type solar cell using the apparatus shown in FIG. 5 will be described.

In this case, the procedures until the chamber N are the same as those in the foregoing case of producing the Shottky type solar cell. In the chamber N, the heater 5301 is so adjusted that the surface temperature of the substrate can be maintained at a temperature in the range of 150° to 400° C., wherein the substrate is maintained under this condition. In this case, argon gas (purity: 99.9999%) is flown into the chamber through the gas feed pipe 5303 at a flow rate of 20 sccm while exhausting the inside through the exhaust pipe 5302 by operating the vacuuming means comprising a mechanical booster pump and a rotary pump (not shown).

Then, an n-type dopant-containing raw material gas or a gaseous mixture containing said raw material gas is introduced into the chamber N through the gas feed pipe 5303. The inner pressure of the chamber N is maintained at a value of 0.01 to 10 Torr. A RF power of 0.5 to 400 W is applied through the RF discharge electrode 5304 to cause RF discharge whereby producing plasma. This discharging is continued for 0.1 to 10 minutes, to thereby form an about 0.005 to 0.2 micron meters thick a-Si layer having an n-type conductivity. After the layer formation, the discharging is terminated, and the substrate is maintained in an argon gas flow atmosphere for 10 minutes. Thereafter, the substrate is transported from the chamber N 5300 into the chamber $I_1$ 5400 in the same manner as in the foregoing case of transporting the substrate from the chamber LLI 5100 into the chamber PH 5200.

In the chamber $I_1$ 5400, the heater 5401 is so adjusted that the surface temperature of the substrate can be maintained at a temperature in the range of 150° to 400° C., wherein the substrate is maintained under this condition for 15 minutes. In this case, hydrogen gas (purity: 99.9999%) is flown thereinto through the gas feed pipe 5403 at a flow rate of 10 sccm while exhausting the inside through the exhaust pipe 5402 by operating the vacuuming means comprising the mechanical booster pump and the rotary pump (not shown).

Then, a raw material gas or a gaseous mixture containing said raw material gas is introduced into the chamber $I_1$ through the gas feed pie 5403. The gate valve 5410 is opened to enter the metal source A 5408 housed in the metal source A containment vessel (the MA vessel) 5406 into the chamber $I_1$, and the metal source is positioned in close proximity to the substrate. The inner pressure is adjusted to a vacuum in the range of 0.01 to 10 Torr. Then, a RF power of 0.5 to 400 W is applied through the RF discharge electrode 5405 to cause RF discharge whereby producing plasma, wherein the metal source is sputtered by the plasma. This discharging is continued for 3 to 70 minutes, to thereby form an a-Si layer of about 0.04 to 4 micron meters in thickness on the substrate. After the layer formation, the discharging is terminated, the metal source A 5408 is returned into the MA vessel, and the substrate is maintained in a hydrogen gas flow atmosphere for 10 minutes. The substrate is transported from the chamber $I_1$ 5400 into the chamber $I_2$ 5500, then from the chamber $I_2$ 5500 into the chamber $I_3$ 5600, further from the chamber $I_3$ 5600 into the chamber P, respectively in the same manner as in the foregoing case of transporting the substrate from the chamber LLI 5100 into the chamber PH 5200. In the chamber P, the heater 5701 is so adjusted that the surface temperature of the substrate can be maintained at a temperature in the range of 150° to 400° C., wherein the substrate is maintained under this condition. In this case, argon gas (purity: 99.9999%) is flown into the chamber through the gas feed pipe 5703 at a flow rate of 20 sccm while exhausting the inside through the exhaust pipe 5702 by operating the vacuuming means comprising a mechanical booster pump and a rotary pump (not shown).

Then, a p-type dopant-containing raw material gas or a gaseous mixture containing said raw material gas is introduced into the chamber P through the gas feed pipe 5703. The inner pressure of the chamber P is maintained at a value of 0.01 to 10 Torr. A RF power of 0.5 to 400 W is applied through the RF discharge electrode 5704 to cause RF discharge whereby producing plasma. This discharging is continued for 0.1 to 10 minutes, to thereby form an about 0.005 to 0.2 micron meters thick a-Si layer having a p-type conductivity. After the layer formation, the discharging is terminated, and the substrate is maintained in an argon gas flow atmosphere for 10 minutes.

Thereafter, following the procedures employed in the foregoing case of producing the Shottky type solar cell, the substrate is transported into the chamber CL 5800, and it is taken out from the chamber LLO. On the pin structure formed on the substrate, an upper electrode is formed by a conventional method, to thereby obtain a solar cell. For instance, the upper electrode may be formed by forming a 150 Å thick ITO film by means of the sputtering technique, followed by forming an Ag grid electrode.

In the following, description will be made of a typical manner of producing an electrophotographic light receiving member of the constitution shown in FIG. 9 in which the first light receiving layer 102-1 is incorporated with a conductivity controlling material (M) (a valence electron controlling agent) so that it has a function of preventing a charge from injecting from the substrate 101.

The second light receiving layer 102-2 in this case is the same as that in the foregoing case. Therefore, description about this is omitted herein.

In the present invention, the valence controlling agent-containing first light receiving layer can be properly formed by the conventional glow discharge decomposition method such as RF glow discharge decomposition method or microwave glow discharge decomposition method, as well as in the foregoing case.

The raw material gas capable of supplying Si which is used for the formation of said first light receiving layer can include, for example, gaseous or gasifiable silicon hydrides (silanes) such as $SiH_4$, $Si_2H_6$, $Si_3H_8$, $Si_4H_{10}$, and the like, among these, $SiH_4$ and $Si_2H_6$ being particularly preferred in view of ease of layer formation and good Si supply efficiency. These Si-supplying raw material gases may be diluted with appropriate gas such as $H_2$ gas, He gas, Ar gas or Ne gas if necessary.

As the halogen-supplying raw material gas, there can be mentioned, for example, gaseous or gasifiable halogen compounds such as halogen gases, halogen compounds, interhalogen compounds, and halogen-substituted silane derivatives. Other than these, gaseous or gasifiable silicon halides each comprising silicon atom (Si) and halogen atom (X) as the constituent atoms, and gaseous or gasifiable hydrogenated silicon compounds each containing halogen atom (X) as the constituent atom are also effective in the present invention.

Detailed explanation about the above halogen compounds and halogen (X)-containing silicon compounds (that is, the halogen (X)-substituted silane derivatives) is omitted herein, because these compounds have been previously exampled.

The use of such halogen atom (X)-containing silicon compound in the formation of the first light receiving layer comprising a halogen atom (X)-containing non-Si material of the electrophotographic light receiving member according to the present invention by the glow discharge decomposition method is advantageous since the layer can be formed without using an additional hydrogenated silicon gas as the raw material for supplying Si.

Basically, when the halogen atom (X)-containing first light receiving layer by the glow discharge decomposition method, the layer can be formed on a desired substrate using only the above-described silicon halide capable of supplying also Si. In order to facilitate the introduction of hydrogen atoms (H) into the layer, it is possible to use hydrogen gas or a hydrogen atom (H)-containing silicon compound gas in a desired mixing ratio together with said raw material. These raw material gases are not necessary to be separately used. It is possible to use these raw material gases by mixing them in a desired mixing ratio.

In the present invention, the foregoing halogen compounds and halogen atom (X)-containing silicon compounds are effectively usable as the halogen atom-supplying raw material gas. Other than these, those gaseous or gasifiable halogen-substituted silicon hydrides which have been previously exampled are also effective for the formation of the above first light receiving layer. The use of such hydrogen atom (H)-containing halogen compound is advantageous since hydrogen atoms, which are extremely effective in view of the control for the electric or photoconductive properties of a layer formed, are also introduced together with the introduction of the halogen atoms (X) upon forming the above first light receiving layer.

In order to structurally introduce hydrogen atoms (H) into the first light receiving layer, it is effective to cause glow discharge in the presence of $H_2$ gas or silicon hydride such as $SiH_4$, $Si_2H_6$, $Si_3H_8$, or $Si_4H_{10}$ in the deposition chamber.

The amount of the hydrogen atoms (H) or/and halogen atoms (X) to be contained may be adjusted as desired by properly controlling related conditions, i.e., the substrate temperature, the flow rate of the raw material gas capable of supplying hydrogen atom (H) or/and halogen atom (X) to be introduced into the deposition chamber, the electric discharging power, and the like.

The amount of the hydrogen atoms (H) contained in the above first light receiving layer is preferably in the range of 1 to 40 atomic %, more preferably in the range of 5 to 30 atomic %, most preferably in the range of 5 to 20 atomic %. As for the amount of the halogen atoms (X) contained in the above first light receiving layer, it is preferably in the range of 0.01 to 40 atomic %, more preferably in the range of 0.01 to 30 atomic %, most preferably in the range of 0.01 to 10 atomic %.

The content of the hydrogen atoms and that of the halogen atoms are organically related with each other. In the case where the content of the hydrogen atoms is made to be relatively great, the content of the halogen atoms is desired to be as small as possible.

In the present invention, to structurally incorporate atoms (M) of a given group III or V element of the periodic table into the above first light receiving layer may be properly conducted by introducing a given gaseous raw material capable of supplying the atoms (M) into the deposition chamber together with other film-forming raw material gas upon the formation of the first light receiving layer. The group III atom-supplying raw material or the group V atom-supplying raw material can include raw materials which are in the gaseous state under conditions of room temperature and normal pressure or can be easily gasified at least under the layer-forming conditions.

Specifically, the group III atom-supplying raw material can include those which have been previously described. The group V atom-supplying raw material can include those which have been previously described. These raw materials capable of supplying the conductivity controlling atoms (M)

may diluted with appropriate gas such as $H_2$ gas, He gas, Ar gas or Ne gas upon their introduction into the deposition chamber.

The layer constitution of the light receiving member according to the present invention is not limited to those above described only, but it can be modified into any other appropriate layer constitution as long as the objects of the present invention can be attained.

The present invention will be described in more detail with reference to the following experiments, which are however not intended to restrict the scope of the present invention to these experiments.

Experiment 1 and Comparative Experiments 1 to 5

Experiment 1

In accordance with the foregoing film-forming manner using the apparatus shown in FIG. 2 and under the conditions shown in Table 1, there were prepared a plurality of electrophotographic light receiving members, wherein as the substrate, there was used a cylindrical aluminum substrate of 108 mm in outer diameter and having a mirror ground surface in every case.

In addition, the above film-forming procedures under the conditions shown in Table 1 were repeated, except that the layer thickness was changed to 5 μm and a quartz plate was used as the substrate, to thereby obtain a test sample having the same layer as in the above.

Comparative Experiment 1

The procedures of Experiment 1 were repeated, except that a raw material alloy composed of 99.80 atomic % of silicon (Si) and 0.20 atomic % of chromium (Cr) was used as the raw material alloy 1091, to there by obtain a plurality of electrophotographic light receiving members and a test sample.

Comparative Experiment 2

The procedures of Experiment 1 were repeated, except that a raw material alloy composed of 99.80 atomic % of silicon (Si) and 0.20 atomic % of iron (Fe) was used as the raw material alloy 1091, to there by obtain a plurality of electrophotographic light receiving members and a test sample.

Comparative Experiment 3

The procedures of Experiment 1 were repeated, except that a raw material alloy composed of 99.65 atomic % of silicon (Si) and 0.35 atomic % of magnesium (Mg) was used as the raw material alloy 1091, to there by obtain a plurality of electrophotographic light receiving members and a test sample.

Comparative Experiment 4

The procedures of Experiment 1 were repeated, except that a raw material alloy composed of 99.65 atomic % of silicon (Si) and 0.35 atomic % of sodium (Na) was used as the raw material alloy 1091, to there by obtain a plurality of electrophotographic light receiving members and a test sample.

Comparative Experiment 5

The procedures of Experiment 1 were repeated, except that a raw material alloy composed of 99.80 atomic % of silicon (Si) and 0.20 atomic % of nickel (Ni was used as the raw material alloy 1091, to there by obtain a plurality of electrophotographic light receiving members and a test sample.

Evaluation

As for each of the electrophotographic light receiving members obtained in Experiment 1 and Comparative Experiments 1 to 5, the content of each metal atoms contained in the light receiving layer was examined by subjecting the light receiving layer to analysis using a commercially available SIMS (a secondary ion mass spectrometer IMS-3F, produced by CAMEKA Company). The results obtained are collectively shown in Table 2.

Each of the electrophotographic light receiving members obtained in Experiment 1 and Comparative Experiments 1 to 5 was evaluated with respect to resistance to light-induced fatigue in the following manner. That is, as for each electrophotographic light receiving member, semiconductor laser of 785 nm in luminous wavelength and 10 mW in output power was continuously irradiated to its central region of about 3 cm in diameter for 24 hours while rotating the electrophotographic light receiving member.

Then, the electrophotographic light receiving member was set to a modification of the electrophotographic copying machine NP-9330 produced by CANON Kabushiki Kaisha for experimental purposes, and it was evaluated with respect to its electrophotographic characteristics. That is, using a A3-sized test chart having, in the lengthwise direction, a solid black area of 1.1 in reflection density extending from one end side to the 4 cm distant position from the end side, a solid white area of 0.08 in reflection density extending from the 4 cm distant position to the 8 cm distant position respectively from the end side, and the remaining halftone area of 0.3 in reflection density, reproduction was conducted on a A3-sized white paper under conditions of providing a reproduced image with a standard image density. As for the reproduced image obtained, there was examined a difference between the image reproduced at the central region irradiated with the semiconductor laser of the electrophotographic light receiving member and the image reproduced at the remaining region of the electrophotographic light receiving member in terms of density. That is, as for the reproduced image obtained, the ratio between the reflection density of the area extending from the 4 cm distant position to the 8 cm distant position respectively from the end position of the paper (corresponding to the solid black area of the test chart) and the reflection density of the area extending from the 4 cm distant position from the end position to the end position (corresponding to the solid white area of the test chart) was examined by means of a conventional reflection densitometer. The examined results are collectively shown in Table 2.

From the results shown in Table 2, it was found that the electrophotographic light receiving member obtained in Experiment 1 is the smallest in terms of the reflection density ratio and slight in terms of ghost appearance and thus, it is superior in view of electrophotographic characteristics.

Further, as for each electrophotographic light receiving member, a rubber roller of 40 mm in diameter was contacted thereto, and a sine wave voltage of 700 V was applied for an hour while rotating the electrophotographic light receiving member and the rubber roller. Then, the electrophotographic light receiving member was set to the foregoing electrophotographic copying machine, wherein it was subjected to image reproduction, using a solid black test chart. The image obtained was evaluated in comparison with the image obtained using the electrophotographic light receiving member before having applied the above voltage in terms of the ratio of white dots appeared. The evaluated results obtained are collectively shown in Table 2, wherein the dot appearance ratio of the electrophotographic light receiving member obtained in Experiment 1 is set at 1.

From the results shown in Table 2, it was found that the electrophotographic light receiving member obtained in Experiment 1 is the smallest in terms of the dot appearance ratio and thus, it is superior in view of electrophotographic characteristics.

Further in addition, as for each electrophotographic light receiving member, evaluation was conducted with respect to charge mobility in accordance with the time-of-flight method. The evaluated results obtained are collectively shown in Table 2, wherein the charge mobility of the electrophotographic light receiving member obtained in Experiment 1 is set at 1.

From the results shown in Table 2, it was found that the electrophotographic light receiving member obtained in Experiment 1 is the fastest in terms of charge mobility and thus, it is superior in view of electrophotographic characteristics.

Further more, using each of the test samples obtained in Experiment 1 and Comparative Experiments 1 to 5, the corresponding electrophotographic light receiving member was evaluated with respect to total spin density by the ESR. The evaluated results obtained are collectively shown in Table 2, wherein the values shown are values relative to the total spin density of the electrophotographic light receiving member obtained in Experiment 1 which is set at 1. From the results shown in Table 2, it was found that the electrophotographic light receiving member obtained in Experiment 1 is the smallest in terms of the total spin density and thus, it is superior in view of electrophotographic characteristics.

As apparent from the above results, it was found that the electrophotographic light receiving member obtained in Experiment 1 is surpassing other electrophotographic light receiving members obtained in Comparative Experiments 1 to 5.

Experiment 2 and Comparative Experiment 6

Experiment 2

The procedures of Experiment 1 were repeated, except that the composition ratio of the silicon (Si), chromium (Cr), iron (Fe), magnesium (Mg), sodium (Na), and nickel (Ni) by which the raw material alloy 1091 is constituted was changed to two different composition ratios shown in Table 3, to thereby obtain a plurality of electrophotographic light receiving members as for each raw material alloy, and a test sample as for each raw material alloy.

Comparative Experiment 6

The procedures of Experiment 1 were repeated, except that the composition ratio of the silicon (Si), chromium (Cr), iron (Fe), magnesium (Mg), sodium (Na), and nickel (Ni) by which the raw material alloy 1091 is constituted was changed to two different composition ratios shown in Table 3, to thereby obtain a plurality of electrophotographic light receiving members as for each raw material alloy, and a test sample as for each raw material alloy.

Evaluation

As for each of the electrophotographic light receiving members obtained in Experiment 2 and Comparative Experiment 6, the content of each metal atoms contained in the light receiving layer was examined by subjecting the light receiving layer to analysis using the SIMS as well as in Experiment 1. The results obtained are collectively shown in Table 4.

As for each of the electrophotographic light receiving members and the test samples obtained in Experiment 2 and Comparative Experiment 6, evaluation was conducted in the same manner as in Experiment 1. The evaluated results obtained are collectively shown in Table 4.

From the results shown in Table 4, it was found that any of the light receiving members having a light receiving layer containing the five kinds of metal atoms respectively in an amount of less than 0.9 atomic ppm is superior in terms of the electrophotographic characteristics required for an electrophotographic light receiving member.

Experiment 3

In accordance with the foregoing film-forming manner using the apparatus shown in FIG. 4 and under the conditions shown in Table 5, there were prepared a plurality of electrophotographic light receiving members and a test sample, wherein as the substrate, there was used a cylindrical aluminum substrate of 108 mm in outer diameter.

As for one of the electrophotographic light receiving members obtained, the content of each metal atoms contained in the light receiving layer was examined by subjecting the light receiving layer to analysis using the SIMS as well as in Experiment 1. The result obtained is shown in Table 6.

As for the remaining electrophotographic light receiving members and the test sample, evaluation was conducted in the same manner as in Experiment 1. The evaluated results obtained are collectively shown in Table 6.

From the results shown in Table 6, it was found that the light receiving member obtained in this experiment excels in electrophotographic characteristics as well as the electrophotographic light receiving member obtained in Experiment 1.

Experiment 4 and Comparative Experiments 7 to 11

Experiment 4

Firstly, there was provided, as the substrate, an aluminum plate of 1 mm in thickness and 4 cm×4 cm in size and having a polished surface of 0.5 s. This aluminum plate was subjected to ultrasonic cleaning using 1,1,1-trichloroethane for 10 minutes. Using the aluminum plate as the substrate, there was prepared a solar cell in accordance with the foregoing solar cell-preparing manner using the apparatus shown in FIG. 5 under the conditions shown in Table 7, wherein the film formation was conducted in the chamber $I_1$. The solar cell was made to have 50 translucent light incident side electrodes of 3 mm in diameter, each comprising an Au film. Each portion provided with the electrode of 3 mm in diameter was designed such that it could serve as an independent sub-cell (which can be separately dedicated for the measurement of I–V characteristics).

Comparative Experiment 7

The procedures of Experiment 4 were repeated, except that the raw material alloy 5408 was replaced by a raw material alloy composed of 99.80 atomic % of silicon (Si) and 0.20 atomic % of chromium (Cr), to thereby obtain a solar cell.

Comparative Experiment 8

The procedures of Experiment 4 were repeated, except that the raw material alloy 5408 was replaced by a raw material alloy composed of 99.80 atomic % of silicon (Si) and 0.20 atomic % of iron (Fe), to thereby obtain a solar cell.

Comparative Experiment 9

The procedures of Experiment 4 were repeated, except that the raw material alloy 5408 was replaced by a raw material alloy composed of 99.65 atomic % of silicon (Si) and 0.35 atomic % of magnesium (Mg), to thereby obtain a solar cell.

Comparative Experiment 10

The procedures of Experiment 4 were repeated, except that the raw material alloy 5408 was replaced by a raw material alloy composed of 99.65 atomic % of silicon (Si) and 0.35 atomic % of sodium (Na), to thereby obtain a solar cell.

Comparative Experiment 11

The procedures of Experiment 4 were repeated, except that the raw material alloy 5408 was replaced by a raw material alloy composed of 99.80 atomic % of silicon (Si) and 0.20 atomic % of nickel (Ni), to thereby obtain a solar cell.

Evaluation

As for each of the solar cells obtained in Experiment 4 and Comparative Experiments 7 to 11, a part of which was cut to obtain a measuring sample. Each measuring sample was subjected to analysis by the SIMS as well as in the foregoing case of the electrophotographic light receiving member to examine the content of each metal atoms. The results obtained are collectively shown in Table 8.

Then, as for each of the solar cells obtained in Experiment 4 and Comparative Experiments 7 to 11, each sub-cell was subjected to measurement of the I-V characteristics under a solar cell simulator. Based on the measured results, there were obtained a survival rate (the proportion of the number of non-shortcircuited sub-cells among the 50 sub-cells) and an external quantum efficiency (the ratio to a mean value between the maximum value and the minimum value for the survived sub-cells with respect to external quantum efficiency). Successively, as for each of the survived sub-cells, semiconductor laser of 785 nm in luminous wavelength and 10 mW in output power was continuously irradiated for 78 hours, the efficiency was examined, and based on the examined results, there was obtained a mean efficiency retention rate (the change of rate between the initial efficiency and the efficiency after having subjected to the semiconductor laser irradiation was expressed by a percentage value). The results obtained are collectively shown in Table 8.

From the results shown in Table 8, it was found that the solar cell obtained in Experiment 4 surpasses any of the solar cells obtained in Comparative Experiments 7 to 11 in terms of the solar cell characteristic.

Experiment 5 and Comparative Experiments 12 to 16

Experiment 5

In accordance with the foregoing film-forming manner using the apparatus shown in FIG. 6 and under the conditions shown in Table 9, there were prepared a plurality of electrophotographic light receiving members, wherein as the substrate, there was used a cylindrical aluminum substrate of 108 mm in outer diameter and having a mirror ground surface in every case.

In addition, the above film-forming procedures under the conditions shown in Table 9 were repeated, except that the layer thickness was changed to 5 μm and a quartz plate was used as the substrate, to thereby obtain a test sample having the same layer as in the above.

Comparative Experiment 12

The procedures of Experiment 5 were repeated, except that a raw material alloy composed of 99.80 atomic % of silicon (Si) and 0.20 atomic % of chromium (Cr) was used as the raw material alloy 1091, to thereby obtain a plurality of electrophotographic light receiving members and a test sample.

Comparative Experiment 13

The procedures of Experiment 5 were repeated, except that a raw material alloy composed of 99.80 atomic % of silicon (Si) and 0.20 atomic % of iron (Fe) was used as the raw material alloy 1091, to thereby obtain a plurality of electrophotographic light receiving members and a test sample.

Comparative Experiment 14

The procedures of Experiment 5 were repeated, except that a raw material alloy composed of 99.65 atomic % of silicon (Si) and 0.35 atomic % of magnesium (Mg) was used as the raw material alloy 1091, to thereby obtain a plurality of electrophotographic light receiving members and a test sample.

Comparative Experiment 15

The procedures of Experiment 5 were repeated, except that a raw material alloy composed of 99.65 atomic % of silicon (Si) and 0.35 atomic % of sodium (Na was used as the raw material alloy 1091, to thereby obtain a plurality of electrophotographic light receiving members and a test sample.

Comparative Experiment 16

The procedures of Experiment 5 were repeated, except that a raw material alloy composed of 99.80 atomic % of silicon (Si) and 0.20 atomic % of nickel (Ni) was used as the raw material alloy 1091, to thereby obtain a plurality of electrophotographic light receiving members and a test sample.

Evaluation

As for each of the electrophotographic light receiving members obtained in Experiment 5 and Comparative Experiments 12 to 16, the content of each metal atoms contained in the light receiving layer was examined by subjecting the light receiving layer to analysis using the SIMS used in Experiment 1. The results obtained are collectively shown in Table 10.

Each of the electrophotographic light receiving members obtained in Experiment 5 and Comparative Experiments 12 to 16 was evaluated with respect to resistance to light-induced fatigue in the following manner. That is, as for each electrophotographic light receiving member, semiconductor laser of 785 nm in luminous wavelength and 10 mW in output power was continuously irradiated to its central region of about 3 cm in diameter for 24 hours while rotating the electrophotographic light receiving member.

Then, the electrophotographic light receiving member was set to a modification of the electrophotographic copying machine NP-9330 produced by CANON Kabushiki Kaisha for experimental purposes, and it was evaluated in the same manner as in Experiment 1. The evaluated results obtained are collectively shown in Table 10.

From the results shown in Table 10, it was found that the electrophotographic light receiving member obtained in Experiment 5 is the smallest in terms of the reflection density ratio and slight in terms of ghost appearance and thus, it is superior in view of electrophotographic characteristics.

Further, as for each electrophotographic light receiving member, a rubber roller of 40 mm in diameter was contacted thereof and a sine wave voltage of 700 V was applied for an hour while rotating the electrophotographic light receiving member and the rubber roller as well as in the case of Experiment 1. Then, the electrophotographic light receiving member was set to the foregoing electrophotographic copying machine, wherein it was subjected to image reproduction, using a solid black test chart. The image obtained was evaluated in comparison with the image obtained using the electrophotographic light receiving member before having applied the above voltage in terms of the ratio of white dots appeared. The evaluated results obtained are collectively shown in Table 10.

From the results shown in Table 10, it was found that the electrophotographic light receiving member obtained in Experiment 5 is the smallest in terms of the dot appearance ratio and thus, it is superior in view of electrophotographic characteristics.

Further in addition, as for each electrophotographic light receiving member, evaluation was conducted with respect to charge mobility in accordance with the time-of-flight method. The evaluated results obtained are collectively shown in Table 10, wherein the charge mobility of the electrophotographic light receiving member obtained in Experiment 5 is set at 1.

From the results shown in Table 10, it was found that the electrophotographic light receiving member obtained in Experiment 5 is the fastest in terms of charge mobility and thus, it is superior in view of electrophotographic characteristics.

Further more, using each of the test samples obtained in Experiment 5 and Comparative Experiments 12 to 16, the corresponding electrophotographic light receiving member was evaluated with respect to total spin density by the ESR. The evaluated results obtained are collectively shown in Table 10, wherein the values shown are values relative to the total spin density of the electrophotographic light receiving member obtained in Experiment 5 which is set at 1. From the results shown in Table 10, it was found that the electrophotographic light receiving member obtained in Experiment 5 is the smallest in terms of the total spin density and thus, it is superior in view of electrophotographic characteristics.

As apparent from the above results, it was found that the electrophotographic light receiving member obtained in Experiment 5 is surpassing other electrophotographic light receiving members obtained in Comparative Experiments 12 to 16.

Experiment 6 and Comparative Experiment 17
Experiment 6

The procedures of Experiment 5 were repeated, except that the composition ratio of the silicon (Si), chromium (Cr), iron (Fe), magnesium (Mg), sodium (Na), and nickel (Ni) by which the raw material alloy 1091 is constituted was changed to two different composition ratios shown in Table 11, to thereby obtain a plurality of electrophotographic light receiving members as for each raw material alloy, and a test sample as for each raw material alloy.
Comparative Experiment 17

The procedures of Experiment 5 were repeated, except that the composition ratio of the silicon (Si), chromium (Cr), iron (Fe), magnesium (Mg), sodium (Na), and nickel (Ni) by which the raw material alloy 1091 is constituted was changed to two different composition ratios shown in Table 11, to thereby obtain a plurality of electrophotographic light receiving members as for each raw material alloy, and a test sample as for each raw material alloy.

Evaluation

As for each of the electrophotographic light receiving members obtained in Experiment 6 and Comparative Experiment 17, the content of each metal atoms contained in the light receiving layer was examined by subjecting the light receiving layer to analysis using the SIMS used in Experiment 1. The results obtained are collectively shown in Table 12.

As for each of the electrophotographic light receiving members and the test samples obtained in Experiment 6 and Comparative Experiment 17, evaluation was conducted in the same manner as in Experiment 1. The evaluated results obtained are collectively shown in Table 12.

From the results shown in Table 12, it was found that any of the light receiving members having a light receiving layer containing the five kinds of metal atoms respectively in an amount of less than 0.9 atomic ppm is superior in terms of the electrophotographic characteristics required for an electrophotographic light receiving member.

Experiment 7

In accordance with the foregoing film-forming manner using the apparatus shown in FIG. 8 and under the conditions shown in Table 13, there were prepared a plurality of electrophotographic light receiving members and a test sample, wherein as the substrate, there was used a cylindrical aluminum substrate of 108 mm in outer diameter.

As for one of the electrophotographic light receiving members obtained, the content of each metal atoms contained in the light receiving layer was examined by subjecting the light receiving layer to analysis using the SIMS used in Experiment 1. The result obtained is shown in Table 14.

As for the remaining electrophotographic light receiving members and the test sample, evaluation was conducted in the same manner as in Experiment 1. The evaluated results obtained are collectively shown in Table 14.

From the results shown in Table 14, it was found that the light receiving member obtained in this experiment excels in electrophotographic characteristics as well as the electrophotographic light receiving member obtained in Experiment 5.

Experiment 8 and Comparative Experiments 18 to 22

Experiment 8

Firstly, there was provided, as the substrate, an aluminum plate of 1 mm in thickness and 4 cm×4 cm in size and having a polished surface of 0.2 s. This aluminum plate was subjected to ultrasonic cleaning using 1,1,1-trichloroethane for 10 minutes. Using the aluminum plate as the substrate, there was prepared a Shottky type solar cell in accordance with the foregoing solar cell-preparing manner using the apparatus shown in FIG. 5 under the conditions shown in Table 15, wherein the film formation was conducted in the chamber $I_1$. The solar cell was made to have 50 translucent light incident side electrodes of 3 mm in diameter, each comprising an Au film. Each portion provided with the electrode of 3 mm in diameter was designed such that it could serve as an independent sub-cell (which can be separately dedicated for the measurement of I–V characteristics).
Comparative Experiment 18

The procedures of Experiment 8 were repeated, except that the raw material alloy 5408 was replaced by a raw material alloy composed of 99.80 atomic % of silicon (Si) and 0.20 atomic % of chromium (Cr), to thereby obtain a solar cell.
Comparative Experiment 19

The procedures of Experiment 8 were repeated, except that the raw material alloy 5408 was replaced by a raw material alloy composed of 99.80 atomic % of silicon (Si) and 0.20 atomic % of iron (Fe), to thereby obtain a solar cell.

Comparative Experiment 20

The procedures of Experiment 8 were repeated, except that the raw material alloy 5408 was replaced by a raw material alloy composed of 99.65 atomic % of silicon (Si) and 0.35 atomic % of magnesium (Mg), to thereby obtain a solar cell.

Comparative Experiment 21

The procedures of Experiment 8 were repeated, except that the raw material alloy 5408 was replaced by a raw material alloy composed of 99.65 atomic % of silicon (Si) and 0.35 atomic % of sodium (Na), to thereby obtain a solar cell.

Comparative Experiment 22

The procedures of Experiment 8 were repeated, except that the raw material alloy 5408 was replaced by a raw material alloy composed of 99.80 atomic % of silicon (Si) and 0.20 atomic % of nickel (Ni), to thereby obtain a solar cell.

Evaluation

As for each of the solar cells obtained in Experiment 8 and Comparative Experiments 18 to 22, a part of which was cut to obtain a measuring sample. Each measuring sample was subjected to analysis by the SIMS as well as in the foregoing case of the electrophotographic light receiving member to examine the content of each metal atoms. The results obtained are collectively shown in Table 16.

Then, as for each of the solar cells obtained in Experiment 8 and Comparative Experiments 18 to 22, each sub-cell was subjected to measurement of the I–V characteristics under a solar cell simulator. Based on the measured results, there were obtained a survival rate (the proportion of the number of non-shortcircuited sub-cells among the 50 sub-cells) and an external quantum efficiency (the ratio to a mean value between the maximum value and the minimum value for the survived sub-cells with respect to external quantum efficiency). Successively, as for each of the survived sub-cells, semiconductor laser of 785 nm in luminous wavelength and 10 mW in output power was irradiated for 78 hours, the efficiency was examined, and based on the examined results, there was obtained a mean efficiency retention rate (the change of rate between the initial efficiency and the efficiency after having subjected to the semiconductor laser irradiation was expressed by a percentage value). The results obtained are collectively shown in Table 16.

From the results obtained in the above it was found that the solar cell obtained in Experiment 8 is surpassing any of the solar cells obtained in Comparative Experiments 18 to 22 in terms of the solar cell characteristic.

Experiment 9 and Comparative Experiments 23 to 27

Experiment 9

Firstly, there was provided, as the substrate, an aluminum plate of 1 mm in thickness and 4 cm×4 cm in size and having a polished surface of 0.2 s. This aluminum plate was subjected to ultrasonic cleaning using 1,1,1-trichloroethane for 10 minutes. Using the aluminum plate as the substrate, there was prepared a pin junction type solar cell in accordance with the foregoing solar cell-preparing manner using the apparatus shown in FIG. 5 under the conditions shown in Table 17, wherein the film formation was conducted successively in the chamber N, in chamber $I_1$ and then in the chamber P. The solar cell was made to have 50 translucent light incident side electrodes of 3 mm in diameter each comprising an ITO film and having a cross-like shaped Ag grid of 0.3 mm in width. Each portion provided with the electrode of 3 mm in diameter was designed such that it could serve as an independent sub-cell (which can be separately dedicated for the measurement of I–V characteristics).

Comparative Experiment 23

The procedures of Experiment 9 were repeated, except that the raw material alloy 5408 was replaced by a raw material alloy composed of 99.80 atomic % of silicon (Si) and 0.20 atomic % of chromium (Cr), to thereby obtain a solar cell.

Comparative Experiment 24

The procedures of Experiment 9 were repeated, except that the raw material alloy 5408 was replaced by a raw material alloy composed of 99.80 atomic % of silicon (Si and 0.20 atomic % of iron (Fe), to thereby obtain a solar cell.

Comparative Experiment 25

The procedures of Experiment 9 were repeated, except that the raw material alloy 5408 was replaced by a raw material alloy composed of 99.65 atomic % of silicon (Si) and 0.35 atomic % of magnesium (Mg), to thereby obtain a solar cell.

Comparative Experiment 26

The procedures of Experiment 9 were repeated, except that the raw material alloy 5408 was replaced by a raw material alloy composed of 99.65 atomic % of silicon (Si and 0.35 atomic % of sodium (Na), to thereby obtain a solar cell.

Comparative Experiment 27

The procedures of Experiment 9 were repeated, except that the raw material alloy 5408 was replaced by a raw material alloy composed of 99.80 atomic % of silicon (Si) and 0.20 atomic % of nickel (Ni), to thereby obtain a solar cell.

Evaluation

As for each of the solar cells obtained in Experiment 9 and Comparative Experiments 23 to 27, a part of which was cut to obtain a measuring sample. Each measuring sample was subjected to analysis by the SIMS as well as in the foregoing case of the electrophotographic light receiving member to examine the content of each metal atoms. The results obtained are collectively shown in Table 18.

Then, as for each of the solar cells obtained in Experiment 9 and Comparative Experiments 23 to 27, each sub-cell was subjected to measurement of the I–V characteristics under a solar cell simulator. Based on the measured results, there were obtained a survival rate (the proportion of the number of non-shortcircuited sub-cells among the 50 sub-cells) and an external quantum efficiency (the ratio to a mean value between the maximum value and the minimum value for the survived sub-cells with respect to external quantum efficiency). Successively, as for each of the survived sub-cells, semiconductor laser of 785 nm in luminous wavelength and 10 mW in output power was continuously irradiated for 78 hours, the efficiency was examined, and based on the examined results, there was obtained a mean efficiency retention rate (the change of rate between the initial efficiency and the efficiency after having subjected to the semiconductor laser irradiation was expressed by a percentage value). The results obtained are collectively shown in Table 18.

From the results obtained in the above, it was found that the solar cell obtained in Experiment 9 is surpassing any of the solar cells obtained in Comparative Experiments 23 to 27 in terms of the solar cell characteristic.

Experiment 10 and Comparative Experiments 28 to 32

Experiment 10

In accordance with the foregoing film-forming manner using the apparatus shown in FIG. 6 and under the conditions shown in Table 19, there were prepared a plurality of electrophotographic light receiving members each having a two-layered light receiving layer, wherein as the substrate, there was used a cylindrical aluminum substrate of 108 mm in outer diameter and having a mirror ground surface in every case.

In addition, the above film-forming procedures under the conditions for the formation of the second layer shown in Table 19 were repeated, except that the layer thickness was changed to 5 μm and a quartz plate was used as the substrate, to thereby obtain a test sample.

Comparative Experiment 28

The procedures of Experiment 10 were repeated, except that a raw material alloy composed of 99.80 atomic % of silicon (Si) and 0.20 atomic % of chromium (Cr) was used as the raw material alloy 1091, to there by obtain a plurality of electrophotographic light receiving members and a test sample.

Comparative Experiment 29

The procedures of Experiment 10 were repeated, except that a raw material alloy composed of 99.80 atomic % of silicon (Si) and 0.20 atomic % of iron (Fe) was used as the raw material alloy 1091, to there by obtain a plurality of electrophotographic light receiving members and a test sample.

Comparative Experiment 30

The procedures of Experiment 10 were repeated, except that a raw material alloy composed of 99.65 atomic % of silicon (Si) and 0.35 atomic % of magnesium (Mg) was used as the raw material alloy 1091, to there by obtain a plurality of electrophotographic light receiving members and a test sample.

Comparative Experiment 31

The procedures of Experiment 10 were repeated, except that a raw material alloy composed of 99.65 atomic % of silicon (Si) and 0.35 atomic % of sodium (Na) was used as the raw material alloy 1091, to there by obtain a plurality of electrophotographic light receiving members and a test sample.

Comparative Experiment 32

The procedures of Experiment 10 were repeated, except that a raw material alloy composed of 99.80 atomic % of silicon (Si) and 0.20 atomic % of nickel (Ni) was used as the raw material alloy 1091, to there by obtain a plurality of electrophotographic light receiving members and a test sample.

Evaluation

As for each of the electrophotographic light receiving members obtained in Experiment 10 and Comparative Experiments 28 to 32, the content of each metal atoms contained in the second layer was examined by subjecting the light receiving layer to analysis using the SIMS. The results obtained are collectively shown in Table 20.

Each of the electrophotographic light receiving members obtained in Experiment 10 and Comparative Experiments 28 to 32 was evaluated with respect to resistance to light-induced fatigue in the following manner. That is, as for each electrophotographic light receiving member, semiconductor laser of 785 nm in luminous wavelength and 10 mW in output power was continuously irradiated to its central region of about 3 cm in diameter for 24 hours while rotating the electrophotographic light receiving member.

Then, the electrophotographic light receiving member was set to a modification of the electrophotographic copying machine NP-9330 produced by CANON Kabushiki Kaisha for experimental purposes, and it was evaluated with respect to its electrophotographic characteristics. That is, using a A3-sized test chart having, in the lengthwise direction, a solid black area of 1.1 in reflection density extending from one end side to the 4 cm distant position from the end side, a solid white area of 0.08 in reflection density extending from the 4 cm distant position to the 8 cm distant position respectively from the end side, and the remaining halftone area of 0.3 in reflection density, reproduction was conducted on a A3-sized white paper under conditions of providing a reproduced image with a standard image density. As for the reproduced image obtained, there was examined a difference between the image reproduced at the central region irradiated with the semiconductor laser of the electrophotographic light receiving member and the image reproduced at the remaining region of the electrophotographic light receiving member in terms of density. That is, as for the reproduced image obtained, the ratio between the reflection density of the area extending from the 4 cm distant position to the 8 cm distant position respectively from the end position of the paper (corresponding to the solid black area of the test chart) and the reflection density of the area extending from the 4 cm distant position from the end position to the end position (corresponding to the solid white area of the test chart) was examined by means of a conventional reflection densitometer. The examined results are collectively shown in Table 20.

From the results shown in Table 20, it was found that the electrophotographic light receiving member obtained in Experiment 10 is the smallest in terms of the reflection density ratio and slight in terms of ghost appearance and thus, it is superior in view of electrophotographic characteristics.

Further, as for each electrophotographic light receiving member, a rubber roller of 40 mm in diameter was contacted thereto, and a sine wave voltage of 700 V was applied for an hour while rotating the electrophotographic light receiving member and the rubber roller. Then, the electrophotographic light receiving member was set to the foregoing electrophotographic copying machine, wherein it was subjected to image reproduction, using a solid black test chart. The image obtained was evaluated in comparison with the image obtained using the electrophotographic light receiving member before having applied the above voltage in terms of the ratio of white dots appeared. The evaluated results obtained are collectively shown in Table 20, wherein the dot appearance ratio of the electrophotographic light receiving member obtained in Experiment 10 is set at 1.

From the results shown in Table 20, it was found that the electrophotographic light receiving member obtained in Experiment 10 is the smallest in terms of the dot appearance ratio and thus, it is superior in view of electrophotographic characteristics.

Further in addition, as for each electrophotographic light receiving member, evaluation was conducted with respect to charge mobility in accordance with the time-of-flight method. The evaluated results obtained are collectively shown in Table 20, wherein the charge mobility of the electrophotographic light receiving member obtained in Experiment 10 is set at 1.

From the results shown in Table 20, it was found that the electrophotographic light receiving member obtained in Experiment 10 is the fastest in terms of charge mobility and thus, it is superior in view of electrophotographic characteristics.

Further more, using each of the test samples obtained in Experiment 10 and Comparative Experiments 28 to 32, the corresponding electrophotographic light receiving member was evaluated with respect to total spin density by the ESR. The evaluated results obtained are collectively shown in Table 20, wherein the values shown are values relative to the total spin density of the electrophotographic light receiving member obtained in Experiment 10 which is set at 1. From the results shown in Table 20, it was found that the electrophotographic light receiving member obtained in Experiment 10 is the smallest in terms of the total spin density and thus, it is superior in view of electrophotographic characteristics.

As apparent from the above results, it was found that the electrophotographic light receiving member obtained in Experiment 10 is surpassing other electrophotographic light receiving members obtained in Comparative Experiments 28 to 32.

Experiment 11 and Comparative Experiment 33

Experiment 11

The procedures of Experiment 10 were repeated, except that the composition ratio of the silicon (Si), chromium (Cr), iron (Fe), magnesium (Mg), sodium (Na), and nickel (Ni) by which the raw material alloy 1091 is constituted was changed to two different composition ratios shown in Table 21, to thereby obtain a plurality of electrophotographic light receiving members each having a two-layered light receiving layer as for each raw material alloy, and a test sample as for each raw material alloy.

Comparative Experiment 33

The procedures of Experiment 10 were repeated, except that the composition ratio of the silicon (Si), chromium (Cr), iron (Fe), magnesium (Mg), sodium (Na), and nickel (Ni) by which the raw material alloy 1091 is constituted was changed to two different composition ratios shown in Table 21, to thereby obtain a plurality of electrophotographic light receiving members as for each raw material alloy, and a test sample as for each raw material alloy.

Evaluation

As for each of the electrophotographic light receiving members obtained in Experiment 11 and Comparative Experiment 33, the content of each metal atoms contained in the second layer was examined by subjecting the light receiving layer to analysis using the SIMS as well as in Experiment 10. The results obtained are collectively shown in Table 22.

As for each of the electrophotographic light receiving members and the test samples obtained in Experiment 11 and Comparative Experiment 33, evaluation was conducted in the same manner as in Experiment 10. The evaluated results obtained are collectively shown in Table 22.

From the results shown in Table 22, it was found that any of the light receiving members having a two layered light receiving layer containing the five kinds of metal atoms respectively in an amount of less than 0.9 atomic ppm is superior in terms of the electrophotographic characteristics required for an electrophotographic light receiving member.

Experiment 12

In accordance with the foregoing film-forming manner using the apparatus shown in FIG. 8 and under the conditions shown in Table 23, there were prepared a plurality of electrophotographic light receiving members each having a two-layered light receiving layer and a test sample. As the substrate for each electrophotographic light receiving member, there was used a cylindrical aluminum substrate of 108 mm in outer diameter.

As for one of the electrophotographic light receiving members obtained, the content of each metal atoms contained in the second layer was examined by subjecting the light receiving layer to analysis using the SIMS. The result obtained is shown in Table 24.

As for the remaining electrophotographic light receiving members and the test sample, evaluation was conducted in the same manner as in Experiment 10. The evaluated results obtained are collectively shown in Table 24.

From the results shown in Table 24, it was found that the light receiving member obtained in this experiment excels in electrophotographic characteristics as well as the electrophotographic light receiving member obtained in Experiment 10.

Experiment 13 and Comparative Experiments 34 to 38

Experiment 13

Firstly, there was provided, as the substrate, an aluminum plate of 1 mm in thickness and 4 cm×4 cm in size and having a polished surface of 0.5 s. This aluminum plate was subjected to ultrasonic cleaning using 1,1,1-trichloroethane for 10 minutes. Using the aluminum plate as the substrate, there was prepared a pin junction type solar cell in accordance with the foregoing solar cell-preparing manner using the apparatus shown in FIG. 5 under the conditions shown in Table 25, wherein the film formation was conducted successively in the chamber N, in the chamber $I_1$ and in the chamber P. The solar cell was made to have 50 translucent light incident side electrodes of 3 mm in diameter each comprising an ITO film and having a cross-like like shaped Ag grid of 0.3 mm in width. Each portion provided with the electrode of 3 mm in diameter was designed such that it could serve as an independent sub-cell (which can be separately dedicated for the measurement of I–V characteristics).

Comparative Experiment 34

The procedures of Experiment 13 were repeated, except that the raw material alloy 5408 was replaced by a raw material alloy composed of 99.80 atomic % of silicon (Si) and 0.20 atomic % of chromium (Cr), to thereby obtain a solar cell.

Comparative Experiment 35

The procedures of Experiment 13 were repeated, except that the raw material alloy 5408 was replaced by a raw material alloy composed of 99.80 atomic % of silicon (Si) and 0.20 atomic % of iron (Fe), to thereby obtain a solar cell.

Comparative Experiment 36

The procedures of Experiment 13 were repeated, except that the raw material alloy 5408 was replaced by a raw material alloy composed of 99.65 atomic % of silicon (Si) and 0.35 atomic % of magnesium (MW), to thereby obtain a solar cell.

Comparative Experiment 37

The procedures of Experiment 13 were repeated, except that the raw material alloy 5408 was replaced by a raw material alloy composed of 99.65 atomic % of silicon (Si) and 0.35 atomic % of sodium (Na), to thereby obtain a solar cell.

Comparative Experiment 38

The procedures of Experiment 13 were repeated, except that the raw material alloy 5408 was replaced by a raw material alloy composed of 99.80 atomic % of silicon (Si) and 0.20 atomic % of nickel (Ni), to thereby obtain a solar cell.

Evaluation

As for each of the solar cells obtained in Experiment 13 and Comparative Experiments 34 to 38, a part of which was cut to obtain a measuring sample. Each measuring sample was subjected to analysis by the SIMS as well as in the foregoing case of the electrophotographic light receiving member to examine the content of each metal atoms. The results obtained are collectively shown in Table 26.

Then, as for each of the solar cells obtained in Experiment 13 and Comparative Experiments 34 to 38, each sub-cell was subjected to measurement of the I–V characteristics under a solar cell simulator. Based on the measured results, there were obtained a survival rate (the proportion of the number of non-shortcircuited sub-cells among the 50 sub-cells) and an external quantum efficiency (the ratio to a mean value between the maximum value and the minimum value for the survived sub-cells with respect to external quantum efficiency). Successively, as for each of the survived sub-cells, semiconductor laser of 785 nm in luminous wavelength and 10 mW in output power was continuously irradiated for 78 hours, the efficiency was examined, and based on the examined results, there was obtained a mean efficiency retention rate (the change of rate between the initial efficiency and the efficiency after having subjected to the semiconductor laser irradiation was expressed by a percentage value). The results obtained are collectively shown in Table 26.

From the results shown in Table 26, it was found that the solar cell obtained in Experiment 13 is surpassing any of the solar cells obtained in Comparative Experiments 34 to 38 in terms of the solar cell characteristic.

Experiment 14 and Comparative Experiments 39 to 43

Experiment 14

In accordance with the foregoing film-forming manner using the apparatus shown in FIG. 6 and under the conditions shown in Table 27, there were prepared a plurality of electrophotographic light receiving members each having a two-layered light receiving layer, wherein as the substrate, there was used a cylindrical aluminum substrate of 80 mm in outer diameter and having an uneven surface shape provided with irregularities composed of a plurality of spherical dimples which had been formed in accordance with the manner described in Japanese Unexamined Patent Publication No. 231561/1986 in every case.

In addition, the above film-forming procedures under the conditions for the formation of the second layer shown in Table 27 were repeated, except that the layer thickness was changed to 5 um and a quartz plate was used as the substrate, to thereby obtain a test sample.

Comparative Experiment 39

The procedures of Experiment 14 were repeated, except that a raw material alloy composed of 99.80 atomic % of silicon (Si) and 0.20 atomic % of chromium (Cr) was used as the raw material alloy 1091, to thereby obtain a plurality of electrophotographic light receiving members and a test sample.

Comparative Experiment 40

The procedures of Experiment 14 were repeated, except that a raw material alloy composed of 99.80 atomic % of silicon (Si) and 0.20 atomic % of iron (Fe) was used as the raw material alloy 1091, to thereby obtain a plurality of electrophotographic light receiving members and a test sample.

Comparative Experiment 41

The procedures of Experiment 14 were repeated, except that a raw material alloy composed of 99.65 atomic % of silicon (Si) and 0.35 atomic % of magnesium (Mg) was used as the raw material alloy 1091, to thereby obtain a plurality of electrophotographic light receiving members and a test sample.

Comparative Experiment 42

The procedures of Experiment 14 were repeated, except that a raw material alloy composed of 99.65 atomic % of silicon (Si) and 0.35 atomic % of sodium (Na) was used as the raw material alloy 1091, to thereby obtain a plurality of electrophotographic light receiving members and a test sample.

Comparative Experiment 43

The procedures of Experiment 14 were repeated, except that a raw material alloy composed of 99.80 atomic % of silicon (Si) and 0.20 atomic % of nickel (Ni) was used as the raw material alloy 1091, to thereby obtain a plurality of electrophotographic light receiving members and a test sample.

Evaluation

As for each of the electrophotographic light receiving members obtained in Experiment 14 and Comparative Experiments 39 to 43, the content of each metal atoms contained in the second layer was examined by subjecting the light receiving layer to analysis using the SIMS. The results obtained are collectively shown in Table 28.

Each of the electrophotographic light receiving members obtained in Experiment 14 and Comparative Experiments 39 to 43 was evaluated with respect to resistance to light-induced fatigue in the following manner. That is, as for each electrophotographic light receiving member, semiconductor laser of 785 nm in luminous wavelength and 10 mW in output power was continuously irradiated to its central region of about 3 cm in diameter for 24 hours while rotating the electrophotographic light receiving member.

Then, the electrophotographic light receiving member was set to a modification of the electrophotographic copying machine NP-9330 produced by CANON Kabushiki Kaisha for experimental purposes, and it was evaluated in the same manner as in Experiment 1. The evaluated results obtained are collectively shown in Table 28.

From the results shown in Table 28, it was found that the electrophotographic light receiving member obtained in Experiment 14 is the smallest in terms of the reflection density ratio and slight in terms of ghost appearance and thus, it is superior in view of electrophotographic characteristics.

Further, as for each electrophotographic light receiving member, a rubber roller of 40 mm in diameter was contacted thereto, and a sine wave voltage of 700 V was applied for an hour while rotating the electrophotographic light receiving member and the rubber roller. Then, the electrophotographic light receiving member was set to the foregoing electrophotographic copying machine, wherein it was subjected to image reproduction, using a solid black test chart. The image obtained was evaluated in comparison with the image obtained using the electrophotographic light receiving member before having applied the above voltage in terms of the ratio of white dots appeared. The evaluated results obtained are collectively shown in Table 28.

From the results shown in Table 28, it was found that the electrophotographic light receiving member obtained in Experiment 14 is the smallest in terms of the dot appearance ratio and thus, it is superior in view of electrophotographic characteristics.

Further in addition, as for each electrophotographic light receiving member evaluation was conducted with respect to charge mobility in accordance with the time-of-flight method. The evaluated results obtained are collectively shown in Table 28, wherein the charge mobility of the electrophotographic light receiving member obtained in Experiment 14 is set at 1.

From the results shown in Table 28, it was found that the electrophotographic light receiving member obtained in Experiment 14 is the fastest in terms of charge mobility and thus, it is superior in view of electrophotographic characteristics.

Further more, using each of the test samples obtained in Experiment 14 and Comparative Experiments 39 to 43, the corresponding electrophotographic light receiving member was evaluated with respect to total spin density by the ESR. The evaluated results obtained are collectively shown in Table 28, wherein the values shown are values relative to the total spin density of the electrophotographic light receiving member obtained in Experiment 14 which is set at 1. From the results shown in Table 28, it was found that the electrophotographic light receiving member obtained in Experiment 14 is the smallest in terms of the total spin density and thus, it is superior in view of electrophotographic characteristics.

As apparent from the above results, it was found that the electrophotographic light receiving member obtained in Experiment 14 is surpassing other electrophotographic light receiving members obtained in Comparative Experiments 39 to 43.

Experiment 15 and Comparative Experiment 44

Experiment 15

The procedures of Experiment 14 were repeated, except that the composition ratio of the silicon (Si), chromium (Cr), iron (Fe), magnesium (Mg), sodium (Na), and nickel (Ni) by which the raw material alloy 1091 is constituted was changed to two different composition ratios shown in Table 29, to thereby obtain a plurality of electrophotographic light receiving members each having a two-layered light receiving layer as for each raw material alloy, and a test sample as for each raw material alloy.

Comparative Experiment 44

The procedures of Experiment 14 were repeated, except that the composition ratio of the silicon (Si), chromium (Cr), iron (Fe), magnesium (Mg), sodium (Na), and nickel (Ni) by which the raw material alloy 1091 is constituted was changed to two different composition ratios shown in Table 29, to thereby obtain a plurality of electrophotographic light receiving members each having a two-layered light receiving layer as for each raw material alloy, and a test sample as for each raw material alloy.

Evaluation

As for each of the electrophotographic light receiving members obtained in Experiment 15 and Comparative Experiment 44, the content of each metal atoms contained in the second layer was examined by subjecting the light receiving layer to analysis using the SIMS. The results obtained are collectively shown in Table 30.

As for each of the electrophotographic light receiving members and the test samples obtained in Experiment 15 and Comparative Experiment 44, evaluation was conducted in the same manner as in Experiment 14. The evaluated results obtained are collectively shown in Table 30.

From the results shown in Table 30, it was found that any of the light receiving members having a two-layered light receiving layer containing the five kinds of metal atoms respectively in an amount of less than 0.9 atomic ppm is superior in terms of the electrophotographic characteristics required for an electrophotographic light receiving member.

Experiment 16 and Comparative Experiments 45 to 49

Experiment 16

Firstly, there was provided, as the substrate, an aluminum plate of 1 mm in thickness and 4 cm×4 cm in size and having a polished surface of 0.5 s. This aluminum plate was subjected to ultrasonic cleaning using 1,1,1-trichloroethane for 10 minutes. Using the aluminum plate as the substrate, there was prepared a pin junction solar cell in accordance with the foregoing solar cell-preparing manner using the apparatus shown in FIG. 5 under the conditions shown in Table 31, wherein the film formation was conducted successively in the chamber N, in the chamber $I_1$, in the chamber $I_2$, and in the chamber P. The solar cell was made to have 50 translucent light incident side electrodes of 3 mm in diameter each comprising an Au film and having a cross-like shaped Ag grid of 0.3 mm in width. Each portion provided with the electrode of 3 mm in diameter was designed such that it could serve as an independent sub-cell (which can be separately dedicated for the measurement of I–V characteristics).

Comparative Experiment 45

The procedures of Experiment 16 were repeated, except that the raw material alloy 5408 was replaced by a raw material alloy composed of 99.80 atomic % of silicon (Si) and 0.20 atomic % of chromium (Cr), to thereby obtain a solar cell.

Comparative Experiment 46

The procedures of Experiment 16 were repeated, except that the raw material alloy 5408 was replaced by a raw material alloy composed of 99.80 atomic % of silicon (Si) and 0.20 atomic % of iron (Fe), to thereby obtain a solar cell.

Comparative Experiment 47

The procedures of Experiment 16 were repeated, except that the raw material alloy 5408 was replaced by a raw material alloy composed of 99.65 atomic % of silicon (Si) and 0.35 atomic % of magnesium (Mg), to thereby obtain a solar cell.

Comparative Experiment 48

The procedures of Experiment 16 were repeated, except that the raw material alloy 5408 was replaced by a raw material alloy composed of 99.65 atomic % of silicon (Si) and 0.35 atomic % of sodium (Na), to thereby obtain a solar cell.

Comparative Experiment 49

The procedures of Experiment 16 were repeated, except that the raw material alloy 5408 was replaced by a raw material alloy composed of 99.80 atomic % of silicon (Si) and 0.20 atomic % of nickel (Ni), to thereby obtain a solar cell.

Evaluation

As for each of the solar cells obtained in Experiment 16 and Comparative Experiments 45 to 49, a part of which was cut to obtain a measuring sample. Each measuring sample was subjected to analysis by the SIMS to examine the content of each metal atoms. The results obtained are collectively shown in Table 32.

Then, as for each of the solar cells obtained in Experiment 16 and Comparative Experiments 45 to 49, each sub-cell was subjected to measurement of the I–V characteristics under a solar cell simulator. Based on the measured results, there were obtained a survival rate (the proportion of the number of non-shortcircuited sub-cells among the 50 sub-cells) and an external quantum efficiency (the ratio to a mean value between the maximum value and the minimum value for the survived sub-cells with respect to external quantum efficiency). Successively, as for each of the survived sub-cells, semiconductor laser of 785 nm in luminous wavelength and 10 mW in output power was irradiated for 78 hours, the efficiency was examined, and based on the examined results, there was obtained a mean efficiency retention rate (the change of rate between the initial efficiency and the efficiency after having subjected to the semiconductor laser irradiation was expressed by a percentage value). The results obtained are collectively shown in Table 32.

From the results obtained in the above, it was found that the solar cell obtained in Experiment 16 is surpassing any of the solar cells obtained in Comparative Experiments 45 to 49 in terms of the solar cell characteristic.

Experiment 17

The procedures of Experiment 1 were repeated, except that as the raw material alloy, five different raw material alloys in which only the content of the Cr is different from the raw material alloy used in Experiment 1, to thereby obtain a plurality of electrophotographic light receiving members and a test sample as for each raw material alloy. The content of the Cr in each of the five different raw material alloys was changed to a value of 0.07 atomic %, 0.22 atomic %, 0.2 atomic %, 0.3 atomic %, and 0.5 atomic % as shown in Sample Nos. 1 to 5 of Table 33.

As for each of the electrophotographic light receiving members and each of the test samples, evaluation was conducted in accordance with the evaluation manner described in Example 1. The results obtained are collectively shown in Table 33.

From the results shown in Table 33, it was found that any of the electrophotographic light receiving members having a light receiving layer of less than 0.9 ppm especially in terms of the Cr content is superior in terms of the electrophotographic characteristics required for an electrophotographic light receiving member.

Experiment 18

The procedures of Experiment 17 were repeated, except that as the raw material alloy, five different raw material alloys in which the content of the chromium is constant at a fixed value and only the content of the Na is different from each other, to thereby obtain a plurality of electrophotographic light receiving members and a test sample as for each raw material alloy. The content of the Na in each of the five different raw material alloys was changed to a value of 0.11 atomic %, 0.22 atomic %, 0.35 atomic %, 0.5 atomic %, and 0.8 atomic % as shown in Sample Nos. 1 to 5 of Table 34.

As for each of the electrophotographic light receiving members and each of the test samples, evaluation was conducted in accordance with the evaluation manner described in Example 1. The results obtained are collectively shown in Table 34.

From the results shown in Table 34, it was found that any of the electrophotographic light receiving members having a light receiving layer of less than 0.9 ppm especially in terms of the Na content is superior in terms of the electrophotographic characteristics required for an electrophotographic light receiving member.

The present invention will be further described in detail with reference to the following examples, which are only for illustrative purposes and not intended to restrict the scope of the invention to these examples only.

EXAMPLE 1

The procedures of Experiment 5 were repeated, except that the layer-forming conditions were changed to those shown in Table 35, to thereby obtain a plurality of electrophotographic light receiving members each having a two-layered light receiving layer.

The resultant electrophotographic light receiving members were evaluated in accordance with the evaluation manner described in Experiment 1. The results obtained were found to be satisfactory as well as the electrophotographic light receiving members obtained in Experiment 5.

EXAMPLE 2

The procedures of Experiment 5 were repeated, except that the layer-forming conditions were changed to those shown in Table 36, to thereby obtain a plurality of electrophotographic light receiving members each having a three-layered light receiving layer.

The resultant electrophotographic light receiving members were evaluated in accordance with the evaluation manner described in Experiment 1. The results obtained were found to be satisfactory as well as the electrophotographic light receiving members obtained in Experiment 5.

EXAMPLE 3

The procedures of Example 1 were repeated, except that no raw material alloy was used upon forming the second layer, to thereby obtain a plurality of electrophotographic light receiving members each having a two-layered light receiving layer.

The resultant electrophotographic light receiving members were evaluated in accordance with the evaluation manner described in Experiment 1. The results obtained were found to be satisfactory as well as the electrophotographic light receiving members obtained in Experiment 5.

EXAMPLE 4

The procedures of Example 1 were repeated, except that no raw material alloy was used upon forming the first layer, to thereby obtain a plurality of electrophotographic light receiving members each having a two-layered light receiving layer.

The resultant electrophotographic light receiving members were evaluated in accordance with the evaluation manner described in Experiment 1. The results obtained were found to be satisfactory as well as the electrophotographic light receiving members obtained in Experiment 5.

EXAMPLE 5

The procedures of Example 1 were repeated, except that no $B_2H_6/H_2$ gas was used upon forming the second layer, to thereby obtain a plurality of electrophotographic light receiving members each having a two-layered light receiving layer.

The resultant electrophotographic light receiving members were evaluated in accordance with the evaluation manner described in Experiment 1. The results obtained were found to be satisfactory as well as the electrophotographic light receiving members obtained in Experiment 5.

EXAMPLE 6

The procedures of Experiment 10 were repeated, except that the $B_2H_6/H_2$ gas was replaced by $PH_3/H_2$ gas (diluted to 2000 ppm) and its flow rate was made to be 10 sccm upon forming the first layer, to thereby obtain a plurality of electrophotographic light receiving members each having a two-layered light receiving layer.

The resultant electrophotographic light receiving members were evaluated in accordance with the evaluation manner described in Experiment 10. The results obtained were found to be satisfactory as well as the electrophotographic light receiving members obtained in Experiment 10.

EXAMPLE 7

The procedures of Experiment 10 were repeated, except that a third layer was formed on the second layer under the conditions shown in Table 37, to thereby obtain a plurality of electrophotographic light receiving members each having a three-layered light receiving layer.

The resultant electrophotographic light receiving members were evaluated in accordance with the evaluation manner described in Experiment 10. The results obtained were found to be satisfactory as well as the electrophotographic light receiving members obtained in Experiment 10.

EXAMPLE 8

The procedures of Experiment 14 were repeated, except that the $GeH_4$ gas was replaced by $SnH_4$ gas (purity: 99.99%), to thereby obtain a plurality of electrophotographic light receiving members each having a two-layered light receiving layer.

The resultant electrophotographic light receiving members were evaluated in accordance with the evaluation manner described in Experiment 14. The results obtained were found to be satisfactory as well as the electrophotographic light receiving members obtained in Experiment 14.

EXAMPLE 9

The procedures of Experiment 14 were repeated, except that the $B_2H_6/H_2$ gas was replaced by $PH_3/H_2$ gas (diluted to 2000 ppm) and its flow rate was made to be 10 sccm upon forming the first layer, to thereby obtain a plurality of electrophotographic light receiving members each having a two-layered light receiving layer.

The resultant electrophotographic light receiving members were evaluated in accordance with the evaluation manner described in Experiment 14. The results obtained were found to be satisfactory as well as the electrophotographic light receiving members obtained in Experiment 14.

EXAMPLE 10

The procedures of Experiment 14 were repeated, except that instead of the first layer, a two-layered first layer was formed under the conditions shown in Table 38, to thereby obtain a plurality of electrophotographic light receiving members.

The resultant electrophotographic light receiving members were evaluated in accordance with the evaluation manner described in Experiment 14. The results obtained were found to be satisfactory as well as the electrophotographic light receiving members obtained in Experiment 14.

EXAMPLE 11

The procedures of Experiment 14 were repeated, except that the first layer-forming conditions in Example 9 were employed and a third layer was formed on the second layer under the conditions shown in Table 39, to thereby obtain a plurality of electrophotographic light receiving members each having a three-layered light receiving layer.

The resultant electrophotographic light receiving members were evaluated in accordance with the evaluation manner described in Experiment 14. The results obtained were found to be satisfactory as well as the electrophotographic light receiving members obtained in Experiment 14.

EXAMPLE 12

In accordance with the foregoing film-forming manner using the apparatus shown in FIG. 8 and under the conditions shown in Table 40, there were prepared a plurality of electrophotographic light receiving members each having a multi-layered light receiving layer and a test sample having the same light receiving layer as in the above. As the substrate for each electrophotographic light receiving member, there was used a cylindrical aluminum substrate of 80 mm in outer diameter and having an uneven surface shape provided with irregularities composed of a plurality of spherical dimples which had been formed in accordance with the manner described in Japanese Unexamined Patent Publication No. 231561/1986.

As for the resultant electrophotographic light receiving member, the content of each metal atoms contained in the second layer of the light receiving layer was examined by the SIMS. The examined results obtained are shown in Table 41.

And as for the remaining electrophotographic light receiving members and the test sample, evaluation was conducted in accordance with the evaluation manner described in Experiment 14. The evaluated results obtained are collectively shown in Table 41. As apparent from the results shown in Table 41, it is understood that the electrophotographic light receiving members obtained in this example are satisfactory in terms of the electrophotographic characteristics as well as the electrophotographic light receiving members obtained in Experiment 14.

TABLE 1

| name of layer | gas used and its flow rate (sccm) | | raw material alloy used and its composition (atomic %) | | substrate temperature (°C.) | RF power (mW/cm³) | inner pressure (Torr) | layer thickness (μm) |
|---|---|---|---|---|---|---|---|---|
| electro- photographic light | $SiH_4$ | 300 | Si Cr Fe | 98.70 0.20 0.20 | 250 | 25 | 0.5 | 25 |

TABLE 1-continued

| name of layer | gas used and its flow rate (sccm) | | raw material alloy used and its composition (atomic %) | | substrate temperature (°C.) | RF power (mW/cm³) | inner pressure (Torr) | layer thickness (μm) |
|---|---|---|---|---|---|---|---|---|
| receiving layer | H₂ | 500 | Mg | 0.35 | | | | |
| | | | Na | 0.35 | | | | |
| | | | Ni | 0.20 | | | | |

TABLE 2

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 1 | 0.64 | 0.68 | 0.73 | 0.68 | 0.60 | 1.08 | 1.0 | 1.00 | 1.0 |
| Comparative Example 1 | 0.66 | | | | | 1.22 | 3.9 | 0.30 | 4.5 |
| Comparative Example 2 | | 0.68 | | | | 1.17 | 2.6 | 0.35 | 3.9 |
| Comparative Example 3 | | | 0.71 | | | 1.20 | 3.5 | 0.23 | 3.3 |
| Comparative Example 4 | | | | 0.68 | | 1.18 | 3.1 | 0.26 | 2.9 |
| Comparative Example 5 | | | | | 0.61 | 1.20 | 4.2 | 0.22 | 4.7 |

TABLE 3

| | composition of raw material alloys (atomic %) | | | | | |
|---|---|---|---|---|---|---|
| | Si | Cr | Fe | Mg | Na | Ni |
| Example 2-1 | 99.86 | 0.02 | 0.02 | 0.04 | 0.04 | 0.02 |
| Example 2-2 | 98.45 | 0.25 | 0.25 | 0.40 | 0.40 | 0.25 |
| Comparative Example 6-1 | 97.85 | 0.35 | 0.35 | 0.55 | 0.55 | 0.35 |
| Comparative Example 6-2 | 96.90 | 0.50 | 0.50 | 0.80 | 0.80 | 0.50 |

TABLE 4

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 2-1 | 0.05 | 0.07 | 0.08 | 0.07 | 0.06 | 1.09 | 1.2 | 0.95 | 1.0 |
| Example 2-1 | 0.82 | 0.85 | 0.86 | 0.83 | 0.77 | 1.12 | 1.5 | 0.72 | 1.6 |
| Comparative Example 6-1 | 1.21 | 1.28 | 1.24 | 1.22 | 1.18 | 1.21 | 2.5 | 0.43 | 2.4 |
| Comparative Example 6-2 | 1.58 | 1.81 | 1.79 | 1.64 | 1.52 | 1.25 | 3.4 | 0.26 | 3.5 |

TABLE 5

| name of layer | gas used and its flow rate (sccm) | | raw material alloy used and its composition (atomic %) | | substrate temperature (°C.) | μW power (mW/cm³) | inner pressure (Torr) | layer thickness (μm) |
|---|---|---|---|---|---|---|---|---|
| electro-photographic light receiving layer | SiH₄ | 500 | Si | 99.30 | 300 | 0.5 | 1 | 25 |
| | | | Cr | 0.10 | | | | |
| | | | Fe | 0.10 | | | | |
| | SiF₄ | 20 | Mg | 0.20 | | | | |
| | | | Na | 0.20 | | | | |
| | | | Ni | 0.10 | | | | |

TABLE 6

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 3 | 0.65 | 0.71 | 0.75 | 0.68 | 0.61 | 1.09 | 1.1 | 0.90 | 1.2 |

TABLE 7

| chamber | gas used and its flow rate (sccm) | | raw material alloy used and its composition (atomic %) | | substrate temperature (°C.) | RF power (W) | inner pressure (Torr) | layer thickness (μm) |
|---|---|---|---|---|---|---|---|---|
| I₁ | | | Si | 98.70 | | | | |
| | SiH₄ | 10 | Cr | 0.20 | | | | |
| | | | Fe | 0.20 | 260 | 20 | 0.1 | 0.4 |
| | H₂ | 50 | Mg | 0.35 | | | | |
| | | | Na | 0.35 | | | | |
| | | | Ni | 0.20 | | | | |
| | | | | | | 40 | | |

TABLE 8

| | content (atomic ppm) | | | | | survival rate (%) | change of rate in external quantum efficiency (%) | efficiency retention rate (%) |
|---|---|---|---|---|---|---|---|---|
| | Cr | Fe | Mg | Na | Ni | | | |
| Example 4 | 0.72 | 0.69 | 0.71 | 0.70 | 0.61 | 78 | 81 | 94 |
| Comparative Example 7 | 0.67 | | | | | 60 | 123 | 86 |
| Comparative Example 8 | | 0.69 | | | | 56 | 97 | 79 |
| Comparative Example 9 | | | 0.69 | | | 62 | 145 | 93 |
| Comparative Example 10 | | | | 0.72 | | 54 | 133 | 86 |
| Comparative Example 11 | | | | | 0.60 | 58 | 99 | 89 |

TABLE 9

| name of layer | gas used and its flow rate (sccm) | | raw material alloy used and its composition (atomic %) | | substrate temperature (°C.) | RF power (mW/cm³) | inner pressure (Torr) | layer thickness (μm) |
|---|---|---|---|---|---|---|---|---|
| electro-photographic light receiving layer | SiH₄<br>H₂<br>B₂H₆/H₂<br>(10 ppm diluted) | 300<br>500<br>15 | Si<br>Cr<br>Fe<br>Mg<br>Na<br>Ni | 98.70<br>0.20<br>0.20<br>0.35<br>0.35<br>0.20 | 250 | 25 | 0.5 | 25 |

TABLE 10

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 5 | 0.65 | 0.67 | 0.74 | 0.69 | 0.59 | 1.07 | 1.0 | 1.00 | 1.0 |
| Comparative Example 12 | 0.66 | | | | | 1.24 | 3.9 | 0.25 | 4.6 |
| Comparative Example 13 | | 0.68 | | | | 1.17 | 3.0 | 0.35 | 3.8 |
| Comparative Example 14 | | | 0.72 | | | 1.20 | 3.3 | 0.25 | 3.4 |
| Comparative Example 15 | | | | 0.68 | | 1.18 | 3.5 | 0.31 | 2.8 |
| Comparative Example 16 | | | | | 0.61 | 1.19 | 4.1 | 0.26 | 4.3 |

TABLE 11

| | composition of raw material alloys (atomic %) | | | | | |
|---|---|---|---|---|---|---|
| | Si | Cr | Fe | Mg | Na | Ni |
| Example 6-1 | 99.86 | 0.02 | 0.02 | 0.04 | 0.04 | 0.02 |
| Example 6-2 | 98.45 | 0.25 | 0.25 | 0.40 | 0.40 | 0.25 |
| Comparative Example 17-1 | 97.85 | 0.35 | 0.35 | 0.55 | 0.55 | 0.35 |
| Comparative Example 17-2 | 96.90 | 0.50 | 0.50 | 0.80 | 0.80 | 0.50 |

TABLE 12

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 6-1 | 0.06 | 0.07 | 0.07 | 0.08 | 0.05 | 1.09 | 1.1 | 0.93 | 1.1 |
| Example 6-1 | 0.81 | 0.86 | 0.88 | 0.82 | 0.76 | 1.10 | 1.4 | 0.74 | 1.5 |
| Comparative Example 17-1 | 1.22 | 1.25 | 1.26 | 1.21 | 1.19 | 1.23 | 2.5 | 0.39 | 2.5 |
| Comparative Example 17-2 | 1.60 | 1.79 | 1.85 | 1.65 | 1.54 | 1.26 | 3.5 | 0.26 | 3.4 |

TABLE 13

| name of layer | gas used and its flow rate (sccm) | | raw material alloy used and its composition (atomic %) | | substrate temperature (°C.) | μW power (mW/cm³) | inner pressure (Torr) | layer thickness (μm) |
|---|---|---|---|---|---|---|---|---|
| electro- photographic light receiving layer | SiH₄ SiF₄ B₂H₆/H₂ (100 ppm diluted) | 500 20 10 | Si Cr Fe Mg Na Ni | 99.70 0.10 0.10 0.20 0.20 0.10 | 300 | 0.5 | 1 | 30 |

TABLE 14

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 7 | 0.66 | 0.72 | 0.76 | 0.67 | 0.63 | 1.07 | 1.1 | 0.94 | 1.1 |

TABLE 15

| chamber | gas used and its flow rate (sccm) | | raw material alloy used and its composition (atomic %) | | substrate temperature (°C.) | RF power (W) | inner pressure (Torr) | layer thickness (μm) |
|---|---|---|---|---|---|---|---|---|
| I₂ | SiH₄ H₂ PH₃/H₂ (220 ppm) | 10 50 5 | Si Cr Fe Mg Na Ni | 98.70 0.20 0.20 0.35 0.35 0.20 | 260 | 20 | 0.1 | 0.4 |

40

TABLE 16

| | content (atomic ppm) | | | | | survival rate (%) | change of rate in external quantum efficiency (%) | efficiency retention rate (%) |
|---|---|---|---|---|---|---|---|---|
| | Cr | Fe | Mg | Na | Ni | | | |
| Example 8 | 0.71 | 0.75 | 0.77 | 0.81 | 0.60 | 68 | 99 | 90 |
| Comparative Example 18 | 0.69 | | | | | 58 | 151 | 85 |
| Comparative Example 19 | | 0.69 | | | | 54 | 109 | 79 |
| Comparative Example 20 | | | 0.71 | | | 62 | 154 | 91 |
| Comparative Example 21 | | | | 0.69 | | 52 | 163 | 84 |
| Comparative Example 22 | | | | | 0.55 | 58 | 102 | 85 |

TABLE 17

| chamber | gas used and its flow rate (sccm) | | raw material alloy used and its composition (atomic %) | | substrate temperature (°C.) | RF power (W) | inner pressure (Torr) | layer thickness (μm) |
|---|---|---|---|---|---|---|---|---|
| N | Ar | 38 | | | 270 | 20 | 0.1 | 0.01 |
| | SiH$_4$ | 0.2 | | | | | | |
| | H$_2$ | 0.4 | | | | | | |
| | PH$_3$ | 0.4 | | | | | | |
| I$_1$ | SiH$_4$ | 10 | Si | 98.70 | | | | |
| | H$_2$ | 40 | Cr | 0.20 | | | | |
| | BF$_3$/H$_2$ | 3 | Fe | 0.20 | 260 | 20 | 0.1 | 0.4 |
| | (150 ppm) | | Mg | 0.35 | | | | |
| | | | Na | 0.35 | | | | |
| | | | Ni | 0.20 | | | | |
| P | SiH$_4$ | 0.1 | | | | | | |
| | H$_2$ | 70 | | | 250 | 120 | 0.1 | 0.01 |
| | BF$_3$ | 0.05 | | | | | | |

TABLE 18

| | content (atomic ppm) | | | | | survival rate (%) | change of rate in external quantum efficiency (%) | efficiency retention rate (%) |
|---|---|---|---|---|---|---|---|---|
| | Cr | Fe | Mg | Na | Ni | | | |
| Example 9 | 0.85 | 0.74 | 0.67 | 0.76 | 0.64 | 88 | 84 | 95 |
| Comparative Example 23 | 0.74 | | | | | 74 | 121 | 89 |
| Comparative Example 24 | | 0.75 | | | | 66 | 101 | 79 |
| Comparative Example 25 | | | 0.54 | | | 72 | 113 | 93 |
| Comparative Example 26 | | | | 0.78 | | 74 | 145 | 91 |
| Comparative Example 27 | | | | | 0.61 | 76 | 97 | 89 |

TABLE 19

| name of layer | gas used and its flow rate (sccm) | | raw material alloy used and its composition (atomic %) | | substrate temperature (°C.) | RF power (mW/cm$^3$) | inner pressure (Torr) | layer thickness (μm) |
|---|---|---|---|---|---|---|---|---|
| first layer | SiH$_4$ | 500 | | | | | | |
| | H$_2$ | 500 | | | 250 | 10 | 0.4 | 3 |
| | B$_2$H$_6$/H$_2$ | 20 | | | | | | |
| | (3000 ppm diluted) | | | | | | | |
| second layer | | | Si | 98.70 | | | | |
| | SiH$_4$ | 300 | Cr | 0.20 | | | | |
| | | | Fe | 0.20 | 250 | 25 | 0.5 | 25 |
| | H$_2$ | 500 | Mg | 0.35 | | | | |
| | | | Na | 0.35 | | | | |
| | | | Ni | 0.20 | | | | |

TABLE 20

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 10 | 0.64 | 0.68 | 0.73 | 0.68 | 0.60 | 1.08 | 1.0 | 1.00 | 1.0 |
| Comparative Example 28 | 0.66 | | | | | 1.23 | 3.8 | 0.31 | 4.5 |
| Comparative Example 29 | | 0.68 | | | | 1.17 | 2.7 | 0.36 | 3.9 |
| Comparative Example 30 | | | 0.71 | | | 1.21 | 3.4 | 0.22 | 3.3 |
| Comparative Example 31 | | | | 0.68 | | 1.17 | 3.3 | 0.27 | 2.9 |
| Comparative Example 32 | | | | | 0.61 | 1.20 | 4.4 | 0.21 | 4.7 |

TABLE 21

| | composition of raw material alloys (atomic %) | | | | | |
|---|---|---|---|---|---|---|
| | Si | Cr | Fe | Mg | Na | Ni |
| Example 11-1 | 99.86 | 0.02 | 0.02 | 0.04 | 0.04 | 0.02 |
| Example 11-2 | 98.45 | 0.25 | 0.25 | 0.40 | 0.40 | 0.25 |
| Comparative Example 33-1 | 97.85 | 0.35 | 0.35 | 0.55 | 0.55 | 0.35 |
| Comparative Example 33-2 | 96.90 | 0.50 | 0.50 | 0.80 | 0.80 | 0.50 |

TABLE 22

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 11-1 | 0.05 | 0.07 | 0.08 | 0.07 | 0.06 | 1.10 | 1.1 | 0.96 | 1.0 |
| Example 11-2 | 0.82 | 0.85 | 0.86 | 0.83 | 0.77 | 1.12 | 1.5 | 0.73 | 1.6 |
| Comparative Example 33-1 | 1.21 | 1.28 | 1.24 | 1.22 | 1.18 | 1.22 | 2.4 | 0.42 | 2.4 |
| Comparative Example 33-2 | 1.58 | 1.81 | 1.79 | 1.64 | 1.52 | 1.27 | 3.5 | 0.27 | 3.5 |

TABLE 23

| name of layer | gas used and its flow rate (sccm) | | raw material alloy used and its composition (atomic %) | | substrate temperature (°C.) | μW power (mW/cm³) | inner pressure (Torr) | layer thickness (μm) |
|---|---|---|---|---|---|---|---|---|
| first layer | SiH₄ | 500 | | | | | | |
| | SiF₄ | 100 | | | 300 | 0.5 | 1.2 | 3 |
| | B₂H₆/H₂ (1% diluted) | 50 | | | | | | |
| second layer | | | Si | 99.70 | | | | |
| | SiH₄ | 500 | Gr | 0.10 | | | | |
| | | | Fe | 0.10 | 300 | 0.5 | 1 | 25 |
| | SiF₄ | 20 | Mg | 0.20 | | | | |
| | | | Na | 0.20 | | | | |
| | | | Ni | 0.10 | | | | |

TABLE 24

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 7 | 0.66 | 0.71 | 0.75 | 0.68 | 0.61 | 1.08 | 1.2 | 0.95 | 1.2 |

TABLE 25

| chamber | gas used and its flow rate (sccm) | | raw material alloy used and its composition (atomic %) | | substrate temperature (°C.) | RF power (W) | inner pressure (Torr) | layer thickness (μm) |
|---|---|---|---|---|---|---|---|---|
| N | Ar | 38 | | | | | | |
| | SiH$_4$ | 0.2 | | | 270 | 20 | 0.1 | 0.01 |
| | H$_2$ | 0.4 | | | | | | |
| | PH$_3$ | 0.4 | | | | | | |
| I$_1$ | | | Si | 98.70 | | | | |
| | SiH$_4$ | 10 | Cr | 0.20 | | | | |
| | | | Fe | 0.20 | 260 | 20 | 0.1 | 0.4 |
| | H$_2$ | 40 | Mg | 0.35 | | | | |
| | | | Na | 0.35 | | | | |
| | | | Ni | 0.20 | | | | |
| P | SiH$_4$ | 0.1 | | | | | | |
| | H$_2$ | 70 | | | 250 | 120 | 0.1 | 0.01 |
| | BF$_3$ | 0.05 | | | | | | |

TABLE 26

| | content (atomic ppm) | | | | | survival rate (%) | change of rate in external quantum efficiency (%) | efficiency retention rate (%) |
|---|---|---|---|---|---|---|---|---|
| | Cr | Fe | Mg | Na | Ni | | | |
| Example 13 | 0.69 | 0.68 | 0.78 | 0.73 | 0.85 | 86 | 71 | 96 |
| Comparative Example 34 | 0.74 | | | | | 72 | 113 | 88 |
| Comparative Example 35 | | 0.81 | | | | 66 | 90 | 81 |
| Comparative Example 36 | | | 0.71 | | | 68 | 124 | 94 |
| Comparative Example 37 | | | | 0.69 | | 68 | 112 | 91 |
| Comparative Example 38 | | | | | 0.79 | 62 | 91 | 92 |

TABLE 27

| name of layer | gas used and its flow rate (sccm) | | raw material alloy used and its composition (atomic %) | | substrate temperature (°C.) | RF power (mW/cm³) | inner pressure (Torr) | layer thickness (μm) |
|---|---|---|---|---|---|---|---|---|
| first layer | SiH₄ | 100 | | | 250 | 10 | 0.4 | 3 |
| | H₂ | 500 | | | | | | |
| | B₂H₆/H₂ (3000 ppm diluted) | 30 | | | | | | |
| | GeH₄ | 20 | | | | | | |
| second layer | | | Si | 98.70 | | | | |
| | SiH₄ | 300 | Cr | 0.20 | | | | |
| | | | Fe | 0.20 | 250 | 25 | 0.5 | 25 |
| | H₂ | 500 | Mg | 0.35 | | | | |
| | | | Na | 0.35 | | | | |
| | | | Ni | 0.20 | | | | |

TABLE 28

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 14 | 0.64 | 0.68 | 0.73 | 0.68 | 0.60 | 1.07 | 1.0 | 1.00 | 1.0 |
| Comparative Example 39 | 0.66 | | | | | 1.22 | 3.9 | 0.32 | 4.8 |
| Comparative Example 40 | | 0.68 | | | | 1.18 | 2.8 | 0.35 | 3.6 |
| Comparative Example 41 | | | 0.71 | | | 1.23 | 3.9 | 0.24 | 3.6 |
| Comparative Example 42 | | | | 0.68 | | 1.18 | 3.4 | 0.26 | 2.8 |
| Comparative Example 43 | | | | | 0.61 | 1.19 | 4.4 | 0.25 | 4.4 |

TABLE 29

| | composition of raw material alloys (atomic %) | | | | | |
|---|---|---|---|---|---|---|
| | Si | Cr | Fe | Mg | Na | Ni |
| Example 15-1 | 99.86 | 0.02 | 0.02 | 0.04 | 0.04 | 0.02 |
| Example 15-2 | 98.45 | 0.25 | 0.25 | 0.40 | 0.40 | 0.25 |
| Comparative Example 44-1 | 97.85 | 0.35 | 0.35 | 0.55 | 0.55 | 0.35 |
| Comparative Example 44-2 | 96.90 | 0.50 | 0.50 | 0.80 | 0.80 | 0.50 |

TABLE 30

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 15-1 | 0.05 | 0.07 | 0.08 | 0.07 | 0.06 | 1.09 | 1.1 | 0.94 | 1.0 |
| Example 15-2 | 0.82 | 0.85 | 0.86 | 0.83 | 0.77 | 1.11 | 1.5 | 0.75 | 1.4 |

TABLE 30-continued

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Comparative Example 44-1 | 1.21 | 1.28 | 1.24 | 1.22 | 1.18 | 1.23 | 2.5 | 0.39 | 2.6 |
| Comparative Example 44-2 | 1.58 | 1.81 | 1.79 | 1.64 | 1.52 | 1.27 | 3.4 | 0.28 | 3.7 |

TABLE 31

| chamber | gas used and its flow rate (sccm) | | raw material alloy used and its composition (atomic %) | | substrate temperature (°C.) | RF power (W) | inner pressure (Torr) | layer thickness (μm) |
|---|---|---|---|---|---|---|---|---|
| N | Ar | 38 | | | 270 | 20 | 0.1 | 0.01 |
| | SiH$_4$ | 0.2 | | | | | | |
| | H$_2$ | 0.4 | | | | | | |
| | PH$_3$ | 0.4 | | | | | | |
| I$_1$ | SiH$_4$ | 10 | | | 265 | 20 | 0.1 | 0.1 |
| | GeH$_4$ | 0.5 | | | | | | |
| | H$_2$ | 40 | | | | | | |
| I$_2$ | | | Si | 98.70 | | | | |
| | SiH$_4$ | 10 | Cr | 0.20 | | | | |
| | | | Fe | 0.20 | 260 | 20 | 0.1 | 0.4 |
| | H$_2$ | 40 | Mg | 0.35 | | | | |
| | | | Na | 0.35 | | | | |
| | | | Ni | 0.20 | | | | |
| P | SiH$_4$ | 0.1 | | | 250 | 120 | 0.1 | 0.01 |
| | H$_2$ | 70 | | | | | | |
| | BF$_3$ | 0.05 | | | | | | |

TABLE 32

| | content (atomic ppm) | | | | | survival rate (%) | change of rate in external quantum efficiency (%) | efficiency retention rate (%) |
|---|---|---|---|---|---|---|---|---|
| | Cr | Fe | Mg | Na | Ni | | | |
| Example 16 | 0.73 | 0.71 | 0.84 | 0.72 | 0.81 | 88 | 69 | 96 |
| Comparative Example 45 | 0.69 | | | | | 74 | 104 | 89 |
| Comparative Example 46 | | 0.74 | | | | 66 | 114 | 82 |
| Comparative Example 47 | | | 0.73 | | | 86 | 99 | 94 |
| Comparative Example 48 | | | | 0.68 | | 72 | 102 | 92 |
| Comparative Example 49 | | | | | 0.78 | 82 | 95 | 95 |

TABLE 33

| Sample No. | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| 1 | 0.1 | 0.68 | 0.73 | 0.68 | 0.60 | 1.03 | 0.99 | 0.98 | 0.99 |
| 2 | 0.3 | 0.68 | 0.73 | 0.68 | 0.60 | 1.06 | 0.98 | 0.99 | 0.98 |
| 3 | 0.64 | 0.68 | 0.73 | 0.68 | 0.60 | 1.08 | 1.0 | 1.00 | 1.0 |
| 4 | 0.90 | 0.68 | 0.73 | 0.68 | 0.60 | 1.01 | 1.01 | 0.99 | 1.01 |
| 5 | 1.0 | 0.68 | 0.73 | 0.68 | 0.60 | 1.15 | 2.3 | 0.39 | 2.5 |

TABLE 34

| Sample No. | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| 1 | 0.64 | 0.68 | 0.73 | 0.1 | 0.60 | 1.02 | 0.97 | 0.97 | 0.96 |
| 2 | 0.64 | 0.68 | 0.73 | 0.3 | 0.60 | 1.05 | 0.99 | 1.01 | 0.98 |
| 3 | 0.64 | 0.68 | 0.73 | 0.68 | 0.60 | 1.08 | 1.0 | 1.00 | 1.0 |
| 4 | 0.64 | 0.68 | 0.73 | 0.9 | 0.60 | 1.08 | 1.02 | 0.98 | 1.02 |
| 5 | 0.64 | 0.68 | 0.73 | 1.0 | 0.60 | 1.20 | 2.7 | 0.40 | 3.1 |

25

TABLE 35

| name of layer | gas used and its flow rate (sccm) | | raw material alloy used and its composition (atomic %) | | substrate temperature (°C.) | RF power (mW/cm³) | inner pressure (Torr) | layer thickness (μm) |
|---|---|---|---|---|---|---|---|---|
| first layer | | | Si | 98.70 | | | | |
| | SiH₄ | 150 | Cr | 0.20 | | | | |
| | H₂ | 500 | Fe | 0.20 | 250 | 10 | 0.4 | 3 |
| | B₂H₆/H₂ | 50 | Mg | 0.35 | | | | |
| | (3000 ppm diluted) | | Na | 0.35 | | | | |
| | | | Ni | 0.20 | | | | |
| second layer | | | Si | 98.70 | | | | |
| | SiH₄ | 300 | Cr | 0.20 | | | | |
| | H₂ | 500 | Fe | 0.20 | 250 | 25 | 0.5 | 25 |
| | B₂H₆/H₂ | 10 | Mg | 0.35 | | | | |
| | (10 ppm diluted) | | Na | 0.35 | | | | |
| | | | Ni | 0.20 | | | | |

TABLE 36

| name of layer | gas used and its flow rate (sccm) | | raw material alloy used and its composition (atomic %) | | substrate temperature (°C.) | RF power (mW/cm³) | inner pressure (Torr) | layer thickness (μm) |
|---|---|---|---|---|---|---|---|---|
| first layer | | | Si | 98.70 | | | | |
| | SiH₄ | 1000 | Cr | 0.20 | | | | |
| | H₂ | 500 | Fe | 0.20 | 250 | 10 | 0.4 | 3 |
| | PH₃/H₂ | 25 | Mg | 0.35 | | | | |
| | (2000 ppm diluted) | | Na | 0.35 | | | | |
| | | | Ni | 0.20 | | | | |
| second layer | | | Si | 98.70 | | | | |
| | SiH₄ | 300 | Cr | 0.20 | | | | |
| | H₂ | 500 | Fe | 0.20 | 250 | 25 | 0.5 | 25 |

TABLE 36-continued

| name of layer | gas used and its flow rate (sccm) | | raw material alloy used and its composition (atomic %) | | substrate temperature (°C.) | RF power (mW/cm³) | inner pressure (Torr) | layer thickness (μm) |
|---|---|---|---|---|---|---|---|---|
| | B₂H₆/H₂ (10 ppm diluted) | 5 | Mg<br>Na | 0.35<br>0.35 | | | | |
| third layer | SiH₄<br>H₂<br>B₂H₆/H₂ (3000 ppm diluted) | 300<br>500<br>10 | Ni<br>Si<br>Cr<br>Fe<br>Mg<br>Na<br>Ni | 0.20<br>98.70<br>0.20<br>0.20<br>0.35<br>0.35<br>0.20 | 250 | 10 | 0.4 | 0.2 |
| | SiH₄<br>H₂<br>PH₃/H₂ (2000 ppm diluted) | 100<br>500<br>3 | — | | 250 | 10 | 0.4 | 0.2 |

TABLE 37

| name of layer | gas used and its flow rate (sccm) | | raw material alloy used and its composition (atomic %) | substrate temperature (°C.) | RF power (mW/cm³) | inner pressure (Torr) | layer thickness (μm) |
|---|---|---|---|---|---|---|---|
| third layer | SiH₄<br>H₂<br>PH₃H₂ (2000 ppm diluted | 100<br>500<br>3 | — | 250 | 10 | 0.4 | 0.2 |

TABLE 38

| name of layer | gas used and its flow rate (sccm) | | raw material alloy used and its composition (atomic %) | substrate temperature (°C.) | RF power (mW/cm³) | inner pressure (Torr) | layer thickness (μm) |
|---|---|---|---|---|---|---|---|
| first layer | SiH₄<br>H₂<br>B₂H₆/H₂ (3000 ppm diluted)<br>GeH₄ | 100<br>500<br>40<br>50 | — | 250 | 10 | 0.4 | 1 |
| additional first layer | SiH₄<br>H₂<br>B₂H₆/H₂ (3000 ppm diluted) | 100<br>500<br>20 | — | 250 | 10 | 0.4 | 3 |

TABLE 39

| name of layer | gas used and its flow rate (sccm) | | raw material alloy used and its composition (atomic %) | substrate temperature (°C.) | RF power (mW/cm³) | inner pressure (Torr) | layer thickness (μm) |
|---|---|---|---|---|---|---|---|
| third layer | SiH$_4$ | 100 | — | 250 | 10 | 0.4 | 0.2 |
| | H$_2$ | 500 | | | | | |
| | PH$_3$/H$_2$ (2000 ppm diluted) | 3 | | | | | |

TABLE 40

| name of layer | gas used and its flow rate (sccm) | | raw material alloy used and its composition (atomic %) | | substrate temperature (°C.) | μW power (mW/cm³) | inner pressure (Torr) | layer thickness (μm) |
|---|---|---|---|---|---|---|---|---|
| first layer | SiH$_4$ | 500 | — | | 300 | 0.5 | 1.2 | 1 |
| | SiF$_4$ | 100 | | | | | | |
| | B$_2$H$_6$/H$_2$ (1% diluted) | 100 | | | | | | |
| addtional first layer | GeH$_4$ | 200 | — | | 300 | 0.5 | 1.2 | 3 |
| | SiH$_4$ | 500 | | | | | | |
| | SiF$_4$ | 100 | | | | | | |
| | B$_2$H$_6$/H$_2$ (1% diluted) | 50 | | | | | | |
| second layer | SiH$_4$ | 500 | Si | 99.70 | 300 | 0.5 | 1 | 25 |
| | | | Cr | 0.10 | | | | |
| | | | Fe | 0.10 | | | | |
| | SiF$_4$ | 20 | Mg | 0.20 | | | | |
| | | | Na | 0.20 | | | | |
| | | | Ni | 0.10 | | | | |

TABLE 41

| | content (atomic ppm) | | | | | reflection density ratio | dot appearance ratio | charge mobility | total spin density ratio |
|---|---|---|---|---|---|---|---|---|---|
| | Cr | Fe | Mg | Na | Ni | | | | |
| Example 12 | 0.65 | 0.71 | 0.75 | 0.68 | 0.61 | 1.09 | 1.1 | 0.93 | 1.1 |

Figure 1:
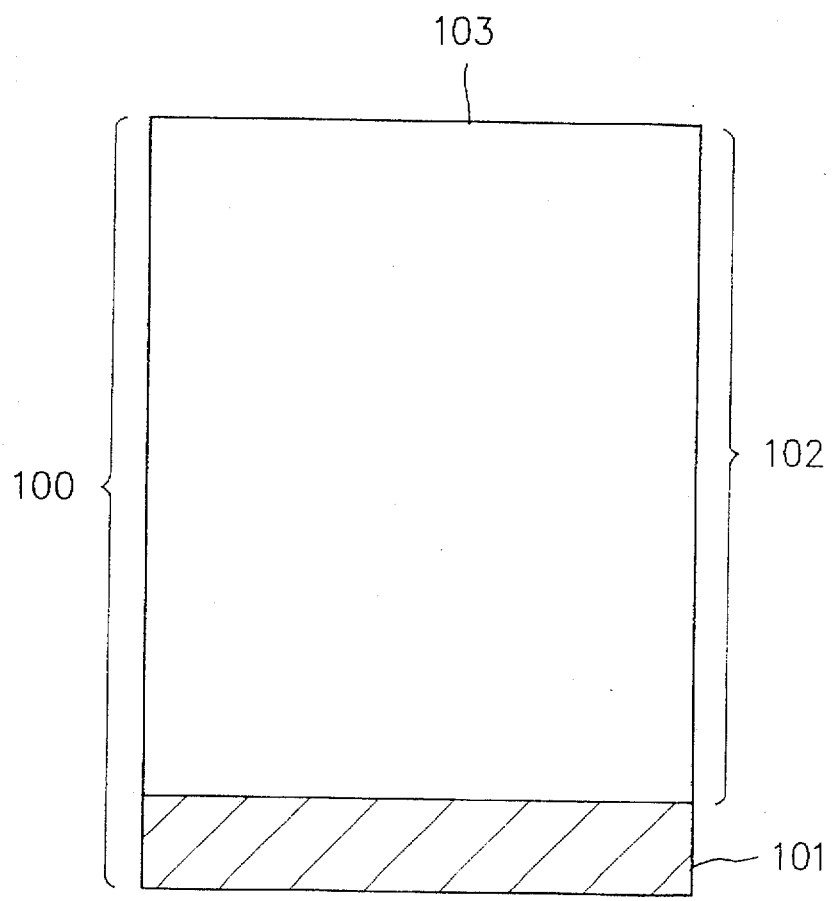
FIGS. 1 and 9 are schematic views respectively illustrating an example of the layer configuration of an electrophotographic light receiving member according to the present invention.
Figure 2:
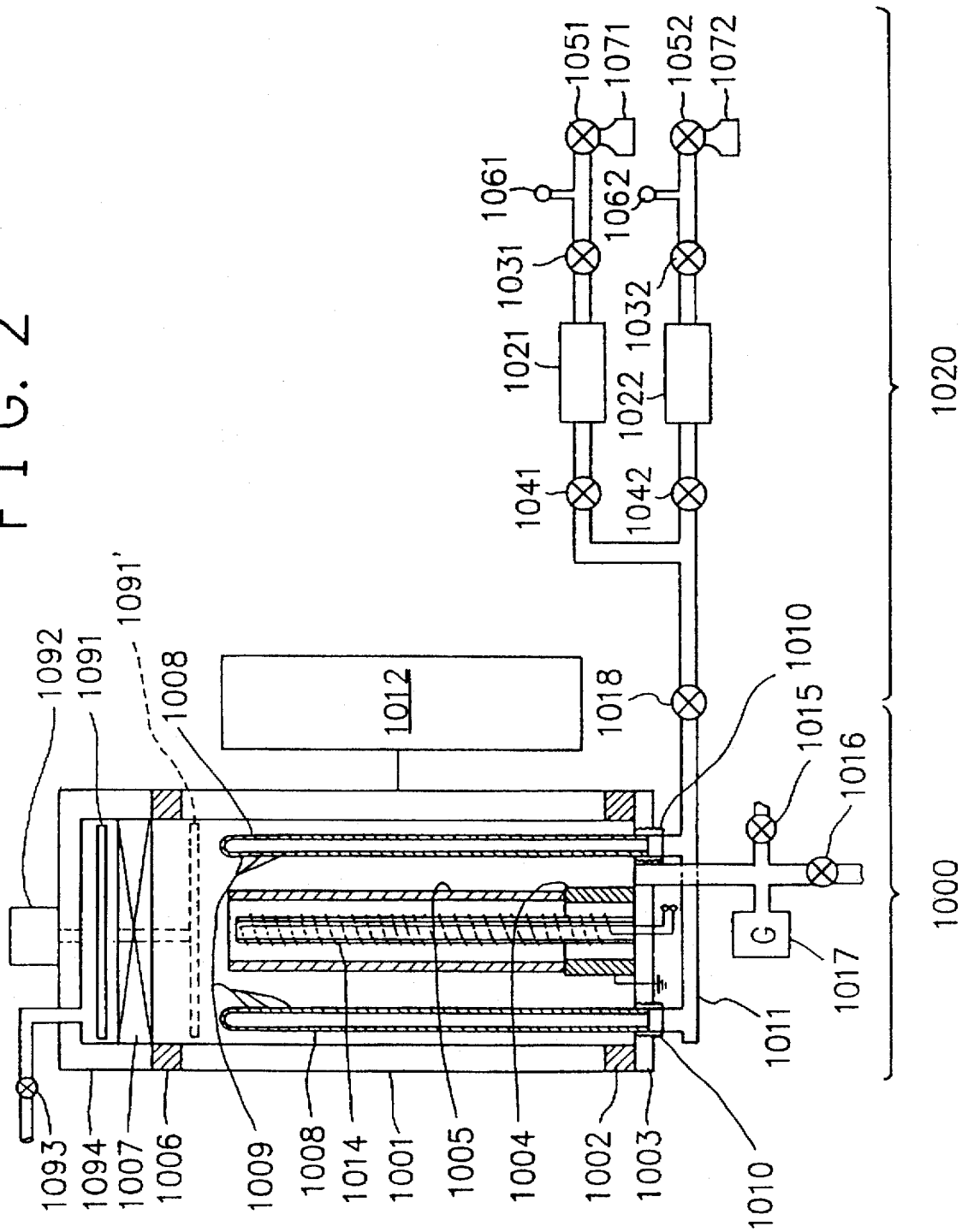
FIGS. 2 and 6 are schematic diagrams respectively illustrating the constitution of a fabrication apparatus by the RF glow discharge decomposition process which is suitable for the formation of a light receiving layer of an electrophotographic light receiving member according to the present invention.
Figure 3:
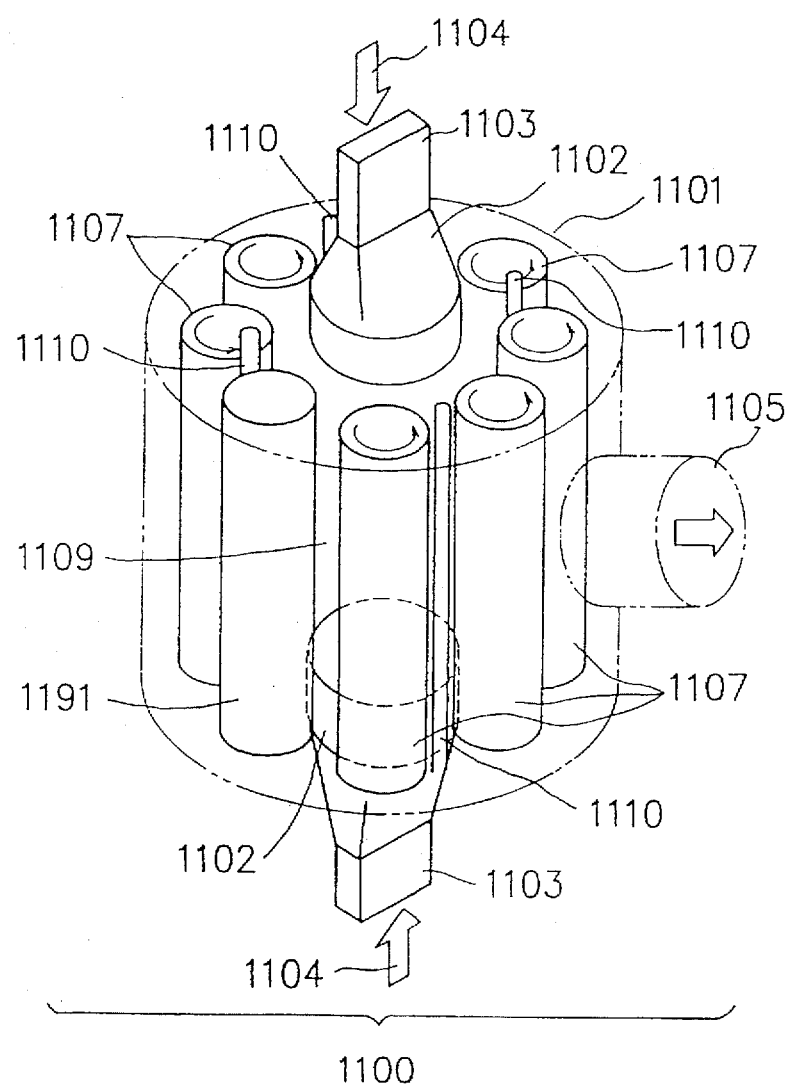
FIGS. 3 and 7 are schematic diagrams respectively illustrating the constitution of a fabrication apparatus by the microwave glow discharge decomposition process which is suitable for the formation of a light receiving layer of an electrophotographic light receiving member according to the present invention.
Figure 4:
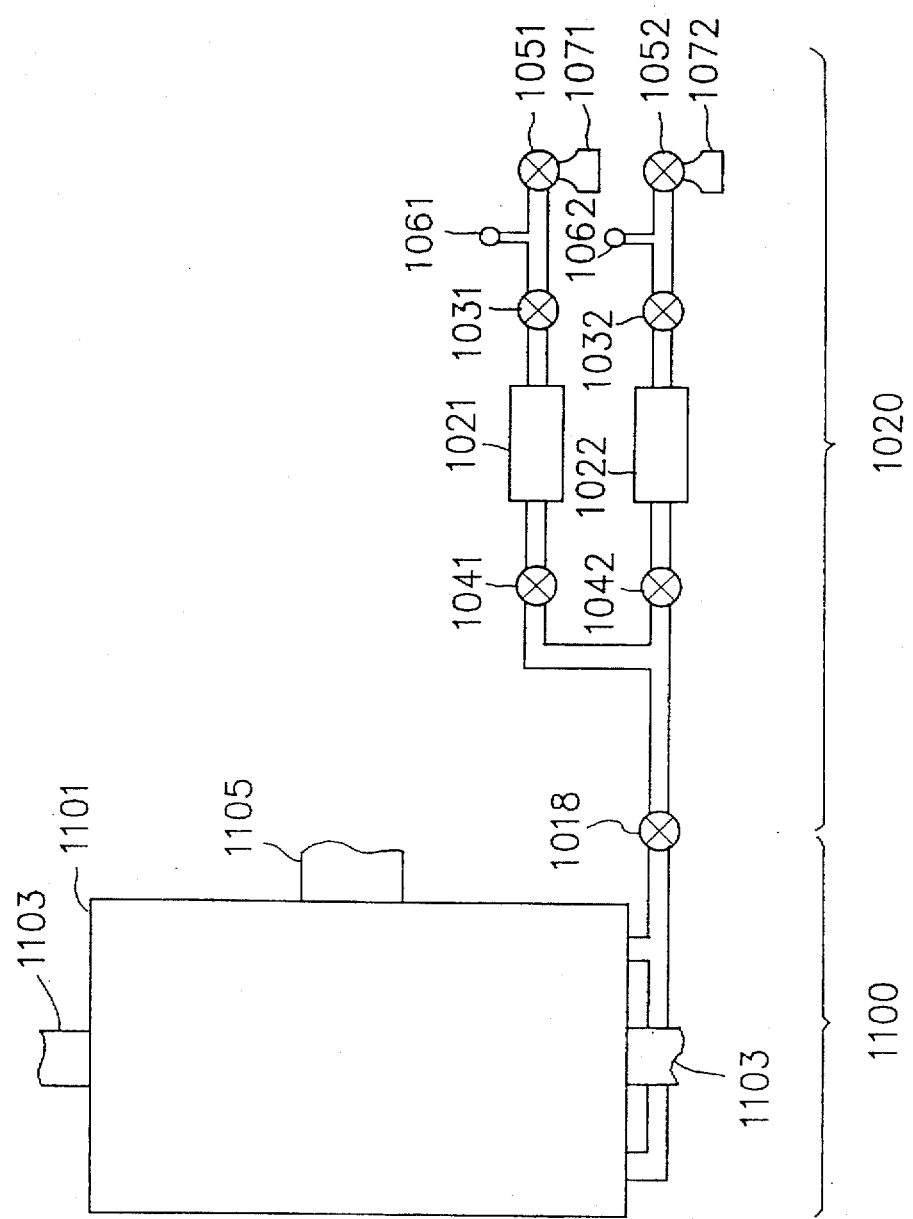
FIGS. 4 and 8 are schematic diagrams respectively illustrating the constitution of a fabrication apparatus by the microwave glow discharge decomposition process which is suitable for the formation of a light receiving layer of an electrophotographic light receiving member according to the present invention.
Figure 5:
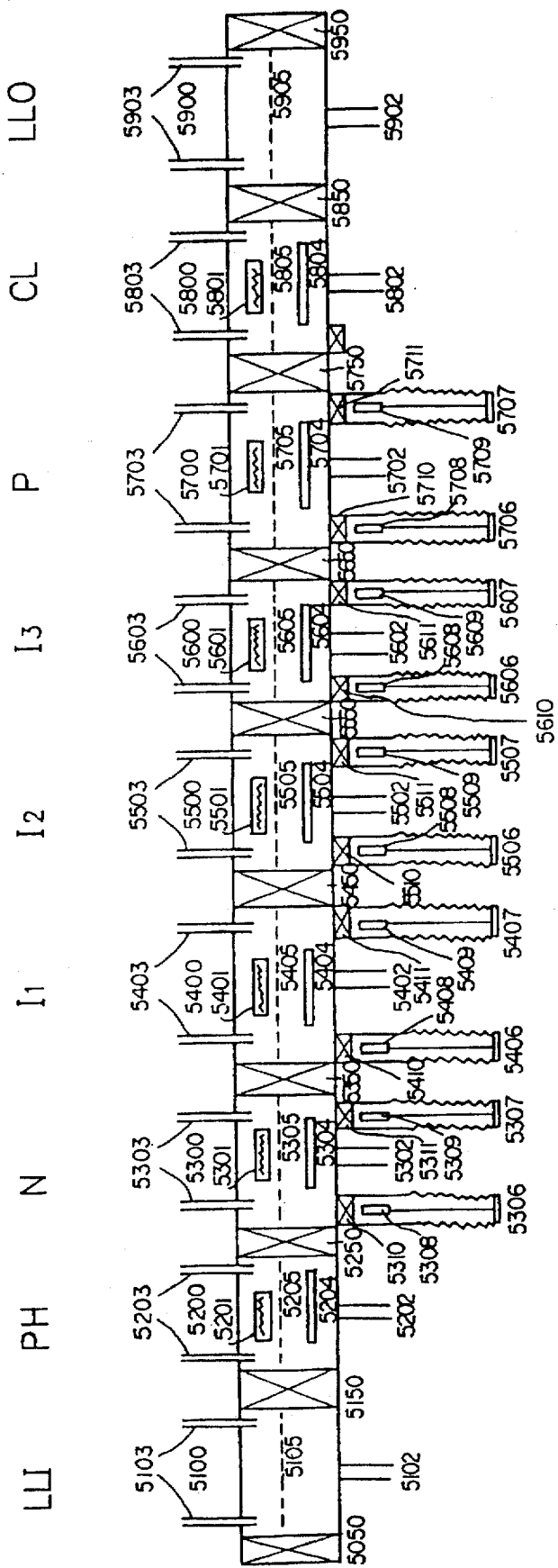
FIG. 5 is a schematic diagram illustrating the constitution of a fabrication apparatus which is suitable for the production of a light receiving member usable as a solar cell according to the present invention.
Figure 6:
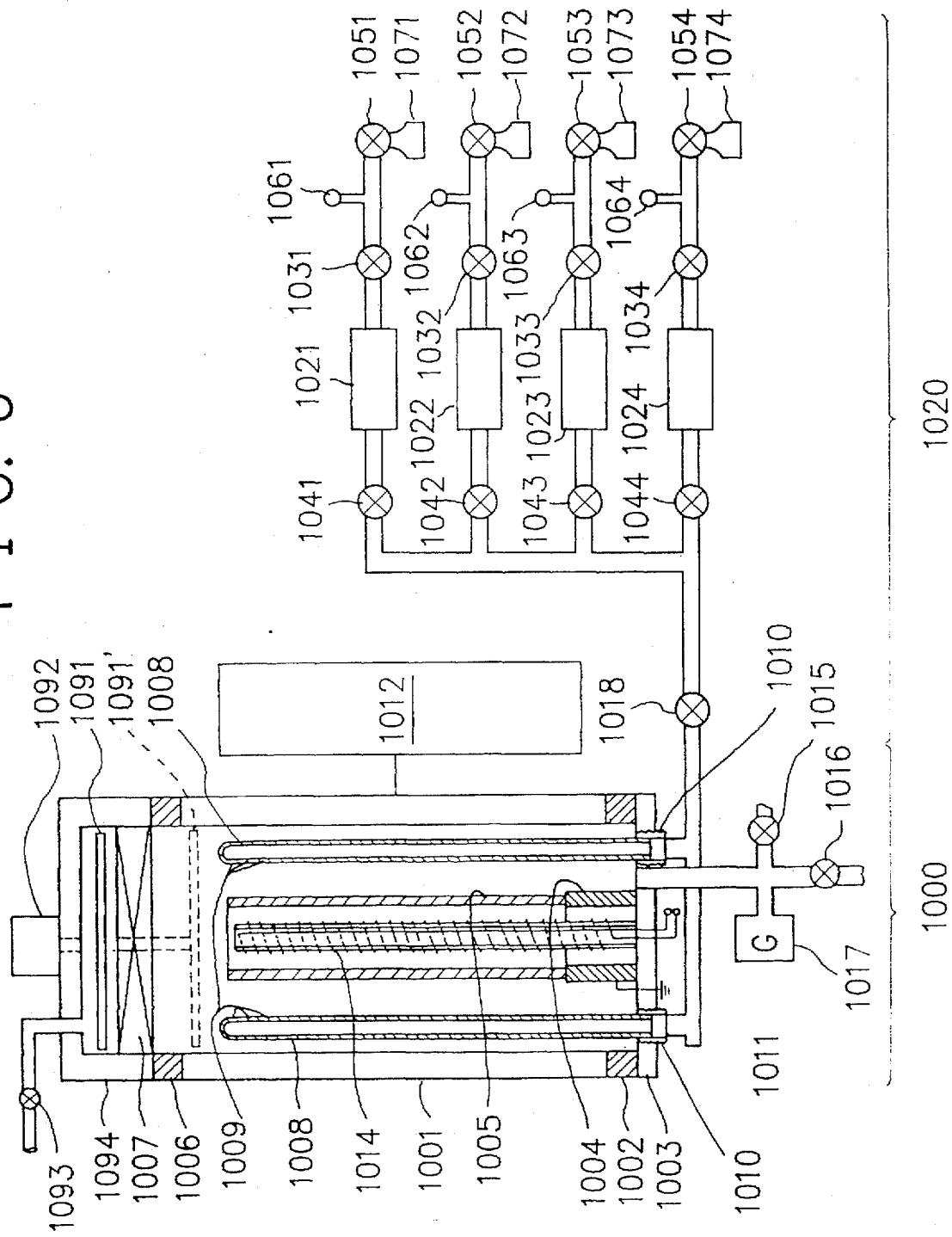
Figure 7:
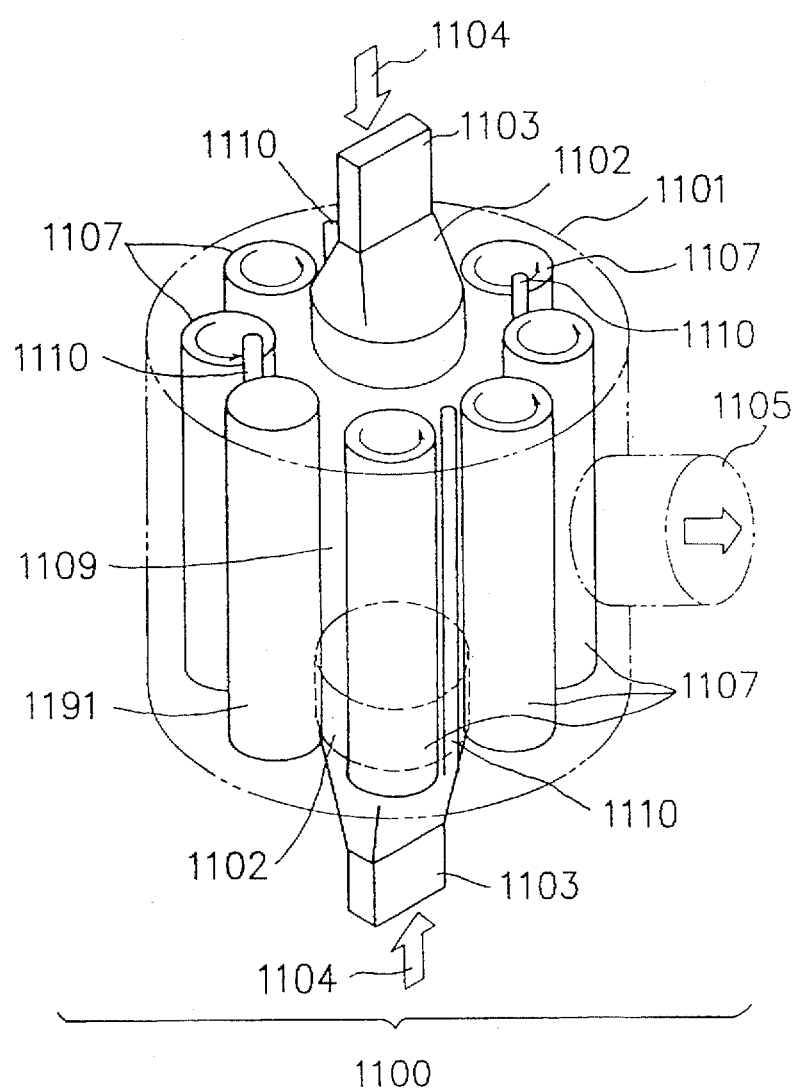
Figure 8:
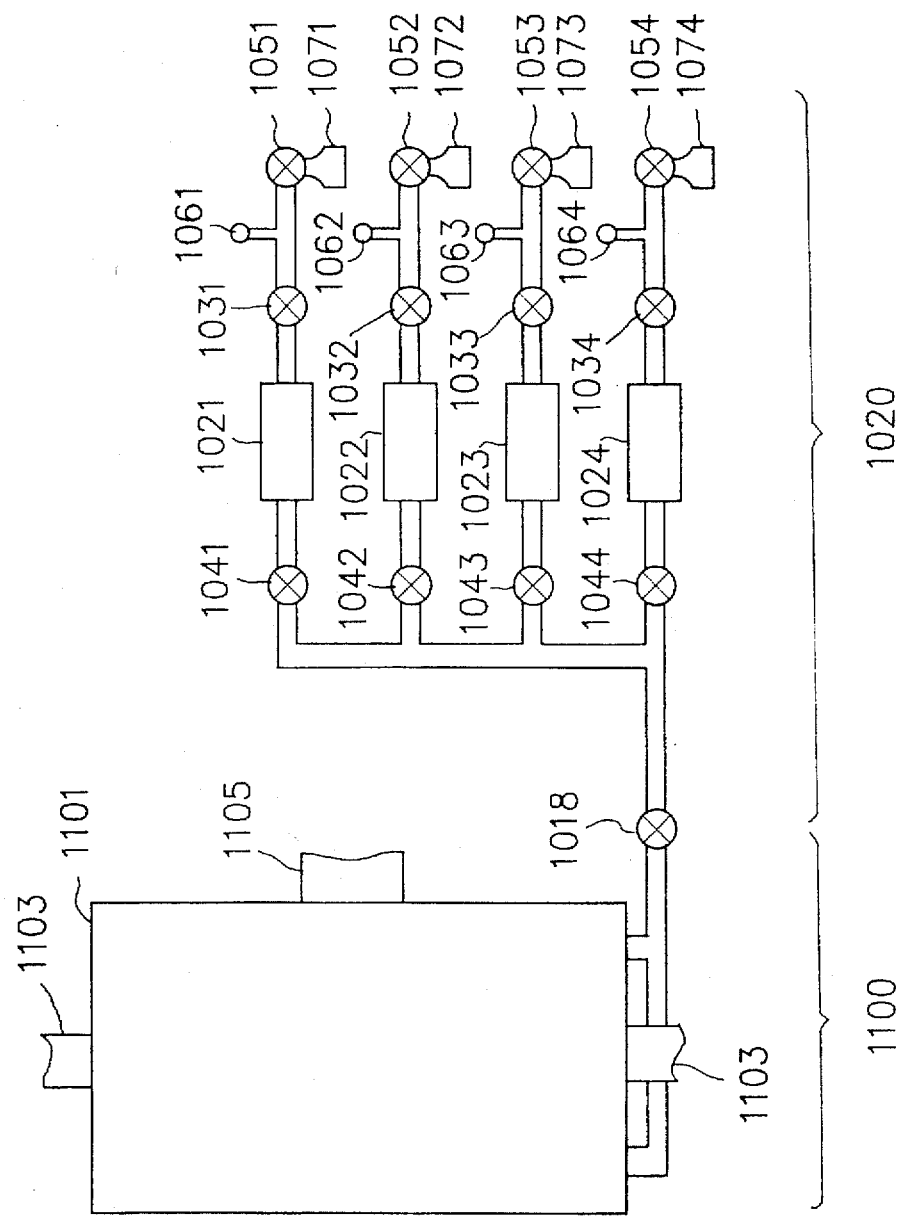
Figure 9:
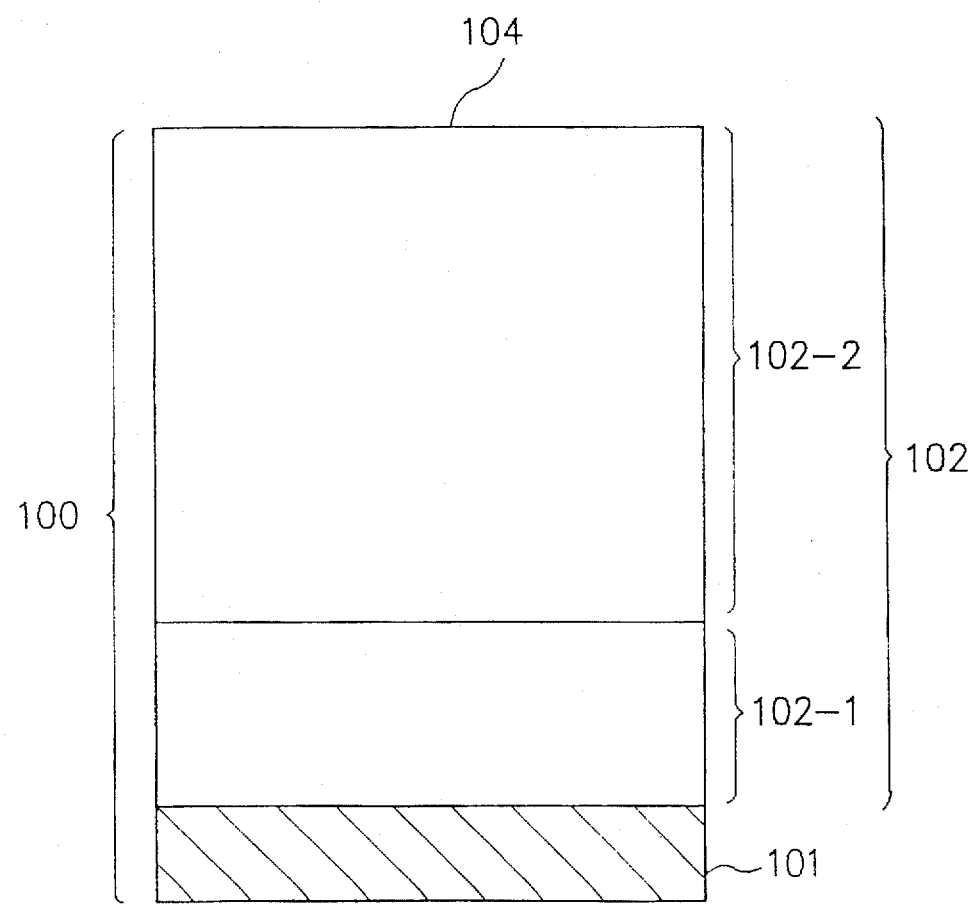

We claim:

1. A light receiving member comprising a substrate and a light receiving layer disposed on said substrate, said light receiving layer being composed of (A) a non-single crystal material containing silicon atoms as a matrix (B), at least one kind of atoms selected from the group consisting of hydrogen atoms and halogen atoms, and (C) chromium atoms, iron atoms, nickel atoms, sodium atoms and magnesium atoms, wherein said light receiving layer contains each of said chromium atoms, iron atoms, nickel atoms, sodium atoms and magnesium atoms in an amount of 0.9 atomic ppm or less.

2. A light receiving member according to claim 1, wherein the light receiving layer further contains a conductivity controlling material.

3. A light receiving member according to claim 2, wherein the conductivity controlling material is contained in the light receiving layer at an uneven concentration distribution.

4. A light receiving member according to claim 2, wherein the conductivity controlling material is contained in the light receiving layer at a uniform concentration distribution.

5. A light receiving member according to claim 2, wherein the conductivity controlling material is an element selected from the group consisting of B, Al, Ga, In, Tl, P, As, Sb and Bi.

6. A light receiving member according to claim 1, wherein the light receiving layer has a multi-layered structure.

7. A light receiving member according to claim 6, wherein at least one constituent layer of the multi-layered structure further contains a conductivity controlling material.

8. A light receiving member according to claim 7, wherein the conductivity controlling material is an element selected from the group consisting of B, Al, Ga, In, Tl, P, As, Sb and Bi.

9. A light receiving member according to claim 6, wherein all the constituent layers of the multi-layered structure are composed of amorphous materials.

10. A light receiving member according to claim 1 which further comprises a light receiving layer (a) composed of a non-single crystal material containing silicon atoms as a matrix, at least one kind of atoms selected from the group consisting of hydrogen atoms and halogen atoms, and a conductivity controlling material, wherein said light receiving layer (a) is interposed between the substrate and the light receiving layer.

11. A light receiving member according to claim 10, wherein the conductivity controlling material in said light receiving layer (a) is an element selected from the group consisting of B, Al, Ga, In, Tl, P, As, Sb and Bi.

12. A light receiving member according to claim 10, wherein the non-single crystal material by which the light receiving layer (a) is constituted is an amorphous material.

13. A light receiving member according to claim 1 which further comprises a light receiving layer (b) composed of a non-single crystal material containing silicon atoms as a matrix, at least one kind of atoms selected from the group consisting of hydrogen atoms and halogen atoms, and at least one kind of atoms selected from the group consisting of tin atoms and germanium atoms, wherein said light receiving layer (b) is interposed between the substrate and the light receiving layer.

14. A light receiving member according to claim 13, wherein the non-single crystal material by which the light receiving layer (b) is constituted is an amorphous material.

15. A light receiving member according to claim 13, wherein the non-single crystal material by which the light receiving layer (b) is constituted further contains a conductivity controlling material.

16. A light receiving member according to claim 15, wherein the conductivity controlling material in said light receiving layer (b) is an element selected from the group consisting of B, Al, Ga, In, Tl, P, As, Sb and Bi.

17. A light receiving member according to claim 1 which further comprises a light receiving layer (c) composed of a non-single crystal material containing silicon atoms as a matrix and at least one kind of atoms selected from the group consisting of oxygen atoms, nitrogen atoms and carbon atoms, wherein said light receiving layer (c) is disposed on the light receiving layer.

18. A light receiving member according to claim 17, wherein the non-single crystal material by which the light receiving layer (c) is constituted further contains at least one kind of atoms selected from the group consisting of hydrogen atoms and halogen atoms.

19. A light receiving member according to claim 17, wherein the light receiving layer (c) is a surface layer.

20. A light receiving member according to claim 17, wherein the non-single crystal material by which the light receiving layer (c) is constituted is an amorphous material.

21. A light receiving member according to claim 1, wherein the non-single crystal material by which the light receiving layer is constituted is an amorphous material.

22. An electrophotographic device comprising an electroconductive substance and a light receiving member according to claim 1.

* * * * *

UNITED STATES PATENT AND TRADEMARK OFFICE
CERTIFICATE OF CORRECTION

PATENT NO. : 5,741,615

DATED : April 21, 1998

INVENTOR(S) : KEISHI SAITOH, ET AL.      Page 1 of 9

It is certified that error appears in the above-identified patent and that said Letters Patent is hereby corrected as shown below:

AT [57] ABSTRACT

Line 8, "(Fe)f" should read --(Fe),--.

COLUMN 1

Line 49, "make" should read --cause--; and
   Line 62, "members" should read --member's--.

COLUMN 4

Line 6, "group" should read --group,--;
   Line 16, "prostulated" should read --postulated--; and
   Line 46, "states and," should read --states, and--.

COLUMN 5

Line 36, "kinds metal atoms of" should read
           --kinds of metal atoms--.

COLUMN 7

Line 10, "interh-" should read --inter- --;
   Line 11, "alogen" should read --halogen--; and
   Line 22, "derivative" should read --derivatives--.

COLUMN 8

Line 9, "%." should read --%,--; and
   Line 10, "% and," should read --%, and--.

UNITED STATES PATENT AND TRADEMARK OFFICE
CERTIFICATE OF CORRECTION

PATENT NO. : 5,741,615

DATED : April 21, 1998

INVENTOR(S) : KEISHI SAITOH, ET AL.

It is certified that error appears in the above-identified patent and that said Letters Patent is hereby corrected as shown below:

COLUMN 10

Line 1, "B$_6$H10," should read --B$_6$H$_{10}$,--;
Line 3, "INCl$_3$," should read --InCl$_3$,--;
Line 8, "SbCl$_3$," (second occurrence) should be deleted; and
Line 21, "may of" should read --may be of--.

COLUMN 11

Line 35, "determine kind of a" should read
 --determined depending--; and
Line 66, "W/cm$^2$," should read --W/cm$^2$, and--.

COLUMN 12

Line 66, "gage" should read --gauge-- and
 "Tort," should read --Torr,--.

COLUMN 13

Line 23, "gage" should read --gauge-- and
 "a RF" should read --an RF--;
Line 26, "whereby" should read --thereby--; and
Line 58, "9as" should read --gas--.

COLUMN 14

Line 12, "minium" should read --minum--; and
Line 47, "whereby" should read --thereby--.

UNITED STATES PATENT AND TRADEMARK OFFICE
CERTIFICATE OF CORRECTION

PATENT NO. : 5,741,615

DATED : April 21, 1998

INVENTOR(S) : KEISHI SAITOH, ET AL.

It is certified that error appears in the above-identified patent and that said Letters Patent is hereby corrected as shown below:

COLUMN 15

Line 57, "a RF" should read --an RF--;
    Line 58, "a RF" should read --an RF--;
    Line 59, "Each the" should read --Each of the--; and
    Line 66, "sychronism" should read --synchronism--.

COLUMN 16

Line 27, "prevent" should read --preventing--;
    Line 33, "oil back" should read --oil backup--;
    Line 36, "An" should read --A--;
    Line 43, "show)." should read --shown).--;
    Line 56, "having" should read --has--; and
    Line 65, "a RF" should read --an RF--.

COLUMN 17

Line 19, "pie" should read --pipe--;
    Line 24, "a RF" should read --an RF--;
    Line 26, "whereby" should read --thereby--; and
    Line 54, "having" should read --has--.

COLUMN 18

Line 67, "gage" should read --gauge--.

COLUMN 19

Line 26, "gage" should read --gauge-- and
        "a RF" should read --an RF--; and
    Line 29, "whereby" should read --thereby--.

UNITED STATES PATENT AND TRADEMARK OFFICE
CERTIFICATE OF CORRECTION

PATENT NO. : 5,741,615

DATED : April 21, 1998

INVENTOR(S) : KEISHI SAITOH, ET AL.

It is certified that error appears in the above-identified patent and that said Letters Patent is hereby corrected as shown below:

COLUMN 20

Line 4, "whereby" should read --thereby--;
    Line 37, "whereby" should read --thereby--;
    Line 48, "for" should be deleted; and
    Line 57, "trough" should read --through--.

COLUMN 21

Line 30, "ally" should read --alloy--;
    Line 34, "to a ¼" should read --to ¼--;
    Line 43, "minium" should read --minum--; and
    Line 59, "purity:" should read --(purity:--.

COLUMN 22

Line 9, "gage" should read --gauge--;
    Line 13, "whereby" should read --thereby--;
    Line 20, "sub-valve" should read --sub-valve 1018--;
    Line 45, "gage" should read --gauge--;
    Line 49, "whereby" should read --thereby--; and
    Line 51, "formed each" should read --formed on each--.

COLUMN 23

Line 16, "whereby" should read --thereby--;
    Line 28, "for" should be deleted;
    Line 36, "trough" should read --through--;
    Line 50, "means the" should read --means of the--;
    Line 58, "cell" should read --cells--; and
    Line 60, "has described" should read --has been described--.

UNITED STATES PATENT AND TRADEMARK OFFICE
CERTIFICATE OF CORRECTION

PATENT NO. : 5,741,615

DATED : April 21, 1998

INVENTOR(S) : KEISHI SAITOH, ET AL.

It is certified that error appears in the above-identified patent and that said Letters Patent is hereby corrected as shown below:

COLUMN 24

Line 13, "A RF" should read --An RF--;
    Line 15, "whereby" should read --thereby--;
    Line 36, "pie" should read --pipe--;
    Line 41, "a RF" should read --an RF--; and
    Line 43, "whereby" should read --thereby--.

COLUMN 25

Line 3, "A RF" should read --An RF--;
    Line 5, "whereby" should read --thereby--;
    Line 47, "interh-" should read --inter- --;
    Line 48, "alogen" should read --halogen--; and
    Line 61, "compound" should read --compounds--.

COLUMN 27

Line 1, "may diluted" should read --may be diluted--;
    Line 32, "there by" should read --thereby--;
    Line 39, "there by" should read --thereby--;
    Line 46, "there by" should read --thereby--;
    Line 53, "there by" should read --thereby--;
    Line 59, "(Ni" should read --(Ni)--; and
    Line 60, "there by" should read --thereby--.

COLUMN 28

Line 27, "on a" should read --on an--.

COLUMN 29

Line 16, "Further more," should read --Furthermore,--.

UNITED STATES PATENT AND TRADEMARK OFFICE
CERTIFICATE OF CORRECTION

PATENT NO. : 5,741,615

DATED : April 21, 1998

INVENTOR(S) : KEISHI SAITOH, ET AL.

It is certified that error appears in the above-identified patent and that said Letters Patent is hereby corrected as shown below:

COLUMN 31

Line 16, "which" should read --each--.

COLUMN 32

Line 18, "(Na" should read --(Na)--.

COLUMN 33

Line 24, "Further more," should read --Furthermore,--.

COLUMN 35

Line 22, "which" should read --each--;
    Line 43, "having subjected" should read
        --having been subjected--; and
    Line 46, "above it" should read --above, it--.

COLUMN 36

Line 14, "(Si" should read --(Si)--;
    Line 25, "(Si" should read --(Si)--; and
    Line 59, "having subjected" should read
        --having been subjected--.

COLUMN 37

Line 20, "there by" should read --thereby--;
    Line 27, "there by" should read --thereby--;
    Line 34, "there by" should read --thereby--;
    Line 41, "there by" should read --thereby--; and
    Line 48, "there by" should read --thereby--.

UNITED STATES PATENT AND TRADEMARK OFFICE
CERTIFICATE OF CORRECTION

PATENT NO. : 5,741,615
DATED : April 21, 1998
INVENTOR(S) : KEISHI SAITOH, ET AL.

It is certified that error appears in the above-identified patent and that said Letters Patent is hereby corrected as shown below:

COLUMN 38

Line 4, "using a" should read --using an--; and
    Line 12, "on a" should read --on an--.

COLUMN 39

Line 1, "Further more," should read --Furthermore,--.

COLUMN 40

Line 33, "like" (second occurrence) should be deleted.

COLUMN 41

Line 2, "which" should read --each--; and
    Line 23, "having subjected" should read
        --having been subjected--.

COLUMN 42

Line 67, "member" should read --member,--.

COLUMN 43

Line 11, "Further more," should read --Furthermore,--.

COLUMN 44

Line 58, "which" should read --each--.

UNITED STATES PATENT AND TRADEMARK OFFICE
CERTIFICATE OF CORRECTION

PATENT NO. : 5,741,615
DATED : April 21, 1998
INVENTOR(S) : KEISHI SAITOH, ET AL.

It is certified that error appears in the above-identified patent and that said Letters Patent is hereby corrected as shown below:

COLUMN 45

Line 11, "having subjected" should read --having been subjected--.

COLUMN 48

Table 1, "98.70" should be deleted and "Si" should read --Si 98.70--.

COLUMN 69

Table 37, should be amended to read as follows:

| name of layer | gas used and its flow rate (sccm) | raw material alloy used and its composition (atomic %) | substrate temperature (°C.) | RF power (mW/cm³) | inner pressure (Torr) | layer thickness (μm) |
|---|---|---|---|---|---|---|
| third layer | SiH$_4$ 100<br>H$_2$ 500<br>PH$_3$/H$_2$ 3<br>(2000 ppm diluted) | — | 250 | 10 | 0.4 | 0.2 |

UNITED STATES PATENT AND TRADEMARK OFFICE
CERTIFICATE OF CORRECTION

PATENT NO. : 5,741,615

DATED : April 21, 1998

INVENTOR(S) : KEISHI SAITOH, ET AL.

It is certified that error appears in the above-identified patent and that said Letters Patent is hereby corrected as shown below:

COLUMN 72

Line 60, "matrix (B)," should read --matrix, (B)--.

Signed and Sealed this

Second Day of March, 1999

Attest:

Q. TODD DICKINSON

*Attesting Officer*   *Acting Commissioner of Patents and Trademarks*